US011150283B2

(12) United States Patent
Ulrich

(10) Patent No.: US 11,150,283 B2
(45) Date of Patent: Oct. 19, 2021

(54) AMPLITUDE AND PHASE DETECTION CIRCUIT

(71) Applicant: Reno Technologies, Inc., Wilmington, DE (US)

(72) Inventor: Michael Gilliam Ulrich, Delran, NJ (US)

(73) Assignee: Reno Technologies, Inc.

( * ) Notice: Subject to any disclaimer, the term of this patent is extended or adjusted under 35 U.S.C. 154(b) by 121 days.

(21) Appl. No.: 16/743,492

(22) Filed: Jan. 15, 2020

(65) Prior Publication Data

US 2020/0150164 A1 May 14, 2020

Related U.S. Application Data

(63) Continuation-in-part of application No. 16/735,088, filed on Jan. 6, 2020, which is a continuation-in-part of application No. 16/722,219, filed on Dec. 20, 2019, which is a continuation-in-part of application No. 16/673,220, filed on Nov. 4, 2019, which is a continuation-in-part of application No. 16/667,293, filed on Oct. 29, 2019, which is a continuation-in-part of application No. 16/654,788, filed on Oct. 16, 2019, (Continued)

(51) Int. Cl.
| | |
|---|---|
| *G01R 25/04* | (2006.01) |
| *H01L 21/67* | (2006.01) |
| *H01L 21/3065* | (2006.01) |
| *H01J 37/32* | (2006.01) |
| *H03J 7/02* | (2006.01) |

(52) U.S. Cl.
CPC ........ *G01R 25/04* (2013.01); *H01J 37/32183* (2013.01); *H01L 21/3065* (2013.01); *H01L 21/67069* (2013.01); *H03J 7/02* (2013.01)

(58) Field of Classification Search
CPC .............. G01R 25/04; H01J 37/32183; H01L 21/3065; H01L 21/67069; H03J 7/02
See application file for complete search history.

(56) References Cited

U.S. PATENT DOCUMENTS

| | | |
|---|---|---|
| 3,828,281 A | 8/1974 | Chambers |
| 4,110,700 A | 8/1978 | Rosen et al. |

(Continued)

FOREIGN PATENT DOCUMENTS

| | | |
|---|---|---|
| EP | 0840349 | 5/1998 |
| EP | 8840350 | 5/1998 |
| WO | 2006096589 | 9/2006 |

*Primary Examiner* — Samuel S Outten
(74) *Attorney, Agent, or Firm* — The Belles Group, P.C

(57) ABSTRACT

In one embodiment, a phase detection circuit includes a current signal input to receive a current signal indicative of a current amplitude of an RF signal and a voltage signal input to receive a voltage signal indicative of a voltage amplitude of the RF signal. A high-pass filter and a low-pass filter are each configured to filter one of (i) the current signal from the current signal input or (ii) the voltage signal from the voltage signal input, wherein the high-pass filter and the low-pass filter collectively cause a substantially 90 degree offset between a phase angle of the current signal and a phase angle of the voltage signal. A phase difference circuit receives the filtered current signal and the filtered voltage signal to determine a phase angle difference between the current signal and the voltage signal.

18 Claims, 50 Drawing Sheets

Related U.S. Application Data now Pat. No. 10,984,986, which is a continuation-in-part of application No. 16/415,764, filed on May 17, 2019, now Pat. No. 10,692,699, which is a continuation-in-part of application No. 15/816,351, filed on Nov. 17, 2017, now abandoned, which is a continuation-in-part of application No. 15/450,495, filed on Mar. 6, 2017, now Pat. No. 10,679,824, which is a continuation-in-part of application No. 15/196,821, filed on Jun. 29, 2016, now Pat. No. 10,699,880.

(60) Provisional application No. 62/796,146, filed on Jan. 24, 2019, provisional application No. 62/788,269, filed on Jan. 4, 2019, provisional application No. 62/784,590, filed on Dec. 24, 2018, provisional application No. 62/754,768, filed on Nov. 2, 2018, provisional application No. 62/767,717, filed on Nov. 15, 2018, provisional application No. 62/753,959, filed on Nov. 1, 2018, provisional application No. 62/751,851, filed on Oct. 29, 2018, provisional application No. 62/424,162, filed on Nov. 18, 2016, provisional application No. 62/303,625, filed on Mar. 4, 2016, provisional application No. 62/185,998, filed on Jun. 29, 2015.

(56) References Cited

U.S. PATENT DOCUMENTS

| | | |
|---|---|---|
| 4,679,007 A | 7/1987 | Reese et al. |
| 4,692,643 A | 9/1987 | Tokunaga et al. |
| 4,751,408 A | 6/1988 | Rambert |
| 4,929,855 A | 5/1990 | Ezzeddine |
| 5,012,123 A | 4/1991 | Ayasli et al. |
| 5,079,507 A | 1/1992 | Ishida et al. |
| 5,654,679 A | 8/1997 | Mavretic et al. |
| 5,815,047 A | 9/1998 | Sorensen et al. |
| 5,849,136 A | 12/1998 | Mintz et al. |
| 5,880,921 A | 3/1999 | Tham et al. |
| 5,889,252 A | 3/1999 | Williams et al. |
| 5,971,591 A | 10/1999 | Vona et al. |
| 6,046,641 A | 4/2000 | Chawla et al. |
| 6,137,367 A | 10/2000 | Ezzedine et al. |
| 6,252,354 B1 | 6/2001 | Collins et al. |
| 6,400,012 B1 | 6/2002 | Miller et al. |
| 6,424,232 B1 | 7/2002 | Mavretic et al. |
| 6,583,572 B2 | 6/2003 | Veltrop et al. |
| 6,621,372 B2 | 9/2003 | Kondo et al. |
| 6,657,395 B2 | 12/2003 | Windhorn |
| 6,677,828 B1 | 1/2004 | Harnett et al. |
| 6,703,080 B2 | 3/2004 | Reyzelman et al. |
| 6,791,274 B1 | 9/2004 | Hauer et al. |
| 6,794,951 B2 | 9/2004 | Finley |
| 6,818,562 B2 | 11/2004 | Todorow et al. |
| 6,888,313 B2 | 5/2005 | Blackburn et al. |
| 6,888,396 B2 | 5/2005 | Hajimiri et al. |
| 6,946,847 B2 | 9/2005 | Nishimori et al. |
| 6,967,547 B2 | 11/2005 | Pellegrini et al. |
| 7,004,107 B1 | 2/2006 | Raoux et al. |
| RE39,051 E | 3/2006 | Harnett |
| 7,071,786 B2 | 7/2006 | Inoue et al. |
| 7,095,178 B2 | 8/2006 | Nakano et al. |
| 7,113,761 B2 | 9/2006 | Bickham et al. |
| 7,122,965 B2 | 10/2006 | Goodman |
| 7,164,236 B2 | 1/2007 | Mitrovic et al. |
| 7,199,678 B2 | 4/2007 | Matsuno |
| 7,251,121 B2 | 7/2007 | Bhutta |
| 7,298,091 B2 | 11/2007 | Pickard et al. |
| 7,298,128 B2 | 11/2007 | Bhutta |
| 7,304,438 B2 | 12/2007 | Kishinevsky |
| 7,332,981 B2 | 2/2008 | Matsuno |
| 7,439,610 B2 | 10/2008 | Weigand |
| 7,480,571 B2 | 1/2009 | Howald et al. |
| 7,495,524 B2 | 2/2009 | Omae et al. |
| 7,498,908 B2 | 3/2009 | Gurov |
| 7,514,935 B2 | 4/2009 | Pankratz |
| 7,518,466 B2 | 4/2009 | Sorensen et al. |
| 7,535,312 B2 | 5/2009 | McKinzie, III |
| 7,602,127 B2 | 10/2009 | Coumou |
| 7,642,879 B2 | 1/2010 | Matsuno |
| 7,666,464 B2 | 2/2010 | Collins et al. |
| 7,714,676 B2 | 5/2010 | McKinzie, III |
| 7,728,602 B2 | 6/2010 | Valcore et al. |
| 7,745,955 B2 | 6/2010 | Kirchmeier et al. |
| 7,755,300 B2 | 7/2010 | Kishinevsky et al. |
| 7,764,140 B2 | 7/2010 | Nagarkatti et al. |
| 7,777,567 B2 | 8/2010 | Polizze |
| 7,852,170 B2 | 12/2010 | McKinzie, III |
| 7,863,996 B2 | 1/2011 | Cotter et al. |
| 7,868,556 B2 | 1/2011 | Xia |
| 7,872,523 B2 | 1/2011 | Sivakumar et al. |
| 7,917,104 B2 | 3/2011 | Manssen et al. |
| 7,969,096 B2 | 6/2011 | Chen |
| 8,008,982 B2 | 8/2011 | McKinzie, III |
| 8,040,068 B2 | 10/2011 | Coumou et al. |
| RE42,917 E | 11/2011 | Hauer et al. |
| 8,089,026 B2 | 1/2012 | Sellers |
| 8,102,954 B2 | 1/2012 | Coumou |
| 8,110,991 B2 | 2/2012 | Coumou |
| 8,203,859 B2 | 6/2012 | Omae et al. |
| 8,217,731 B2 | 7/2012 | McKinzie, III |
| 8,217,732 B2 | 7/2012 | McKinzie, III |
| 8,228,112 B2 | 7/2012 | Reynolds |
| 8,237,501 B2 | 8/2012 | Owen |
| 8,264,154 B2 | 9/2012 | Banner et al. |
| 8,278,909 B2 | 10/2012 | Fletcher |
| 8,289,029 B2 | 10/2012 | Coumou |
| 8,299,867 B2 | 10/2012 | McKinzie, III |
| 8,314,561 B2 | 11/2012 | Fisk et al. |
| 8,330,432 B2 | 12/2012 | Van Zyl et al. |
| 8,334,657 B2 | 12/2012 | Xia |
| 8,334,700 B2 | 12/2012 | Coumou et al. |
| 8,335,479 B2 | 12/2012 | Koya et al. |
| 8,344,559 B2 | 1/2013 | Van Zyl et al. |
| 8,344,801 B2 | 1/2013 | Owen et al. |
| 8,368,308 B2 | 2/2013 | Banna et al. |
| 8,368,469 B2 | 2/2013 | Mohammadi et al. |
| 8,395,322 B2 | 3/2013 | Coumou |
| 8,416,008 B2 | 4/2013 | Van Zyl et al. |
| 8,436,643 B2 | 5/2013 | Mason |
| 8,461,842 B2 | 6/2013 | Thuringer et al. |
| 8,466,736 B1 | 6/2013 | Reynolds |
| 8,487,706 B2 | 7/2013 | Li et al. |
| 8,502,689 B2 | 8/2013 | Chen et al. |
| 8,513,889 B2 | 8/2013 | Zhang et al. |
| 8,520,413 B2 | 8/2013 | Tran et al. |
| 8,536,636 B2 | 9/2013 | Englekirk |
| 8,552,665 B2 | 10/2013 | Larson et al. |
| 8,558,633 B2 | 10/2013 | McKinzie, III |
| 8,559,907 B2 | 10/2013 | Burgener et al. |
| 8,564,381 B2 | 10/2013 | McKinzie |
| 8,569,842 B2 | 10/2013 | Weis et al. |
| 8,576,010 B2 | 11/2013 | Yanduru |
| 8,576,013 B2 | 11/2013 | Coumou |
| 8,587,321 B2 | 11/2013 | Chen et al. |
| 8,620,236 B2 | 12/2013 | Manssen et al. |
| 8,624,501 B2 | 1/2014 | Nagarkatti et al. |
| 8,633,782 B2 | 1/2014 | Nagarkatti et al. |
| 8,638,159 B2 | 1/2014 | Ranta et al. |
| 8,649,754 B2 | 2/2014 | Burgener et al. |
| 8,659,335 B2 | 2/2014 | Nagarkatti et al. |
| 8,674,606 B2 | 3/2014 | Carter et al. |
| 8,680,928 B2 | 3/2014 | Jeon et al. |
| 8,686,796 B2 | 4/2014 | Presti |
| 8,710,926 B2 | 4/2014 | Nagarkatti et al. |
| 8,716,984 B2 | 5/2014 | Mueller et al. |
| 8,723,423 B2 | 5/2014 | Hoffman et al. |
| 8,742,669 B2 | 6/2014 | Carter et al. |
| 8,773,019 B2 | 7/2014 | Coumou et al. |
| 8,779,859 B2 | 7/2014 | Su et al. |
| 8,781,415 B1 | 7/2014 | Coumou et al. |
| 8,815,329 B2 | 8/2014 | Ilic et al. |
| 8,847,561 B2 | 9/2014 | Karlieek et al. |

(56) References Cited

U.S. PATENT DOCUMENTS

| | | |
|---|---|---|
| 8,884,180 B2 | 11/2014 | Ilic et al. |
| 8,884,525 B2 | 11/2014 | Hoffman et al. |
| 8,890,537 B2 | 11/2014 | Valcore, Jr. et al. |
| 8,912,835 B2 | 12/2014 | Nagarkatti et al. |
| 8,928,329 B2 | 1/2015 | Downing et al. |
| 9,083,343 B1 | 7/2015 | Li et al. |
| 9,190,993 B1 | 11/2015 | Li |
| 9,306,533 B1 | 4/2016 | Anton |
| 10,269,540 B1 | 4/2019 | Carter et al. |
| 2002/0060914 A1 | 5/2002 | Porter et al. |
| 2003/0007372 A1 | 1/2003 | Porter et al. |
| 2003/0046013 A1 | 3/2003 | Gerrish |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0012548 A1* | 1/2008 | Gerhardt ............ G01R 19/0061 324/76.11 |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2009/0207537 A1 | 8/2009 | Coumou |
| 2010/0001796 A1 | 1/2010 | Sivakumar et al. |
| 2010/0073104 A1 | 3/2010 | Cotter et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2011/0241781 A1 | 10/2011 | Owen et al. |
| 2011/0247696 A1 | 10/2011 | Zolock et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |
| 2015/0115289 A1 | 4/2015 | Fursin et al. |
| 2017/0278677 A1* | 9/2017 | Nagami ............ H01J 37/32165 |

\* cited by examiner

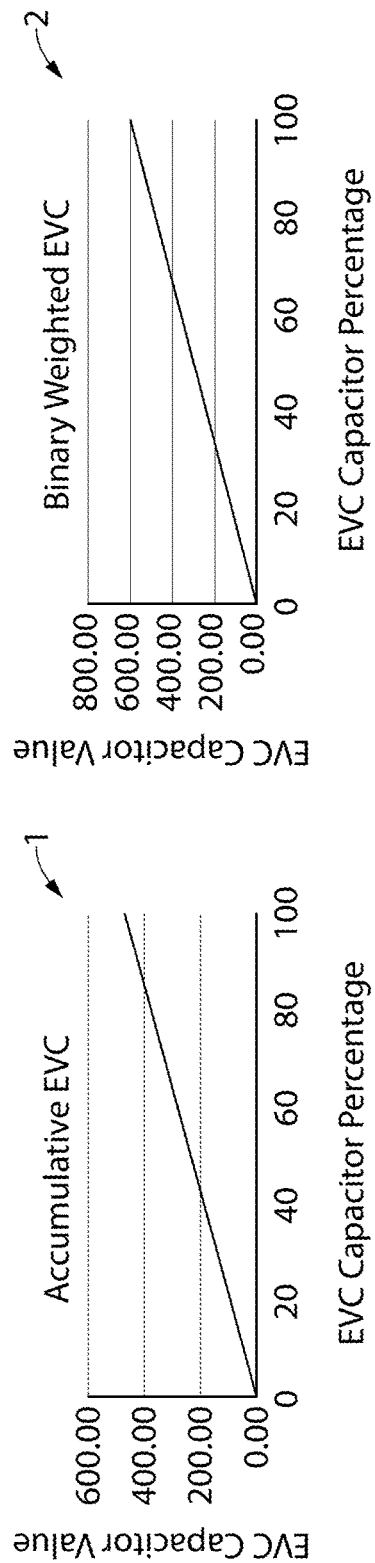
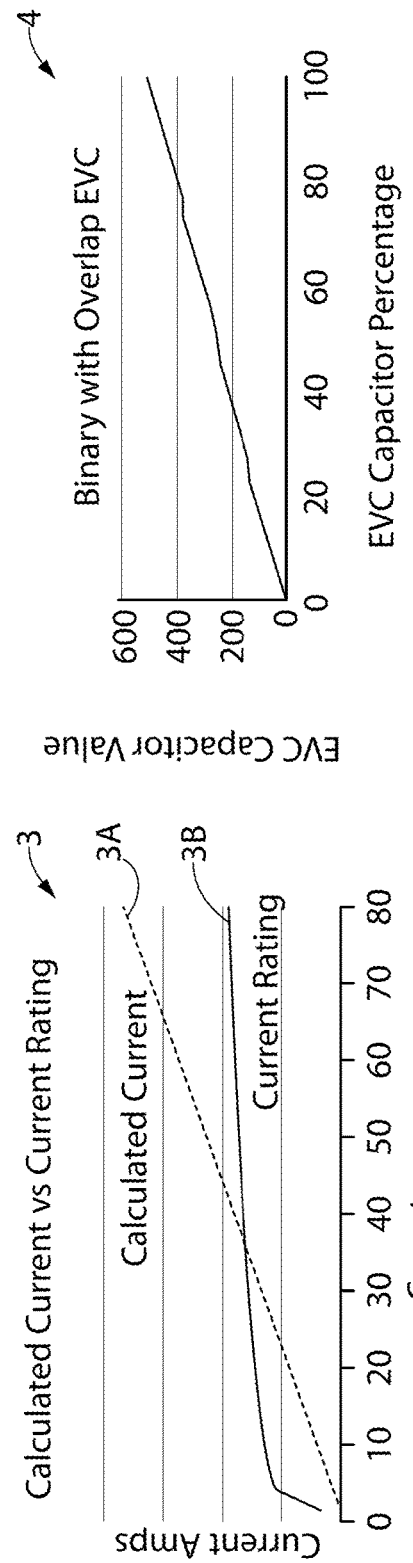
FIG. 12
FIG. 13
FIG. 14
FIG. 15

41-C

42-C

AMPLITUDE AND PHASE DETECTION CIRCUIT

CROSS REFERENCE TO RELATED APPLICATIONS

The present application is a continuation in part of U.S. patent application Ser. No. 16/735,088, filed Jan. 6, 2020, which is a continuation in part of U.S. patent application Ser. No. 16/722,219, filed Dec. 20, 2019, which is a continuation in part of U.S. patent application Ser. No. 16/673,220, filed Nov. 4, 2019, which is a continuation in part of U.S. patent application Ser. No. 16/667,293, filed Oct. 29, 2019, which is a continuation in part of U.S. patent application Ser. No. 16/654,788, filed Oct. 16, 2019, which is a continuation in part of U.S. patent application Ser. No. 16/415,764, filed May 17, 2019, which is a continuation in part of U.S. patent application Ser. No. 15/816,351, filed Nov. 17, 2017, which is a continuation in part of U.S. patent application Ser. No. 15/450,495, filed Mar. 6, 2017, which is a continuation in part of U.S. patent application Ser. No. 15/196,821, filed Jun. 29, 2016, which claims the benefit of U.S. Provisional Patent Application No. 62/185,998 filed on Jun. 29, 2015. U.S. patent application Ser. No. 15/450,495 further claims the benefit of U.S. Provisional Patent Application No. 62/303,625, filed Mar. 4, 2016. U.S. patent application Ser. No. 15/816,351 further claims the benefit of U.S. Provisional Patent Application No. 62/424,162, filed Nov. 18, 2016. U.S. patent application Ser. No. 16/654,788 further claims the benefit of U.S. Provisional Patent Application No. 62/751,851, filed Oct. 29, 2018. U.S. patent application Ser. No. 16/667,293 further claims the benefit of U.S. Provisional Patent Application No. 62/753,959, filed Nov. 1, 2018, and U.S. Provisional Patent Application No. 62/767,717, filed Nov. 15, 2018. U.S. patent application Ser. No. 16/673,220 further claims the benefit of U.S. Provisional Patent Application No. 62/754,768, filed Nov. 2, 2018. U.S. patent application Ser. No. 16/722,219 further claims the benefit of U.S. Provisional Patent Application No. 62/784,590, filed Dec. 24, 2018. U.S. patent application Ser. No. 16/735,088 further claims the benefit of U.S. Provisional Patent Application No. 62/788,269, filed Jan. 4, 2019. The present application further claims the benefit of U.S. Provisional Patent Application No. 62/796,146, filed Jan. 24, 2019. The disclosures of the aforementioned priority applications are incorporated herein by reference in their entirety.

BACKGROUND

Variable capacitors are used in many applications, such as matching networks and variable filters. They allow for the precise tuning of frequency and/or impedance in applications needing a dynamic system response, such as in plasma processes. The ability to dynamically change impedance and frequency response provides more flexibility for the applications variable capacitors are used in, and can compensate for variations from unit-to-unit. Some examples of variable capacitors are vacuum variable capacitors (VVCs) and electronically variable capacitors (EVCs).

In electronic circuits, matching networks are used to match the source impedance to the load impedance and vice versa. That is, the source, being of some impedance with a resistive part and a reactive part, will be terminated into the complex conjugate impedance, and the load impedance will be driven by the complex conjugate of its impedance. The complex conjugate is used to eliminate the reactive part of the impedance, leaving only the resistive part, and the resistive part is made equal. This is done so that maximum power transfer can be achieved at the load.

In plasma applications, the load impedance can vary depending on several factors, such as time, power level, pressure, gas flow, chemistry of the gasses, and whether the plasma has been struck. Accordingly, the matching network must be able to automatically vary itself to ensure that the maximum power transfer is achieved. This helps with repeatability in both the depositing and etching.

While the performance of matching networks has improved, there is need for faster and more reliable tuning that meets certain system requirements. For example, there is need to quickly and affordably measure voltage amplitude, current amplitude, and their phase difference in order to determine the changing impedance of the system and adjust accordingly.

BRIEF SUMMARY

In one aspect, a phase detection circuit includes a current signal input configured to receive a current signal indicative of a current amplitude of an RF signal; a voltage signal input configured to receive a voltage signal indicative of a voltage amplitude of the RF signal; a high-pass filter and a low-pass filter each configured to filter one of (i) the current signal from the current signal input or (ii) the voltage signal from the voltage signal input, wherein the high-pass filter and the low-pass filter collectively cause a substantially 90 degree offset between a phase angle of the current signal and a phase angle of the voltage signal; and a phase difference circuit configured to receive the filtered current signal and the filtered voltage signal to determine a phase angle difference between the current signal and the voltage signal.

In another aspect, an impedance matching network includes a radio frequency (RF) input configured to operably couple to an RF source and to receive an RF signal from the RF source; an RF output configured to operably couple to a plasma chamber; at least one electronically variable capacitor (EVC); and the phase detection circuit described above.

In another aspect, a method of matching an impedance includes coupling an RF input of a matching network to an RF source to receive an RF signal from the RF source; coupling an RF output of the matching network to a plasma chamber, wherein the matching network comprises at least one variable capacitor or inductor; and the phase detection circuit of any of the preceding claims; determining the phase angle difference using the phase detection circuit; determining a first impedance of the matching network based on the determined phase angle difference; and altering the impedance of the EVC based on the determined first impedance.

In another aspect, a semiconductor processing tool includes a plasma chamber configured to deposit a material onto a substrate or etch a material from the substrate; and an impedance matching network operably coupled to the plasma chamber, the matching network comprising a radio frequency (RF) input configured to operably couple to an RF source and to receive an RF signal from the RF source; an RF output configured to operably couple to a plasma chamber; at least one electronically variable capacitor (EVC); and the phase detection circuit described above.

In another aspect, a method of fabricating a semiconductor includes placing a substrate in a plasma chamber configured to deposit a material layer on the substrate or etch a material layer from the substrate; energizing plasma within the plasma chamber by coupling RF power from an RF source to the plasma chamber to perform the deposition or etching; and while energizing the plasma, carrying out an impedance match by an impedance matching network coupled between the plasma chamber and the RF source, the matching network comprising a radio frequency (RF) input configured to operably couple to the RF source and to receive an RF signal from the RF source; an RF output configured to operably couple to a plasma chamber; at least one electronically variable capacitor (EVC); and the phase detection circuit described above.

BRIEF DESCRIPTION OF THE DRAWINGS

The present disclosure will become more fully understood from the detailed description and the accompanying drawings, wherein:

FIG. 12 is a graph of capacitance for an accumulative EVC according to one embodiment.

FIG. 13 is a graph of a capacitance for a binary weighted EVC according to one embodiment.

FIG. 14 is a graph of current versus current rating according to one embodiment.

FIG. 15 is a graph of a capacitance for a binary with overlap EVC according to one embodiment.

DETAILED DESCRIPTION

Figure 1:
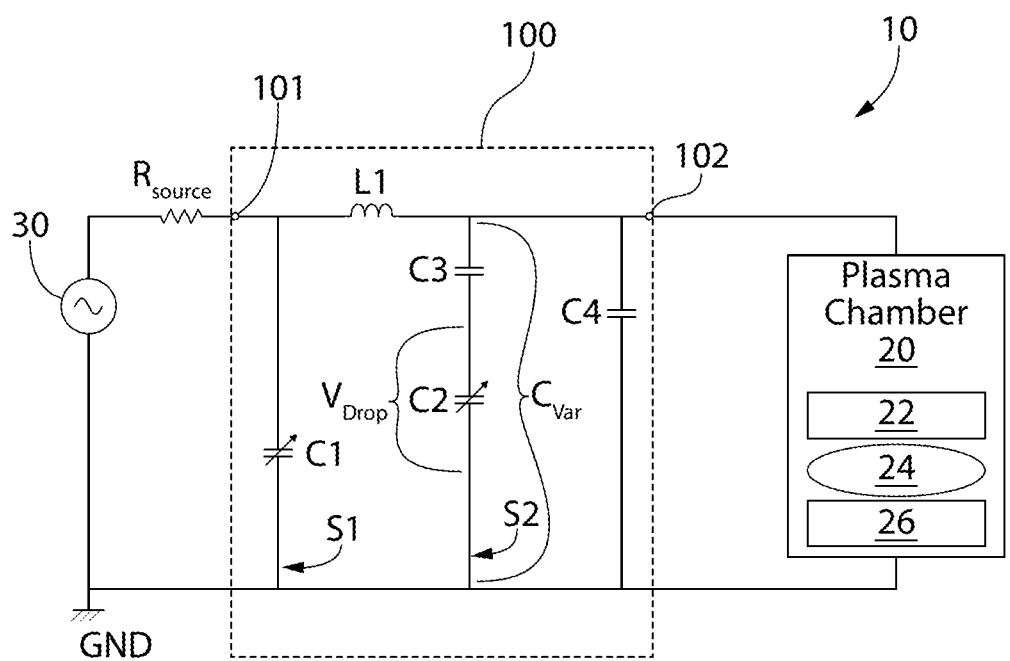
FIG. 1 is a system incorporating a pi matching network according to one embodiment.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

Features of the present invention may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present invention may be embodied in the form of computer-implemented processes and apparatuses such as processor-based data processing and communication systems or computer systems for practicing those processes. The present invention may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

Ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

In the following description, where circuits are shown and described, one of skill in the art will recognize that, for the sake of clarity, not all peripheral circuits or components are shown in the figures or described in the description. Further, the terms "couple" and "operably couple" can refer to a direct or indirect coupling of two components of a circuit.

Voltage Reduction Circuit

Referring now to FIG. 1, a system 10 incorporating a pi matching network 100 according to one embodiment is shown. In this embodiment, the system 10 is a system for manufacturing semiconductors. In other embodiments, the matching network can form part of any system attempting to match a source impedance to a load impedance to maximize power transfer to the load.

In the exemplified embodiment, the system 10 includes a radio frequency (RF) source 30 having a substantially fixed output impedance $R_{source}$ (e.g., 50 ohms). The RF source 30 generates an RF signal that is received at the input 101 of the matching network 100. The RF source 30 is also operably coupled to chassis ground GND. The RF source 30 may be an RF generator of a type that is well-known in the art to generate an RF signal at an appropriate frequency and power for the process performed within the load 20. The RF source 30 may be electrically connected to the RF input 101 of the impedance matching network 100 using a coaxial cable or similar means, which for impedance matching purposes may have the same fixed (or substantially fixed) impedance as the RF source 30.

The system 10 further includes a load. In the exemplified embodiment, the load is a plasma chamber 20 for manufacturing a semiconductor. The semiconductor device can be a microprocessor, a memory chip, or another type of integrated circuit or device.

As is known in the art, the plasma within a plasma chamber 20 typically undergoes certain fluctuations outside of operational control so that the impedance presented by the plasma chamber 20 is a variable impedance. Since the variable impedance of the plasma chamber 20 cannot be fully controlled, an impedance matching network may be used to create an impedance match between the plasma chamber 20 and the RF source 30. In other embodiments, the load can be any load of variable impedance that can utilize a matching network.

The plasma chamber 20 can include a first electrode 22 and a second electrode 26, and in processes that are well known in the art, the first and second electrodes, in conjunction with appropriate control systems (not shown) and the plasma in the plasma chamber 120, enable one or both of deposition of materials onto a substrate 24 and etching of materials from the substrate 24. The plasma chamber 20 can receive an RF signal from the output 102 of the matching network 100 and thereby receive RF power from the RF source 30 to energize plasma within the plasma chamber 20 to perform the deposition or etching.

The matching network 100 can consist of a single module within a single housing designed for electrical connection to the RF source 30 and plasma chamber 20. In other embodiments, the components of the matching network 100 can be located in different housings, some components can be outside of the housing, and/or some components can share a housing with a component outside the matching network 100.

The matching network 100 provides impedance matching for the RF source 30 and the plasma chamber 20. The matching network 100 is operably coupled between the RF source 30 and the plasma chamber 20. The matching network 100 includes an input 101 configured to operably couple to the RF source 30, and an output 102 configured to operably couple to the plasma chamber 20. The matching network 100 further includes a first variable capacitor C1 and a second variable capacitor C2. In a preferred embodiment, the variable capacitors C1, C2 are EVCs, though in other embodiments, other types of variable capacitors can be used, such as VVCs. EVCs may use switches to add or remove the discrete capacitors, such as an MLCC (multi-layer ceramic capacitor), that form the EVC. The capacitor-switch circuit may be placed in parallel with other capacitor-switch circuits. The parallel circuits allow the discrete capacitors to be simply added or subtracted in the circuit, depending on how many switches are opened or closed. In the case where all the switches are open, the EVC will be at its lowest capacitance value. In the case where they are all closed, the EVC will be at its highest capacitance value.

In this first embodiment, the matching network 100 is a pi network. The first variable capacitor C1 forms part of a first shunt S1 parallel to the RF source 30, and the second variable capacitor C2 forms part of a second shunt S2 separate from the first shunt S1. Put differently, the first variable capacitor C1 is parallel to the input 101, and the second variable capacitor C2 is parallel to the output 102. Further, a first inductor L1 is located between the first shunt S1 and the second shunt S2. In other embodiments, a second inductor L2 can be located between the second shunt S2 and the output 102.

The first variable capacitor C1 has a first capacitance, and the second variable capacitor C2 has a second capacitance. The first capacitance and the second capacitance are configured to be altered to create an impedance match at the input. As will be discussed further herein, however, the invention is not limited to pi matching networks, as other types of matching networks can be utilized.

To reduce a voltage on the second variable capacitor C2, the matching network 100 further includes a third capacitor C3 in series with the second variable capacitor C2. Components or nodes are said to be "in series" if the same current flows through each. In the exemplified embodiment, the third capacitor C3 forms part of the second shunt S2, though the invention is not so limited. In other embodiments, the third capacitor C3 can be at different locations, provided the third capacitor C3 is positioned to reduce a voltage on the second variable capacitor C2 (the reduced voltage being, for example, an alternating current or radio frequency voltage). For example, the positions of C2 and C3 in FIG. 1 can be reversed. Alternative embodiments are discussed below. In the embodiments discussed, the third or additional capacitor is a non-variable capacitor, though in other embodiments a variable capacitor can be used.

In the exemplified embodiment, a fourth capacitor C4 is included. The fourth capacitor C4 is parallel to the second shunt S2 and helps to offset the total capacitance. In other embodiments, the fourth capacitor C4 can be omitted.

Figure 2:
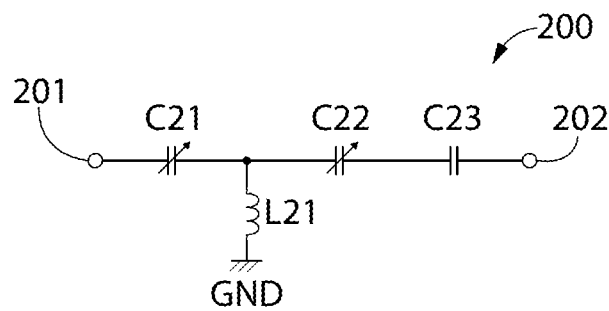
FIG. 2 is a T matching network according to one embodiment.

FIG. 2 is a T matching network 200 according to a second embodiment. The matching network 200 includes an input 201 configured to operably couple to an RF source and an output 202 configured to operably couple to a load. A first variable capacitor C21 is in series with the input 201, and a second variable capacitor C22 is in series with the output 202. An inductor L21 at one end is coupled at a node between the two variable capacitors C21, C22 and coupled at another end to chassis ground. As with the first embodiment, the third capacitor C23 is in series with the second variable capacitor C22 to reduce a voltage on the second variable capacitor C22.

Figure 3:
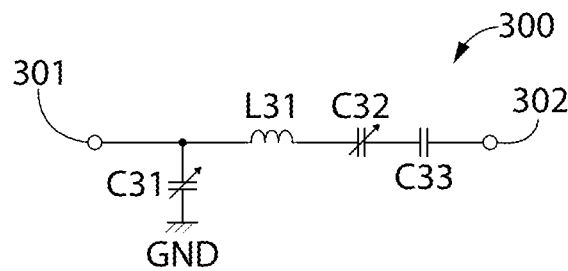
FIG. 3 is an L matching network according to one embodiment.

FIG. 3 is an L matching network 300 according to a third embodiment. The matching network 300 includes an input 301 configured to operably couple to an RF source and an output 302 configured to operably couple to a load. A first variable capacitor C31 is parallel to the input 301. Further, a second variable capacitor C32 is in series with the output 302. Further, an inductor L31 is in series with the output 302. As with the first embodiment, the third capacitor C33 is in series with the second variable capacitor C32 to reduce a voltage on the second variable capacitor C32.

Figure 4:
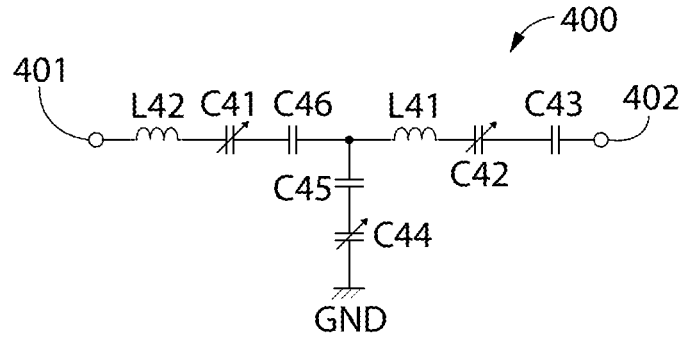
FIG. 4 is a T-variation matching network according to one embodiment.

FIG. 4 is a matching network 400 that is a variation on a T matching network according to a fourth embodiment. The matching network 400 includes an input 401 configured to operably couple to an RF source and an output 402 configured to operably couple to a load. A first variable capacitor C41 is in series with the input 401, a second variable capacitor C42 is in series with the output 202, and another variable capacitor C44 at one end is coupled at a node between the two variable capacitors C41, C42 and coupled at another end to chassis ground. Further, capacitor C46 is in series with capacitor C41, capacitor C43 is in series with capacitor C42, and capacitor C45 is in series with capacitor C44. An inductor L41 is in series with the output 402, and an inductor L42 is in series with the input 401. As with the first embodiment, the third capacitor C43 reduces a voltage on the second variable capacitor C42. Further, capacitors C41 and C45 reduce voltage on capacitors C46 and C44, respectively.

Figure 5:
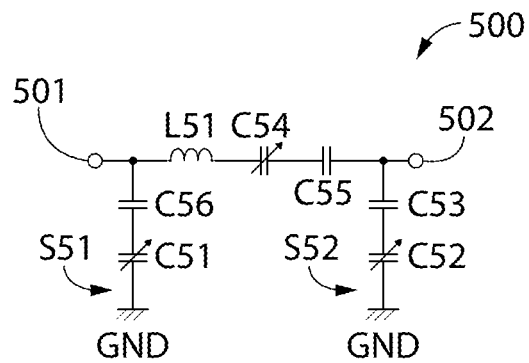
FIG. 5 is a pi-variation matching network according to one embodiment.

FIG. 5 is a matching network 500 that is a variation on a pi matching network according to a fifth embodiment. The matching network 500 includes an input 501 configured to operably couple to an RF source and an output 502 configured to operably couple to a load. A first variable capacitor C51 forms part of a first shunt S51 parallel to the input 501, a second variable capacitor C52 forms part of a second shunt S52 separate from and parallel to the output 502, and another variable capacitor C54 is located between variable capacitors C51 and C52. Capacitor C56 is in series with variable capacitor C51, capacitor C53 is in series with variable capacitor C52, and capacitor C55 is in series with variable capacitor C54. Further, a first inductor L51 is in series with variable capacitor C54. As with the first embodiment, the third capacitor C53 reduces a voltage on the second variable capacitor C52. Further, capacitors C55 and C56 reduce a voltage on variable capacitors C54 and C51, respectively.

Figure 6:
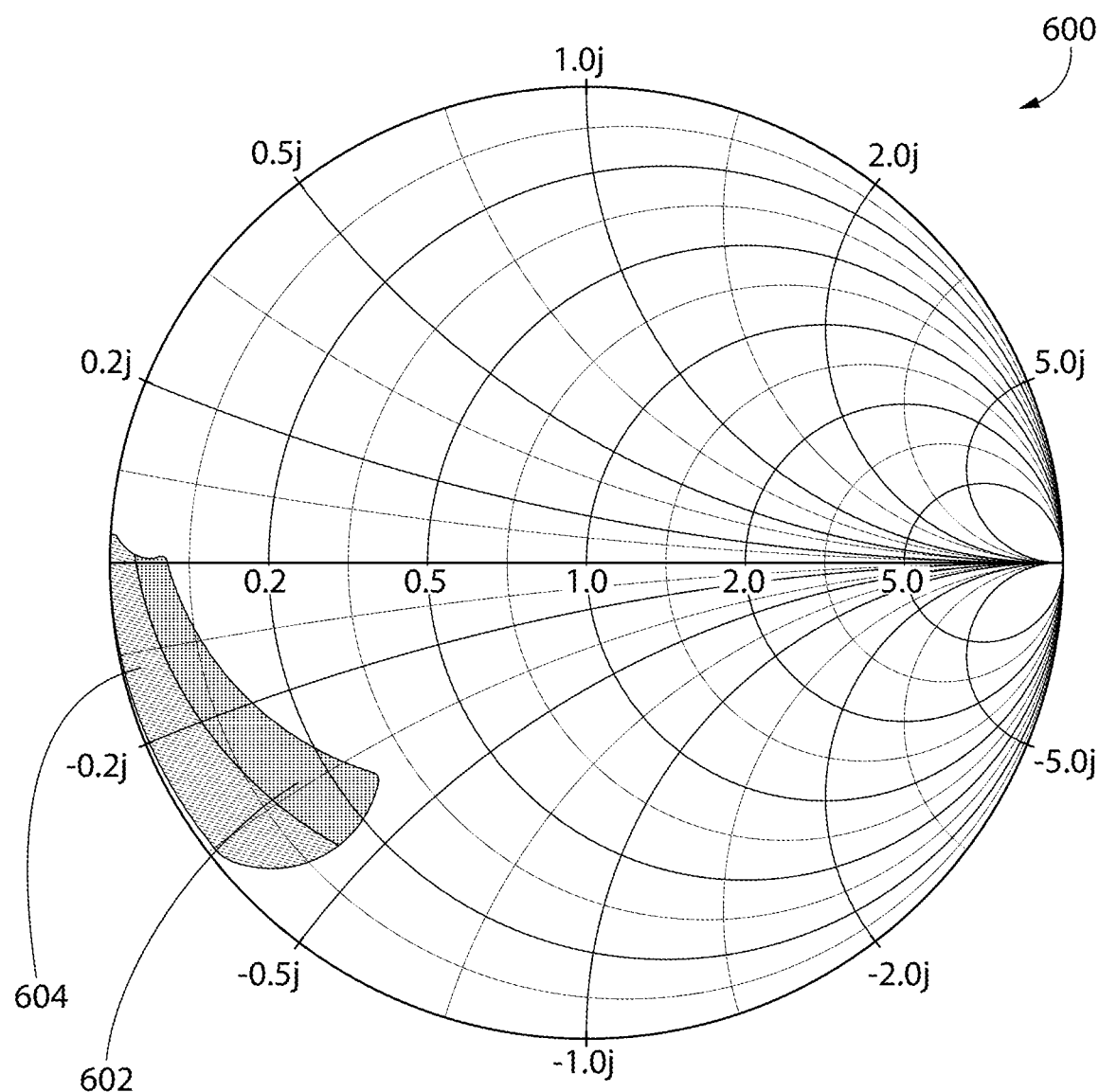
FIG. 6 is an impedance Smith chart for the pi matching network of FIG. 1 where capacitor C3 is omitted.

FIG. 6 shows an impedance Smith chart 600 for the matching network of FIG. 1 before the additional capacitor C3 is added. An impedance Smith chart shows the different possible impedances for a matching network. In FIG. 6, the first region 602 and the second region 604 together represent the total number of possible impedances. There is a maximum voltage across C2 (e.g., 1600V). The first region 601 represents the impedance range where the maximum voltage is not exceeded (within spec), and the second region 602 represents the impedance range where the maximum voltage is exceeded (out of spec). It can be seen that about half of the impedance range of the matching network cannot be used at full power due to over voltage.

In the embodiment discussed below, the values of the additional fixed capacitor C3 and variable capacitors C2 (see FIG. 1) are chosen to reduce the voltage $V_{Drop}$ on the variable capacitor C2 by half at the maximum capacitance (compared to the voltage on the variable capacitor C2 without the presence of the additional capacitor C3). This is only an example, and the voltage drop can be altered depending on the application, the desired voltage drop, and/or the availability of components.

The voltage drop $V_{Drop}$ across the variable capacitor C2 (see FIG. 1) can be calculated by the following equation:

$$V_{drop} = V_{C2} * \frac{1}{C2} \Big/ \left( \frac{1}{C2} + \frac{1}{C3} \right)$$

If $C2_{Max}=C3$, then the formula can be simplified as below, where $C2_{Max}=C3=C$.

$$V_{Drop} = V_{C2} * \frac{1}{C} \Big/ \left( \frac{1}{C} + \frac{1}{C} \right) = V_{C2} * 1/(1+1) = \frac{V_{C2}}{2}$$

As a result, $V_{Drop}$ is equal to half of the voltage that was originally capacitor C2 ($V_{C2}$) when C3 was not included.

$$V_{Drop} = \frac{V_{C2}}{2}$$

Continuing with this example, the next step is to find the maximum capacitance required for the variable and fixed capacitors. In this case, the total series capacitance CVar is equal to the maximum capacitance of the original variable capacitor C2. The capacitance CVar can be calculated by the following equation:

$$CVar_{Max} = \left( \frac{1}{C2_{Max}} + \frac{1}{C3} \right)^{-1}$$

If $C2_{Max}=C3=C$, the equation can be modified as follows:

$$\frac{1}{CVar_{Max}} = \left( \frac{1}{C} + \frac{1}{C} \right) = \frac{2}{C}$$

C is then solved for as follows:

$$C = 2 \cdot CVar_{Max}$$

The minimum value for variable capacitor C2, $C2_{Min}$, can be found by using the previously calculated value for C3 and replacing the $CVar_{Max}$ with the minimum capacitance, $CVar_{Min}$, as in the following equations:

$$\frac{1}{C2_{min}} = \left(\frac{1}{CVar_{Min}} - \frac{1}{C3}\right)$$

$$C2_{min} = \left(\frac{1}{CVar_{Min}} - \frac{1}{C3}\right)^{-1}$$

Figure 7:
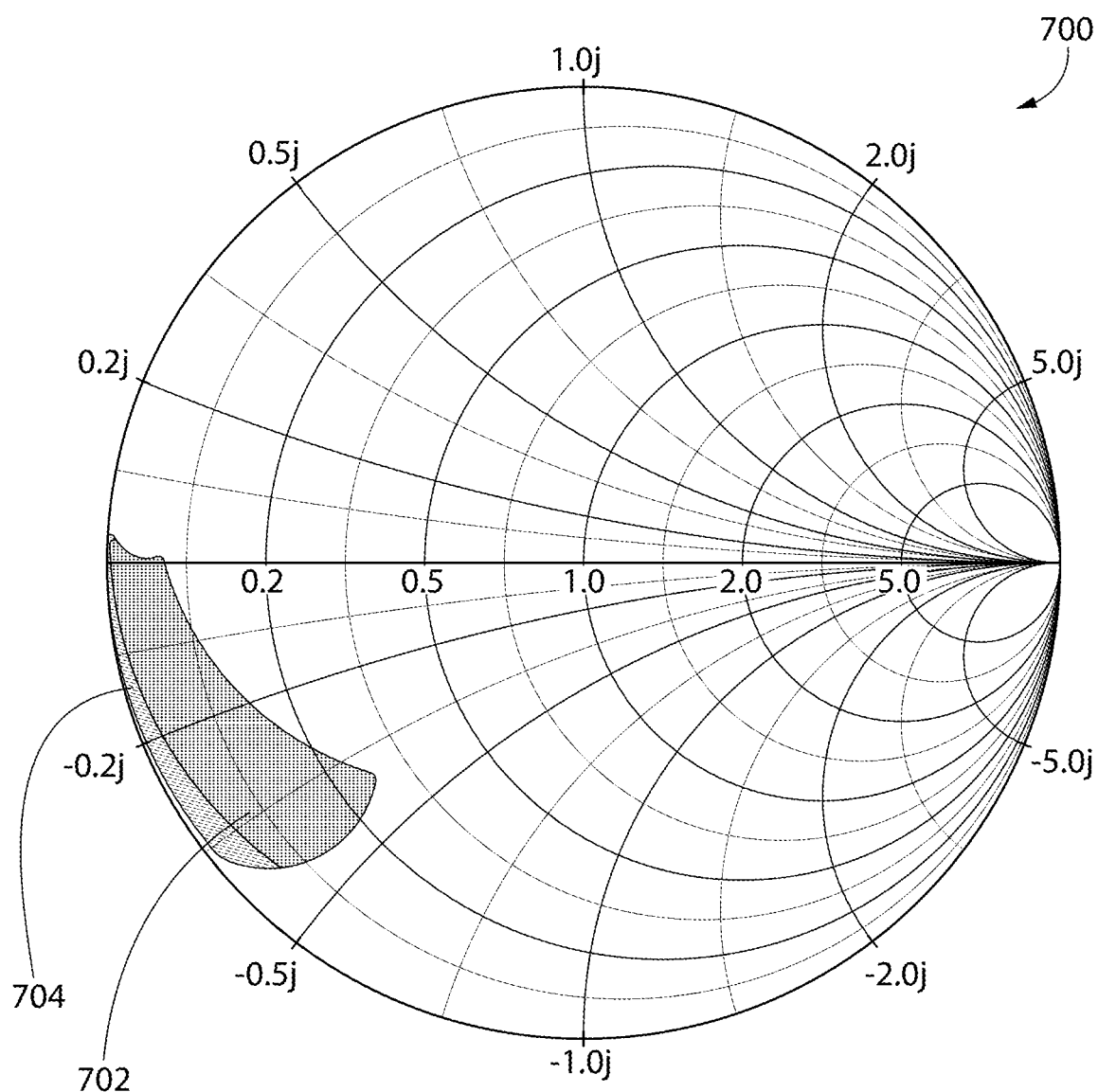
FIG. 7 is an impedance Smith chart for the pi matching network of FIG. 1 where $C3=C2_{Max}$.

FIG. 7 is an impedance Smith chart 700 where third capacitor C3 is set to the maximum capacitance of second capacitor C2 (C3=$C2_{Max}$). It is shown that the usable range of the matching network (represented by first region 702) has been increased, and the unusable range (represented by second region 704) has been decreased, without sacrificing the impedance range, using a more expensive, larger, higher voltage component, or adding more peripheral components to meet the voltage requirements.

It can also be seen, however, that the first (usable) region 702 has gaps representing areas where a perfect impedance match is not provided. This can be a result of adding capacitor C3 to reduce the voltage, which increases the gap between the quantized states of the variable capacitor when approaching $C2_{Min}$ and decreased the spacing when approaching $C2_{Max}$.

Figure 8:
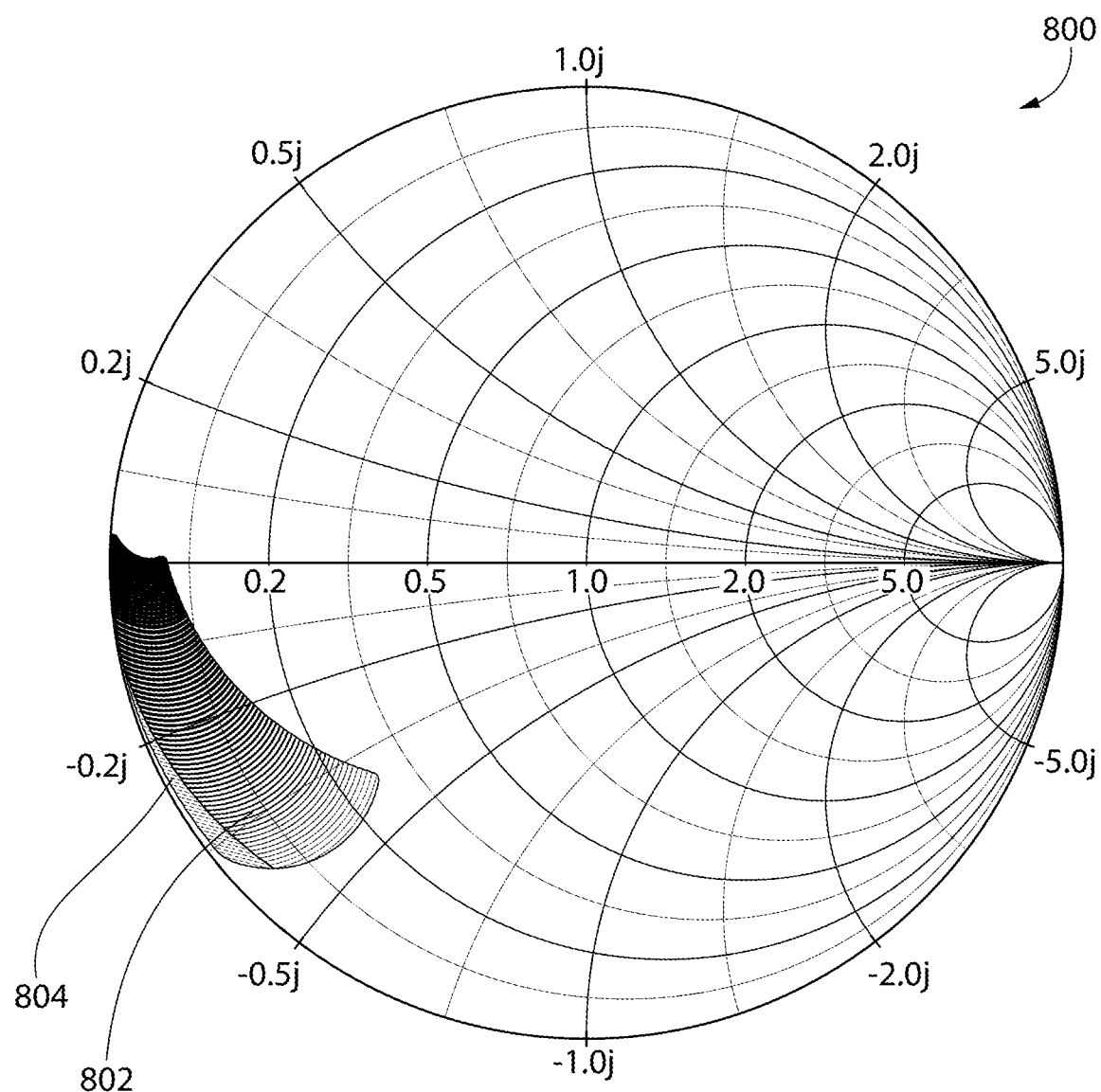
FIG. 8 is an impedance Smith chart for the pi matching network of FIG. 1 where $C3=C2_{Min}$.

FIG. 8 is an impedance Smith chart 800 where third capacitor C3 is set to the minimum capacitance of second capacitor C2 (C3=$C2_{Min}$). It is shown that such an arrangement can further increase the usable range (first region 802) of the matching network, and decrease the unusable range (second region 804). C3 can be reduced further, but there is a limit before it affects the maximum capacitance range. To avoid this, each of C3 and $C2_{Max}$ can be greater than $CVar_{Max}$. This is also true if using two or more variable capacitors in series. Thus, if C1 was replaced with C15 and C16, then $C15_{Max}$ and $C16_{Max}$ can be selected to each be greater than $C1_{Max}$. $C1_{Max}$ can be calculated using the following equation:

$$C1_{Max} = \left(\frac{1}{C15_{Max}} + \frac{1}{C16_{Max}}\right)^{-1}$$

Figure 9:
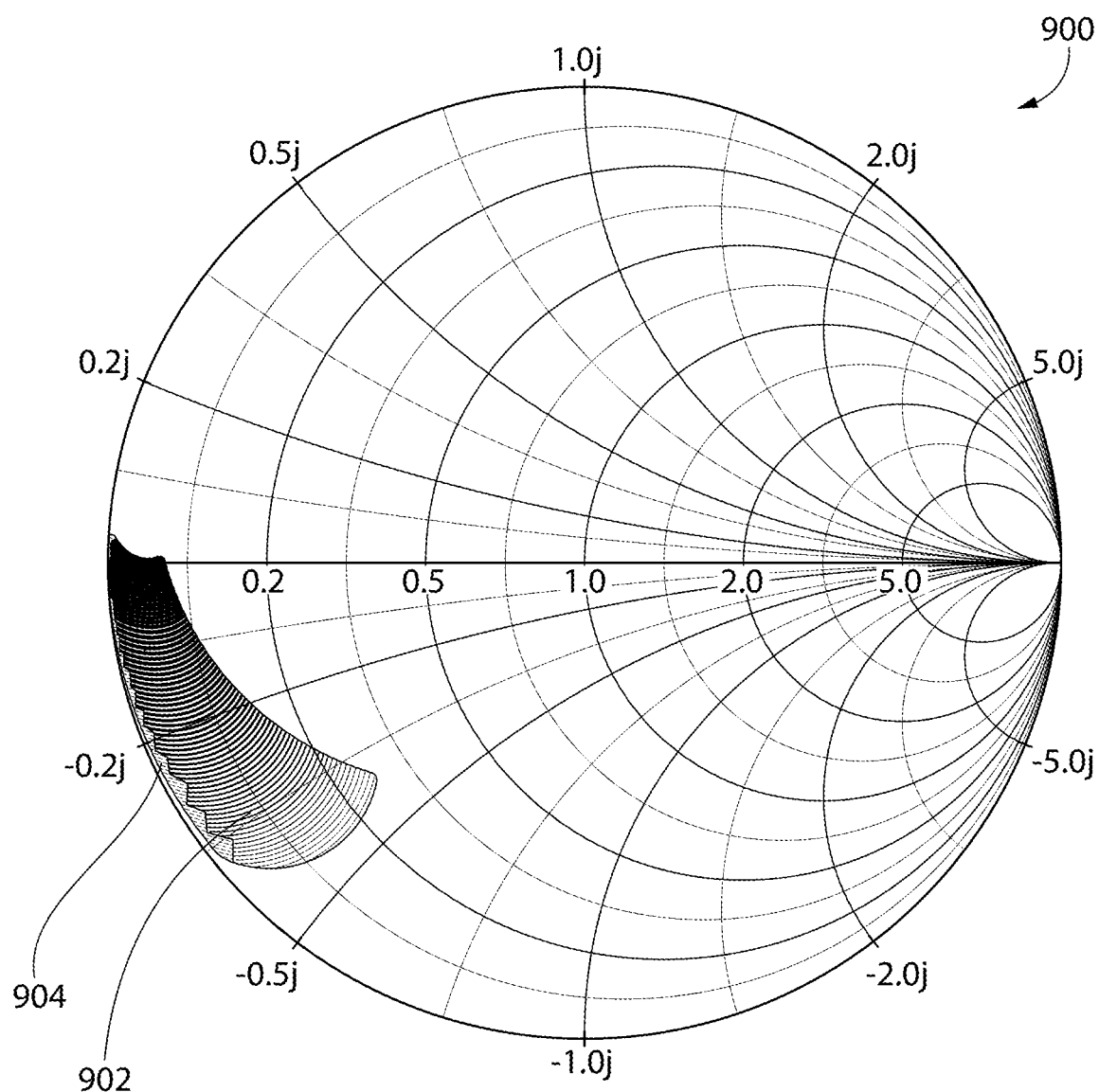
FIG. 9 is an impedance Smith chart for the pi matching network of FIG. 1 where C3 is replaced with a variable capacitor.

The addition of a third variable or non-variable capacitor, to help further reduce $V_{Drop}$, can change the capacitor range of the variable capacitor combination C2. To address this, a variable capacitor such as an EVC can be easily modified to adjust the capacitor range. The third capacitor can also change the step sizes and make them nonlinear. In certain embodiments, a more uniform distribution can be provided by using a nonlinear variable capacitor or multiple variable capacitors in series. FIG. 9 is an impedance Smith chart 900 where the third capacitor C3 is replaced with a variable capacitor. This figure shows the usable range (first region 902) of the matching network, and the unusable range (second region 904).

In other embodiments, transmission lines (which can comprise microstrips, coaxial cable, a wave guide, or any other conductive medium) can be used to rotate the impedance of the matching network on the Smith chart. The length of the transmission line at a certain frequency determines the amount of rotation. The longer the transmission line, the more rotation there will be on the Smith chart. A quarter wavelength ($\lambda/4$) transmission line (which can be calculated using the operating frequency and the property of the dielectric material) will have a 180° clockwise rotation on the Smith chart, a half wavelength ($\lambda/2$) transmission line will have a 360° clockwise rotation on the Smith chart, an eighth wavelength ($\lambda/8$) would be equal to 45°, and so on.

Figure 10:
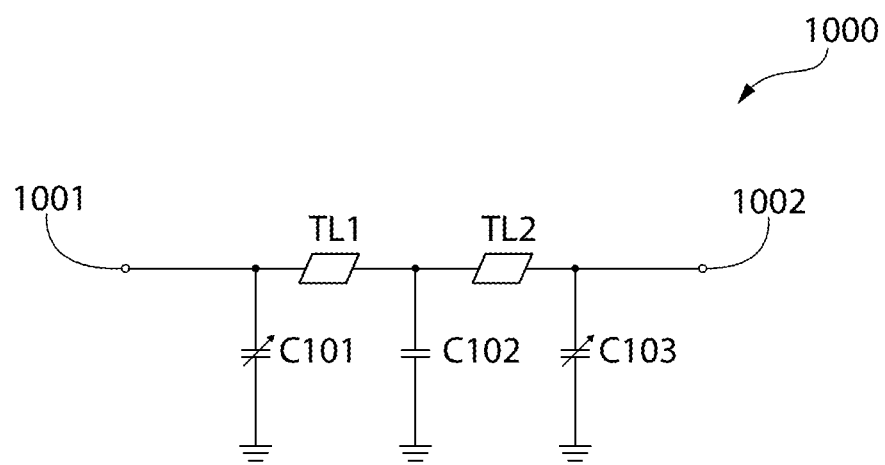
FIG. 10 is matching network using transmission lines to rotate the impedance.

If the matching network 1000 uses only quarter wave lines, or something that would ultimately give a 90° phase shift [($\lambda/4$)+N*($\lambda/2$)], and there are the three capacitors C101, C102, C103 in shunt (together with transmission lines TL1 and TL2), as shown in FIG. 10, the circuit can be equivalent to a low pass pi matching network, with input 1001 and output 1002. Two variable capacitors can be used with a single transmission line between to create the equivalent of an L-type matching network (e.g., C101-TL1-C102 of FIG. 10). Transmission lines can then be added to the input port, the output port or both ports to create the equivalent inverse network of the two previously mentioned matching networks. In other embodiments, other topologies can be created with other transmission lines.

Figure 11:
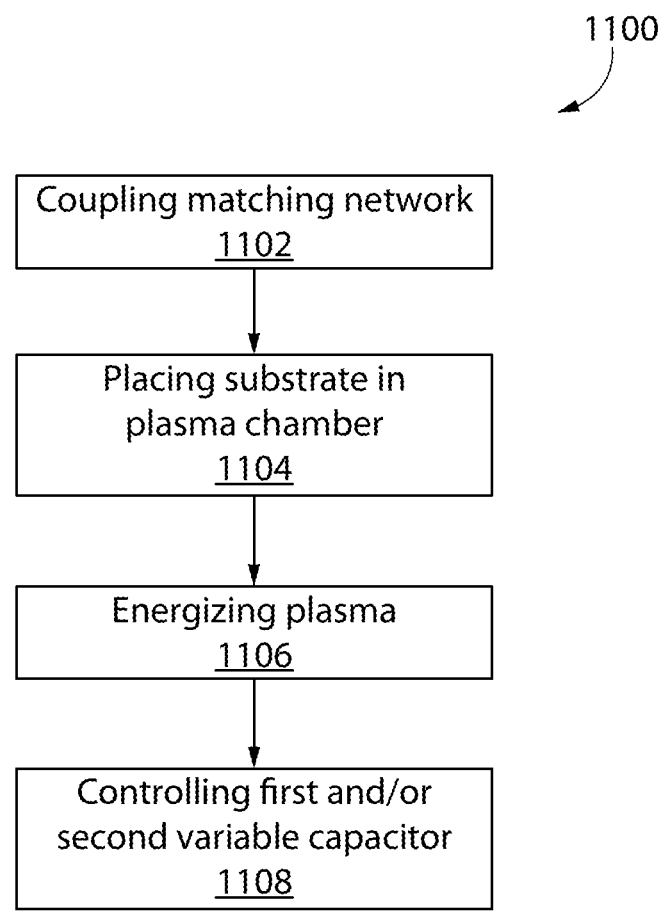
FIG. 11 is a flowchart of a method of manufacturing a semiconductor according to one embodiment.

FIG. 11 is a flowchart of a method 1100 of manufacturing a semiconductor according to one embodiment. In the exemplified embodiment, a matching network is operably coupled between an RF source and a plasma chamber (operation 1102), as in the embodiment of the system 10 shown in FIG. 1. The matching network can be configured to have the features of any of the embodiments discussed herein. Further, the method 1100 can include placing a substrate in the plasma chamber (operation 1104). Further, the method 1100 can include energizing plasma within the plasma chamber by coupling RF power from the RF source into the plasma chamber to perform a deposition or etching (operation 1106). Further, the method 1100 can include controlling a capacitance of the first variable capacitor and/or the second variable capacitor to achieve an impedance match (operation 1108).

The foregoing embodiments provide several advantages. The embodiments disclose a matching network that can more effectively handle high voltages generated in a network. Further, the embodiments avoid or minimize the need for increased component sizes (as typically required for a VVC) or increased numbers of peripheral components (as typically required with an EVC). Further, the embodiments provide a solution that has a lower cost than previous methods of addressing high voltages in a matching network. As shown herein, the embodiments can increase the usable range of a matching network without sacrificing the impedance range, using a more expensive, larger, higher voltage component, or adding more peripheral components to meet the voltage requirements.

Capacitance Variation

As discussed above, an EVC is a type of variable capacitor that can use multiple switches, each used to create an open or short circuit, with individual series capacitors to change the capacitance of the variable capacitor. The switches can be mechanical (such as relays) or solid state (such as PIN diodes, transistors, or other switching devices). The following is a discussion of various methods for setting up an EVC or other variable capacitor to provide varying capacitances.

In an accumulative setup of an EVC, the approach to linearly increase the capacitor value from the minimum starting point (where all switches are open) is to incrementally increase the number of fine tune capacitors that are switched into the circuit. Once the maximum number of fine tune capacitors is switched into circuit, a coarse tune capacitor is switch in, and the fine tune capacitors are switched out. The process starts over with increasing the number of fine tune capacitors that are switched into circuit, until all fine and coarse tune capacitors are switched in. In this setup, all of the fine tune capacitors have the same or a substantially similar value, and all the coarse tune capacitors have the same or a substantially similar value. Further, the capacitance value of one coarse tune capacitor about equals the combined capacitance value of all fine tune capacitors plus an additional fine tune capacitor into the circuit, thus enabling a linear increase in capacitance.

An example of this in an ideal setting would be if the fine tune capacitors were equal to 1 pF, and the coarse tune capacitors were equal to 10 pF. In this ideal setup, when all switches are open, the capacitance is equal to 0 pF. When the first switch is closed, there is 1 pF in the circuit. When the second switch is closed there is 2 pF in the circuit, and so on, until nine fine tune switches are closed, giving 9 pF. Then, the first 10 pF capacitor is switched into circuit and the nine fine tune switches are opened, giving a total capacitance of 10 pF. The fine tune capacitors are then switched into circuit from 11 pF to 19 pF. Another coarse tune capacitor can then be switched into circuit and all fine tune capacitors can be switched out of circuit giving 20 pF. This process can be repeated until the desired capacitance is reached.

This can also be taken one step further. Using the previous example, having nine 1 pF capacitors and also nine 10 pF capacitors, the variable capacitor circuit can have even larger values, 100 pF, to switch in and out of circuit. This would allow the previous capacitor array to go up to 99 pF, and then the 100 pF capacitor can be used for the next increment. This can be repeated further using larger increments, and can also be used with any counting system.

FIG. 12 is a graph 1 of capacitance for an accumulative EVC according to one embodiment. The graph 1 shows the capacitor percentage versus the capacitor value. In this embodiment, there are 12 coarse tune capacitors, each equal to 36 pF, and 12 fine tune capacitors, each equal to 3.3 pF. The switch is assumed to have a parasitic capacitance of 0.67 pF each. With parasitic capacitance from the switches added in series with each capacitor, the range of the EVC is 14.5 pF (all switches open) to 471.6 pF (all switches closed) and it has 169 unique capacitor values.

An alternative capacitor setup is referred to herein as a binary weighted setup. In the binary weighted setup, the capacitor values will all be different. The first value is equal to the minimum desired change in capacitance. Then each successive capacitor value is increased to double the change in capacitance from the previous up until the maximum desired capacitor value, when all capacitors are switched in.

In one example (that assumes there are no parasitic capacitances), the lowest capacitance capacitor would be a 1 pF capacitor, followed by 2 pF, 4 pF, and so on. When all switches are open, the value is 0 pF. When the 1 pF capacitor is switched in, the EVC total capacitance value is 1 pF. Then the 1 pF capacitor is switched out of circuit and the 2 pF capacitor is switched in, causing a total capacitance of 2 pF. When 3 pF is needed, the 1 pF and the 2 pF capacitors are switched in. For 4 pF, the 1 and 2 pF capacitors are switched out of circuit and the 4 pF capacitor is switched into circuit. This can be repeated adding 1 pF, 2 pF, and 4 pF together in different combinations in the circuit, creating values of 5 pF, 6 pF and 7 pF.

FIG. 13 is a graph 2 of a capacitance for a binary weighted EVC according to one embodiment. As with FIGS. 12 and 14-15, this graph 2 shows the capacitor percentage versus the capacitor value. As used herein, the term "capacitor percentage" refers to the amount of capacitance switched in as a portion of the total potential capacitance. For example, if a binary weighted system has capacitor values 1 pF, 2 pF, and 4 pF, the capacitor percentage would be 0% when all the capacitors are switched out of circuit, and 100% when all the capacitors are switched in. If the 1 pF and 4 pF capacitors are switched in, the capacitor percentage would be 5 pF/7 pF, or 71.4%.

In the embodiment of FIG. 13, the capacitors from lowest to highest value are 3.0 pF, 5.1 pF, 9.1 pF, 18 pF, 36 pF, 75 pF, 150 pF and 300 pF. Again, the switch is assumed to have a parasitic capacitance of 0.67 pF each. With parasitic capacitance from the switches added in series with each capacitor, the capacitors provide a change in capacitance from switch open to switch closed, of 2.45 pF, 4.51 pF, 8.48 pF, 17.4 pF, 35.3 pF, 74.3 pF, 149 pF and 299 pF. The EVC capacitor ranges from 5.04 pF to 596.2 pF, with 256 unique capacitor values.

The binary weighted setup can result in using far less capacitors to switch in and out of circuit to achieve the same or better resolution and range. A potential problem with this setup, however, is that, once the capacitor reaches a certain value, the voltage and/or current on that particular capacitor or the current on the switch can be higher than the specification allows for. This forces the EVC to use multiple capacitors in parallel for each switch of lower value.

FIG. 14 is a graph 3 of current versus current rating according to one embodiment. This graph 3 shows the current 3A against the current ratings 3B of a certain group of capacitors. The increase in current 3A versus the current rating 3B is not proportional and only gets worse as the capacitor value is increased. The capacitors up to 36 pF meet the specification, while the values above do not. In the accumulated method there are no issues, but in the binary weighted method it is better to instead use two 36 pF capacitors in parallel rather than one 75 pF capacitor.

Another potential disadvantage of the binary weighted setup is that it is difficult to achieve a consistent step size throughout the range. The above capacitor values for the binary setup give an average step size of 2.32 pF, compared to the accumulative method, which has an average step size of 2.72 pF. But the minimum and maximum step for the binary weighted setup is 1.51 pF and 7.51 pF, respectively, while the accumulative setup's minimum and maximum are only 2.4 pF and 2.75 pF.

With higher value capacitors, this can be further complicated with finding a value that does not overshoot multiple steps. Also, part-to-part tolerances being greater than the minimum step size can further increase the gaps. A 300 pF capacitor with a ±5% tolerance can have up to 15 pF of extra capacitance. The delta capacitance of the three least significant binary weighted capacitors total 15.44 pF. So, these values are completely overstepped, and linearity is lost.

One modification to the binary weighted setup is to have the larger capacitor values rounded down to the next standard value, for example 3.0 pF, 5.1 pF, 9.1 pF, 18 pF, 36 pF, 68 pF, 130 pF, 240 pF. Doing this would create some overlap in capacitor value where there would be a drop in capacitance when switching in the new larger value and switching out the previous smaller values. For example, the values 3 pF through 36 pF would combine to equal 71.2 pF, but the next step is 68 pF, a drop of 3.2 pF. This problem can be avoided, however, because the EVC does not need to go sequentially through each step, but instead can use software to lookup the next known capacitor position to switch to it directly.

FIG. 15 is a graph 4 of a capacitance for a binary with overlap EVC according to one embodiment. As can be observed, this graph 4 shows how the overlap helps create a smooth increase in capacitance.

Figure 16:
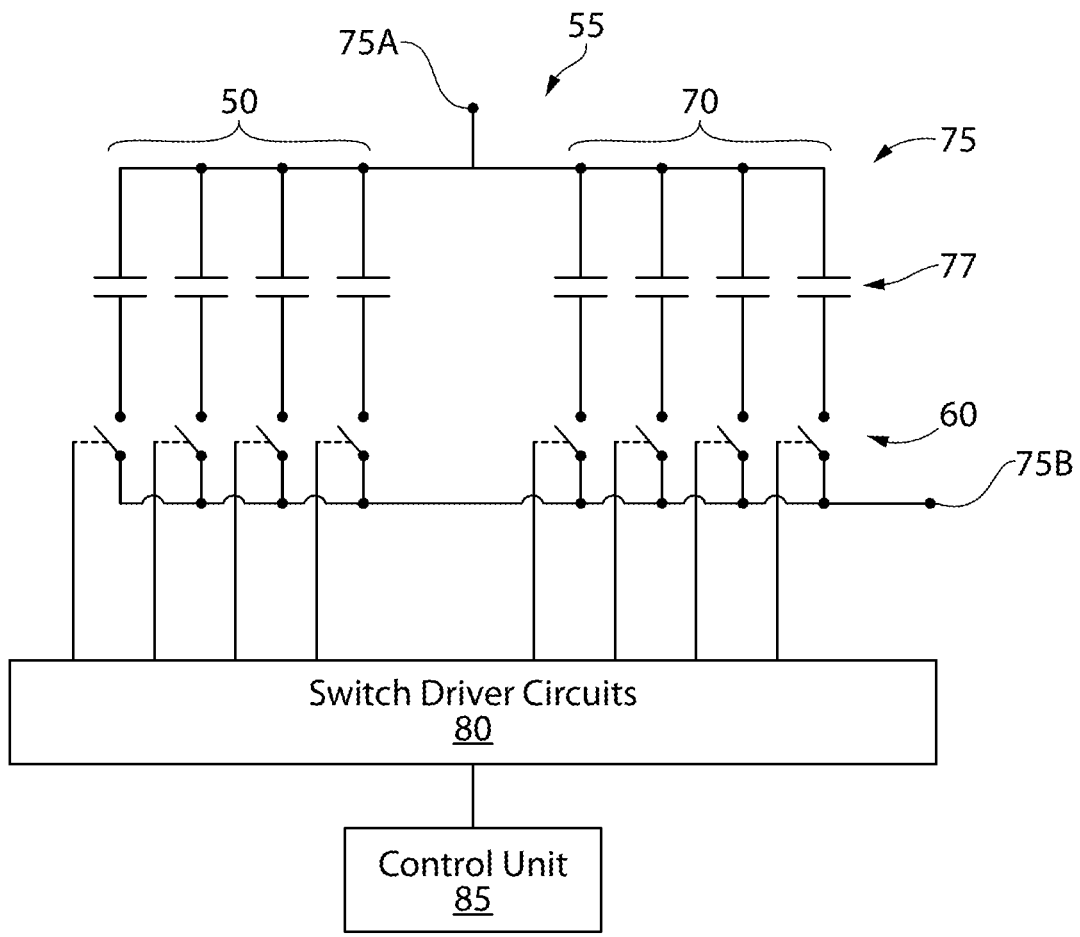
FIG. 16 is a schematic of a variable capacitance system according to one embodiment.

FIG. 16 is a schematic of a variable capacitance system 55 according to a partial binary setup. The partial binary setup uses attributes of both the accumulative and binary setups. The variable capacitance system 55 comprises a variable capacitor 75 (such as an EVC or a VVC) for providing a varying capacitance. The variable capacitor 75 has an input 75A and an output 75B. The variable capacitor 75 includes a plurality of capacitors 77 operably coupled in parallel. The plurality of capacitors 77 includes first capacitors 50 and second capacitors 70. Further, the variable capacitor 75 includes a plurality of switches 60. Of the switches 60, one switch is operably coupled in series to each of the plurality of capacitors to switch in and out each capacitor, thereby enabling the variable capacitor 75 to provide varying total capacitances.

The switches 60 can be coupled to switch driver circuits 80 for driving the switches on and off. The variable capacitance system 55 can further include a control unit 85 operably coupled to the driver circuits 80 for instructing the driver circuits 80 to switch one or more of the switches 60, and thereby turn one or more of the capacitors 77 on or off. In one embodiment, the control unit 85 can form part of a control unit that controls variable capacitor, such as a control unit that instruct the variable capacitors of a matching network to change capacitances to achieve an impedance match.

In the exemplified embodiment, the first capacitors 50 are fine tune capacitors using a method similar to the binary method discussed above. Thus, the fine tune capacitors 50 can have capacitances increasing by a factor of about two, where "about two" refers to a value of 1.5 to 2.5. In an ideal example where there are no parasitic capacitances, the fine tune capacitors could increase by a factor of exactly two (e.g., 1 pF, 2 pF, 4 pF, 8 pF).

But in real world applications, parasitic capacitances, such as those provided by the switches 60, are another factor that must be considered in choosing the capacitance values of the fine tune capacitors 50. Thus, while a first capacitor may have a value of 1 pF, and the corresponding capacitor-switch pair may thus provide 1 pF to a total capacitance of the variable capacitor when the capacitor's corresponding switch is closed, when the switch is open, the open switch may have a parasitic capacitance of, for example, 1 pF. Thus, when the switch is open, there are essentially two 1 pF capacitances in series, which is equivalent to 0.5 pF. Thus, when the first fine tune capacitor switch switches from open to close, the change in the capacitance contributed to the variable capacitor by this capacitor-switch pair is from 0.5 pF (open) to 1 pF (closed), for a change of 0.5 pF. These changes in capacitance caused by parasitic capacitances must be taken into consideration in choosing capacitor values to ensure that the target step size (e.g., 0.5 pF) for the total capacitance can be achieved.

Returning to the previous example, if an EVC had four fine capacitors, and each capacitor switch had a parasitic capacitance of 1 pF, and a step size of 0.5 pF was desired, the fine capacitors could be 1 pF, 1.6 pF, 2.7 pF, and 4.7 pF. As discussed, the first fine capacitor (1 pF) would cause a 0.5 pF change to the total capacitance when switched in. The second fine tune capacitor (1.6 pF) and its switch would provide 0.6 pF when open and 1.6 pF when closed, thus causing a change in the total capacitance of about 1 pF when switched in. The third fine tune capacitor (2.7 pF) would cause a change in the total capacitance of about 2 pF when switched in, and the fourth fine tune capacitor (4.8 pF) would cause a change in the total capacitance of about 4 pF when switched in. Thus, the changes to the total capacitance caused by the switching in of each of the four first tune capacitors would be 0.5 pF, 1 pF, 2 pF, and 4 pF, respectively. Thus, the changes caused by the switching in of each of these capacitors increases by a factor of two. It is understood that the invention is not limited to these values. Other capacitor values (or switches with other parasitic capacitances) can be used such that the changes caused increase by a factor of about two. For example, the 4.8 pF capacitor of the above example could be replaced with a standard 4.7 pF capacitor. Further, other capacitance values can be used to achieve other step sizes. The foregoing considerations regarding parasitic capacitances can equally apply to the binary setup discussed above.

The second capacitors 70, by contrast, are coarse tune capacitors using a method similar to the accumulative method discussed above. Thus, the second capacitors can have a substantially similar capacitance. Capacitors are considered to have substantially similar capacitances if, of the capacitors in question, no capacitance is 15 percent (15%) greater than or less than another capacitance. Alternatively, the capacitors can be chosen such that there are no gaps in total capacitance greater than the minimum step size needed for the given application.

The first (fine) capacitors 50 can increase their value (or the value by which they change the total capacitance) in a binary fashion, and thus by a factor of about two, up to the first coarse position. When all of the fine capacitors 50 are switched into circuit, the first coarse capacitor 71 can be switched in, and all the fine capacitors 50 are switched out. Then the fine capacitors 50 can be switched in and out until they are all switched into circuit. The next step would be to add another coarse tune capacitor 72. It is understood, however, that the EVC does not need to go sequentially through each step to achieve a desired total capacitance, but instead can use software to lookup the next known capacitor position to switch to it directly.

In one embodiment, there are four fine capacitors 50. The first fine capacitor 51 has a capacitance of 3.0 pF, the second fine capacitor 52 has a capacitance of 5.1 pF, the third fine capacitor 53 has a capacitance of 9.1 pF, and the fourth fine capacitor has a capacitance of 18 pF. Further, there are four coarse tune capacitors 70 having capacitances of 36 pF each. Thus, in this embodiment, the total combined capacitance of the fine capacitors (35.2 pF) is substantially similar to the individual capacitances of the coarse capacitors (36 pF). It also follows that the capacitance of each of the coarse capacitors is greater than a greatest individual capacitance (18 pF) of the fine capacitors.

In this embodiment, there will be 208 unique capacitor values. With parasitics, the minimum total capacitance is 10.25 pF and the maximum total capacitance is 467.2 pF. The range is less than 1 pF less than the accumulative method, but with an increase in unique points. The minimum step size is 1.51 pF, the maximum is 2.54 pF and the average is 2.21 pF. Thus, the results of the setups discussed are as follows:

TABLE 1

Comparison of EVC Setups

| | Accumulative | Binary Weighted | Partial Binary |
|---|---|---|---|
| Min total capacitance | 14.5 pF | 5.05 pF | 10.25 pF |
| Max total capacitance | 471.6 pF | 596.2 pF | 467.2 pF |
| Min and max step size | 2.4-2.75 pF | 1.5-7.51 pF | 1.51-2.54 pF |
| Unique capacitor values | 169 | 256 | 208 |

Figure 17:
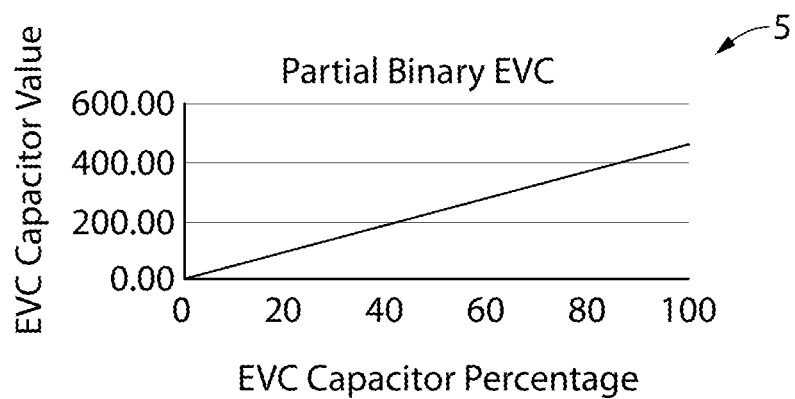
FIG. 17 is a graph of a capacitance of a partial binary EVC according to one embodiment.

FIG. 17 is a graph 5 of a capacitance of a partial binary EVC according to one embodiment. The graph shows the capacitor percentage versus the EVC total capacitance for the partial binary method for switching. As can be seen, this setup provides a smooth line for providing the various total capacitances required while also providing a large range.

The partial binary method provides multiple advantages. First, the current on each capacitor will not be over its rating. The maximum current and the current rating will be the same for all coarse capacitors, because they will be the same value. With the fine steps, all of the capacitor values have a higher ratio of current rating to maximum current. Therefore, no issues should arise.

Further, the partial binary approach avoids large gaps in capacitance steps. Further, less capacitors are needed to have the same range, while the number of unique values can potentially be increased. With less capacitors, the EVC will need less switches, causing the EVC to take up less area. Further, less capacitors will require less hardware to control the switches.

Binary with overlap can also be implemented in this setup to avoid any issues with part tolerance if required. Thus, the coarse capacitor values could be reduced in capacitance. It is further understood that, while the exemplified embodiment uses four first capacitors 50 and four second capacitors 70, other numbers of capacitors can be used. Also, other capacitor values can be used.

Figure 18:
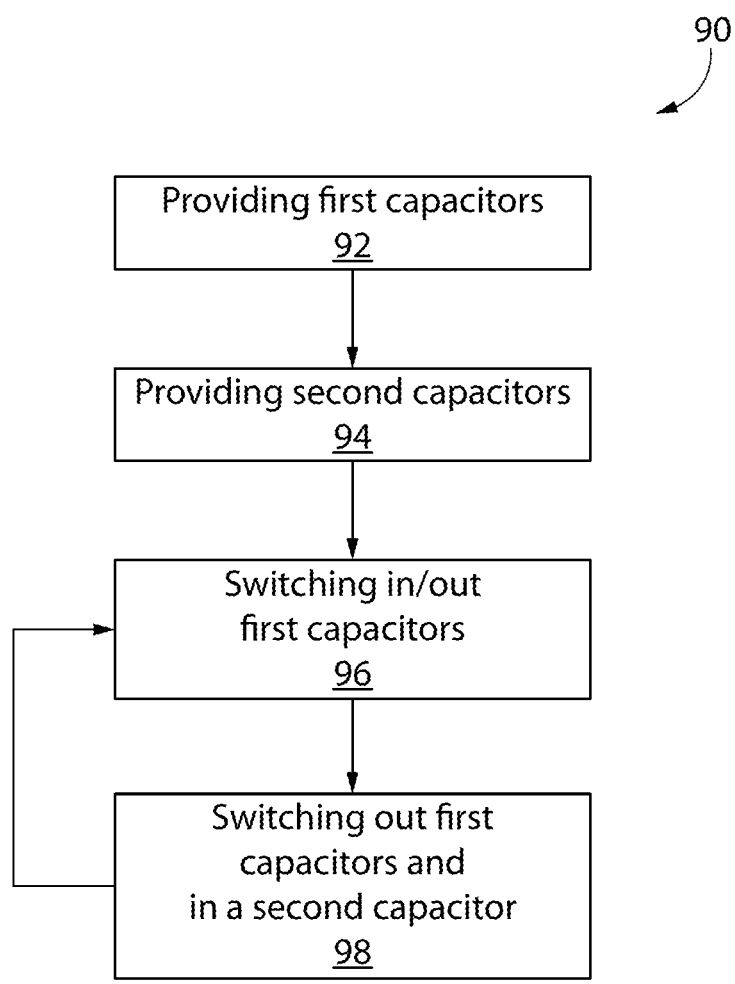
FIG. 18 is a flow chart of a method for varying capacitance according to one embodiment.

FIG. 18 is a flow chart of a method for varying capacitance according to one embodiment. According to this embodiment, there is provided a plurality of capacitors operably coupled in parallel, the plurality of capacitors comprising first capacitors increasing in capacitance by a factor of about two (operation 92); and second capacitors having substantially the same capacitance (operation 94). The total capacitance can be varied by switching in or out one of the first capacitors and one of the second capacitors. Increasing total capacitance can be provided by switching in and out each of the first capacitors to provide an increasing total capacitance until all of the first capacitors are switched in (operation 96), then switching out the first capacitors and switching in a second capacitor (operation 98). If increasing total capacitance is desired, the system can again switch in and out each of the first capacitors to provide an increasing total capacitance until all of the first capacitors are switched in (operation 98).

It is understood, however, that the EVC does not need to go sequentially through each step, but instead can use software to lookup the next known capacitor position to switch to it directly. It is further understood that a desired total capacitance can be achieved by having switched on a minimal number of capacitors of the plurality of capacitors.

In another embodiment, the variable capacitor can for part of a method of manufacturing a semiconductor, such as the system displayed shown in FIG. 1. The method can include operably coupling a matching network between an RF source and a plasma chamber, the plasma chamber configured to deposit a material layer onto the substrate or etch a material layer from the substrate. The matching network can include an input configured to operably couple to the RF source; an output configured to operably couple to the plasma chamber; and a variable capacitor, the variable capacitor comprising a plurality of capacitors operably coupled in parallel, the plurality of capacitors comprising first capacitors increasing in capacitance by a factor of about two; and second capacitors having substantially the same capacitance. The method can further include the steps of placing a substrate in the plasma chamber; energizing plasma within the plasma chamber by coupling RF power from the RF source into the plasma chamber to perform a deposition or etching; and controlling a total capacitance of the variable capacitor to achieve an impedance match, the total capacitance being controlled by switching in and out capacitors of the plurality of capacitors.

Restricted Partial Binary Capacitor Switching

Figure 18A:
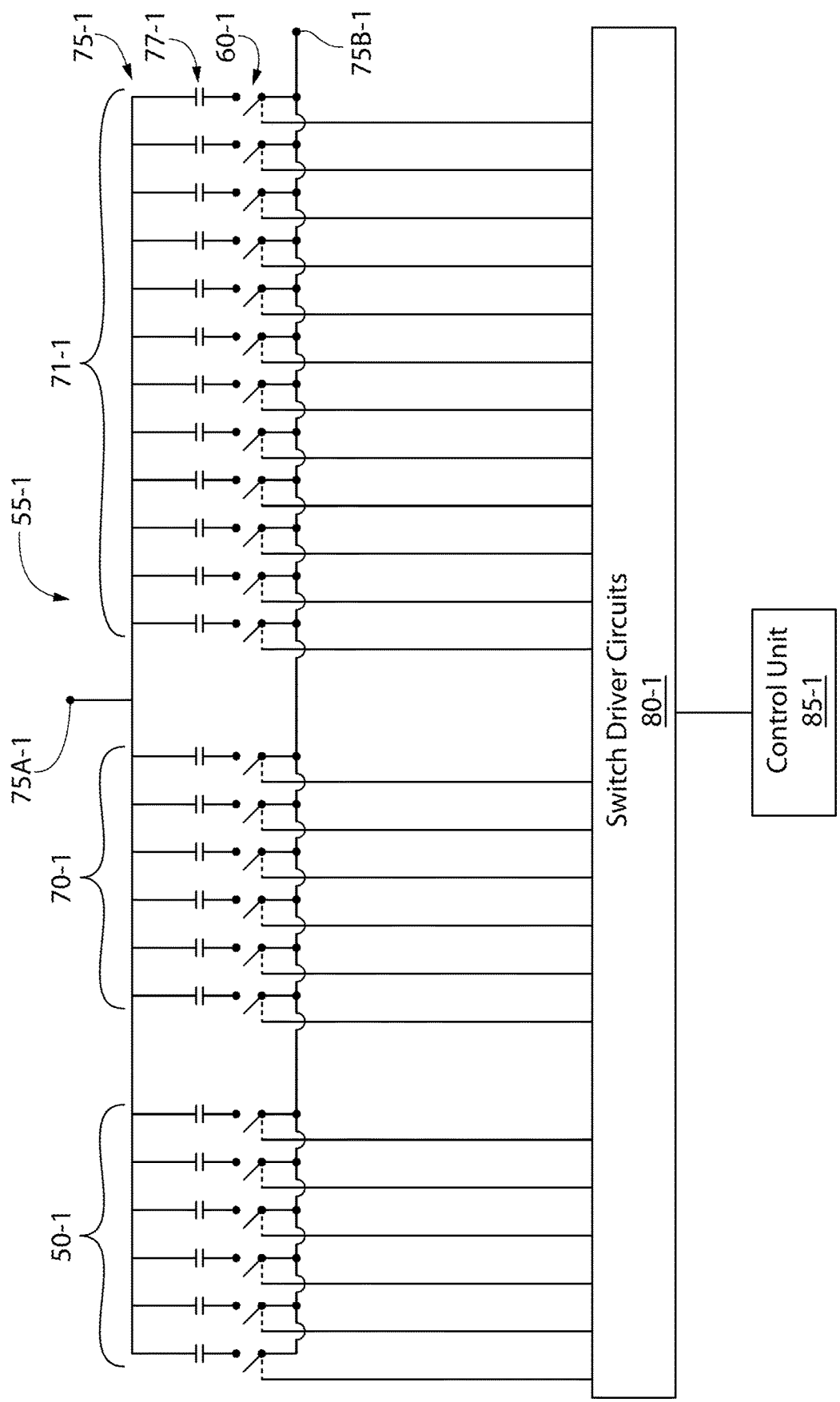
FIG. 18A is a schematic of a restricted partial binary variable capacitance system according to one embodiment.

FIG. 18A is a schematic of a restricted partial binary variable capacitance system 55-1 according to one embodiment. This method uses a partial binary setup similar to that discussed above, but where one or more fine capacitors are restricted from switching in under certain circumstances to be described below ("restricted partial binary setup"). The variable capacitance system 55-1 comprises a variable capacitor 75-1 (such as an EVC) for providing a varying capacitance. The variable capacitor 75-1 has an input 75A-1 and an output 75B-1. The variable capacitor 75-1 includes a plurality of capacitors 77-1 operably coupled in parallel. The plurality of capacitors 77-1 includes fine capacitors 50-1, first coarse capacitors 70-1, and second coarse capacitors 71-1. Further, the variable capacitor 75-1 includes a plurality of switches 60-1. Of the switches 60-1, one switch is operably coupled in series to each of the plurality of capacitors to switch in and out each capacitor, thereby enabling the variable capacitor 75-1 to provide varying total capacitances.

The switches 60-1 can be coupled to switch driver circuits 80-1 for driving the switches on and off. The variable capacitance system 55-1 can further include a control unit 85-1 operably coupled to the driver circuits 80-1 for instructing the driver circuits 80-1 to switch one or more of the switches 60-1, and thereby turn one or more of the capacitors 77-1 on or off. In one embodiment, the control unit 85-1 can form part of a control unit for a matching network that controls the capacitances of one or more variable capacitors of the matching network to achieve an impedance match. In the exemplified embodiment, the control unit 85-1 (sometimes referred to as "control circuit") is configured to (a) determine which of the coarse capacitors and the fine capacitors to have switched in to achieve an impedance match and (b) cause the determined coarse and fine capacitors to be switched in. This can be based on a determination, by the control unit or otherwise, of the variable impedance of the plasma chamber. The invention is not so limited, however, as the determination of the capacitors to switch in can be based on other factors, such as an input impedance at the input of the matching network.

In the exemplified embodiment, the fine capacitors 50-1 have capacitances increasing by a factor of about two, where "about two" refers to a value of 1.5 to 2.5, though the invention is not so limited and the fine capacitors can increase in value in another manner. In an ideal example where there are no parasitic capacitances, the fine tune capacitors could increase by a factor of exactly two (e.g., 1 pF, 2 pF, 4 pF, 8 pF, etc.). But as discussed above, in real world applications parasitic capacitances, such as those provided by the switches 60-1, are another factor that must be considered in choosing the capacitance values of the fine tune capacitors 50-1. In the exemplified embodiment, the fine capacitors 50-1 have values of 47 pF, 91 pF, 180 pF, 390 pF, 750 pF, 1500 pF, though the invention is not limited to these values or this number of capacitors.

According to the restricted partial binary setup, the coarse capacitors are made up of first coarse capacitors 70-1 each having a substantially similar first coarse capacitance, and second coarse capacitors 71-1 each having a substantially similar second coarse capacitance. Capacitors are considered to have substantially similar capacitances if, of the capacitors in question, no capacitance is 15 percent (15%) greater than or less than another capacitance. In the exemplified embodiment, there are 6 first coarse capacitors 70-1 each having a capacitance of 1000 pF, and 12 second coarse capacitors 71-1 each having a capacitance of 3000 pF. Thus, in the exemplified embodiment, one of the fine capacitors (the 1500 pF fine capacitor) has a capacitance greater than the first coarse capacitance of 1000 pF. In other embodiments, more than one of the fine capacitors can have a capacitance greater than the first coarse capacitance. Further, in other embodiments other values and other numbers of coarse capacitors can be used.

Each capacitor of the plurality of capacitors 77-1 provides a change to a total capacitance of the variable capacitor 75-1 when the capacitor is switched in. To gradually increase the total capacitance of the variable capacitor 75-1, the control unit 85-1 can successively switch in, in a predetermined order, each of the first coarse capacitors 70-1, followed by each of the second coarse capacitors 71-1. As for the fine capacitors 50-1, the control unit restricts which fine capacitors can be switched in. That is, it only switches in the fine capacitors 50-1 whose capacitance is less than a capacitance of a next coarse capacitor of the coarse capacitors predetermined to be switched in next.

As discussed above, in the exemplified embodiment, the fine capacitors 50-1 have capacitances substantially equal to 47 pF, 91 pF, 180 pF, 390 pF, 750 pF, 1500 pF; the first coarse capacitors 70-1 comprise six capacitors having capacitances substantially equal to 1000 pF; and the second coarse capacitors 71-1 comprise twelve capacitors having capacitances substantially equal to 3000 pF. To gradually increase capacitance, the fine capacitors can be switched into the circuit in a binary fashion as described above except for the 1500 pF fine capacitor, which is restricted from switching in until all the first coarse capacitors are switched in. When all the 1000 pF first coarse capacitors are switched in, the next coarse capacitor to be switched in is a 3000 pF second coarse capacitor. Thus, once all the 1000 pF first coarse capacitors are switched in, the 1500 pF fine capacitor is able to switch in with the rest of the fine capacitors.

Table 3 below shows the first 167 positions ("Pos.") for a variable capacitor using the restricted partial binary setup. The total capacitance ("Total Cap.") for each position is shown, along with the fine capacitors (F1-F6) and first coarse capacitors (C1-C6) switched in for a given position. As can be seen, although the fine capacitors switch in in a somewhat typical binary fashion, the 1500 pF fine capacitor is not able to switch in until position 165, when all of the first coarse capacitors have been switched in.

TABLE 3

| | | | | | Restricted Partial Binary Values | | | | | | | |
|---|---|---|---|---|---|---|---|---|---|---|---|---|
| Pos. | Total Cap. | F1 (47) | F2 (91) | F3 (180) | F4 (390) | F5 (750) | F6 (1500) | C1 (1000) | C2 (1000) | C3 (1000) | C4 (1000) | C5 (1000) | C6 (1000) |
| 1 | 0 | | | | | | | | | | | | |
| 2 | 47 | 47 | | | | | | | | | | | |
| 3 | 91 | | 91 | | | | | | | | | | |
| 4 | 138 | 47 | 91 | | | | | | | | | | |
| 5 | 180 | | | 180 | | | | | | | | | |
| 6 | 227 | 47 | | 180 | | | | | | | | | |
| 7 | 271 | | 91 | 180 | | | | | | | | | |
| 8 | 318 | 47 | 91 | 180 | | | | | | | | | |
| 9 | 390 | | | | 390 | | | | | | | | |
| 10 | 437 | 47 | | | 390 | | | | | | | | |
| 11 | 481 | | 91 | | 390 | | | | | | | | |
| 12 | 528 | 47 | 91 | | 390 | | | | | | | | |
| 13 | 570 | | | 180 | 390 | | | | | | | | |
| 14 | 617 | 47 | | 180 | 390 | | | | | | | | |
| 15 | 661 | | 91 | 180 | 390 | | | | | | | | |
| 16 | 708 | 47 | 91 | 180 | 390 | | | | | | | | |
| 17 | 750 | | | | | 750 | | | | | | | |
| 18 | 797 | 47 | | | | 750 | | | | | | | |
| 19 | 841 | | 91 | | | 750 | | | | | | | |
| 20 | 888 | 47 | 91 | | | 750 | | | | | | | |
| 21 | 930 | | | 180 | | 750 | | | | | | | |
| 22 | 977 | 47 | | 180 | | 750 | | | | | | | |
| 23 | 1000 | | | | | | | 1000 | | | | | |
| 24 | 1047 | 47 | | | | | | 1000 | | | | | |
| 25 | 1091 | | 91 | | | | | 1000 | | | | | |
| 26 | 1138 | 47 | 91 | | | | | 1000 | | | | | |
| 27 | 1180 | | | 180 | | | | 1000 | | | | | |
| 28 | 1227 | 47 | | 180 | | | | 1000 | | | | | |
| 29 | 1271 | | 91 | 180 | | | | 1000 | | | | | |
| 30 | 1318 | 47 | 91 | 180 | | | | 1000 | | | | | |
| 31 | 1390 | | | | 390 | | | 1000 | | | | | |
| 32 | 1437 | 47 | | | 390 | | | 1000 | | | | | |
| 33 | 1481 | | 91 | | 390 | | | 1000 | | | | | |
| 34 | 1528 | 47 | 91 | | 390 | | | 1000 | | | | | |

TABLE 3-continued

Restricted Partial Binary Values

| Pos. | Total Cap. | F1 (47) | F2 (91) | F3 (180) | F4 (390) | F5 (750) | F6 (1500) | C1 (1000) | C2 (1000) | C3 (1000) | C4 (1000) | C5 (1000) | C6 (1000) |
|---|---|---|---|---|---|---|---|---|---|---|---|---|---|
| 35 | 1570 | | | 180 | 390 | | | 1000 | | | | | |
| 36 | 1617 | 47 | | 180 | 390 | | | 1000 | | | | | |
| 37 | 1661 | | 91 | 180 | 390 | | | 1000 | | | | | |
| 38 | 1708 | 47 | 91 | 180 | 390 | | | 1000 | | | | | |
| 39 | 1750 | | | | | 750 | | 1000 | | | | | |
| 40 | 1797 | 47 | | | | 750 | | 1000 | | | | | |
| 41 | 1841 | | 91 | | | 750 | | 1000 | | | | | |
| 42 | 1888 | 47 | 91 | | | 750 | | 1000 | | | | | |
| 43 | 1930 | | | 180 | | 750 | | 1000 | | | | | |
| 44 | 1977 | 47 | | 180 | | 750 | | 1000 | | | | | |
| 45 | 2000 | | | | | | | 1000 | 1000 | | | | |
| 46 | 2047 | 47 | | | | | | 1000 | 1000 | | | | |
| 47 | 2091 | | 91 | | | | | 1000 | 1000 | | | | |
| 48 | 2138 | 47 | 91 | | | | | 1000 | 1000 | | | | |
| 49 | 2180 | | | 180 | | | | 1000 | 1000 | | | | |
| 50 | 2227 | 47 | | 180 | | | | 1000 | 1000 | | | | |
| 51 | 2271 | | 91 | 180 | | | | 1000 | 1000 | | | | |
| 52 | 2318 | 47 | 91 | 180 | | | | 1000 | 1000 | | | | |
| 53 | 2390 | | | | 390 | | | 1000 | 1000 | | | | |
| 54 | 2437 | 47 | | | 390 | | | 1000 | 1000 | | | | |
| 55 | 2481 | | 91 | | 390 | | | 1000 | 1000 | | | | |
| 56 | 2528 | 47 | 91 | | 390 | | | 1000 | 1000 | | | | |
| 57 | 2570 | | | 180 | 390 | | | 1000 | 1000 | | | | |
| 58 | 2617 | 47 | | 180 | 390 | | | 1000 | 1000 | | | | |
| 59 | 2661 | | 91 | 180 | 390 | | | 1000 | 1000 | | | | |
| 60 | 2708 | 47 | 91 | 180 | 390 | | | 1000 | 1000 | | | | |
| 61 | 2750 | | | | | 750 | | 1000 | 1000 | | | | |
| 62 | 2797 | 47 | | | | 750 | | 1000 | 1000 | | | | |
| 63 | 2841 | | 91 | | | 750 | | 1000 | 1000 | | | | |
| 64 | 2888 | 47 | 91 | | | 750 | | 1000 | 1000 | | | | |
| 65 | 2930 | | | 180 | | 750 | | 1000 | 1000 | | | | |
| 66 | 2977 | 47 | | 180 | | 750 | | 1000 | 1000 | | | | |
| 67 | 3000 | | | | | | | 1000 | 1000 | 1000 | | | |
| 68 | 3047 | 47 | | | | | | 1000 | 1000 | 1000 | | | |
| 69 | 3091 | | 91 | | | | | 1000 | 1000 | 1000 | | | |
| 70 | 3138 | 47 | 91 | | | | | 1000 | 1000 | 1000 | | | |
| 71 | 3180 | | | 180 | | | | 1000 | 1000 | 1000 | | | |
| 72 | 3227 | 47 | | 180 | | | | 1000 | 1000 | 1000 | | | |
| 73 | 3271 | | 91 | 180 | | | | 1000 | 1000 | 1000 | | | |
| 74 | 3318 | 47 | 91 | 180 | | | | 1000 | 1000 | 1000 | | | |
| 75 | 3390 | | | | 390 | | | 1000 | 1000 | 1000 | | | |
| 76 | 3437 | 47 | | | 390 | | | 1000 | 1000 | 1000 | | | |
| 77 | 3481 | | 91 | | 390 | | | 1000 | 1000 | 1000 | | | |
| 78 | 3528 | 47 | 91 | | 390 | | | 1000 | 1000 | 1000 | | | |
| 79 | 3570 | | | 180 | 390 | | | 1000 | 1000 | 1000 | | | |
| 80 | 3617 | 47 | | 180 | 390 | | | 1000 | 1000 | 1000 | | | |
| 81 | 3661 | | 91 | 180 | 390 | | | 1000 | 1000 | 1000 | | | |
| 82 | 3708 | 47 | 91 | 180 | 390 | | | 1000 | 1000 | 1000 | | | |
| 83 | 3750 | | | | | 750 | | 1000 | 1000 | 1000 | | | |
| 84 | 3797 | 47 | | | | 750 | | 1000 | 1000 | 1000 | | | |
| 85 | 3841 | | 91 | | | 750 | | 1000 | 1000 | 1000 | | | |
| 86 | 3888 | 47 | 91 | | | 750 | | 1000 | 1000 | 1000 | | | |
| 87 | 3930 | | | 180 | | 750 | | 1000 | 1000 | 1000 | | | |
| 88 | 3977 | 47 | | 180 | | 750 | | 1000 | 1000 | 1000 | | | |
| 89 | 4000 | | | | | | | 1000 | 1000 | 1000 | 1000 | | |
| 90 | 4047 | 47 | | | | | | 1000 | 1000 | 1000 | 1000 | | |
| 91 | 4091 | | 91 | | | | | 1000 | 1000 | 1000 | 1000 | | |
| 92 | 4138 | 47 | 91 | | | | | 1000 | 1000 | 1000 | 1000 | | |
| 93 | 4180 | | | 180 | | | | 1000 | 1000 | 1000 | 1000 | | |
| 94 | 4227 | 47 | | 180 | | | | 1000 | 1000 | 1000 | 1000 | | |
| 95 | 4271 | | 91 | 180 | | | | 1000 | 1000 | 1000 | 1000 | | |
| 96 | 4318 | 47 | 91 | 180 | | | | 1000 | 1000 | 1000 | 1000 | | |
| 97 | 4390 | | | | 390 | | | 1000 | 1000 | 1000 | 1000 | | |
| 98 | 4437 | 47 | | | 390 | | | 1000 | 1000 | 1000 | 1000 | | |
| 99 | 4481 | | 91 | | 390 | | | 1000 | 1000 | 1000 | 1000 | | |
| 100 | 4528 | 47 | 91 | | 390 | | | 1000 | 1000 | 1000 | 1000 | | |
| 101 | 4570 | | | 180 | 390 | | | 1000 | 1000 | 1000 | 1000 | | |
| 102 | 4617 | 47 | | 180 | 390 | | | 1000 | 1000 | 1000 | 1000 | | |
| 103 | 4661 | | 91 | 180 | 390 | | | 1000 | 1000 | 1000 | 1000 | | |
| 104 | 4708 | 47 | 91 | 180 | 390 | | | 1000 | 1000 | 1000 | 1000 | | |
| 105 | 4750 | | | | | 750 | | 1000 | 1000 | 1000 | 1000 | | |
| 106 | 4797 | 47 | | | | 750 | | 1000 | 1000 | 1000 | 1000 | | |
| 107 | 4841 | | 91 | | | 750 | | 1000 | 1000 | 1000 | 1000 | | |
| 108 | 4888 | 47 | 91 | | | 750 | | 1000 | 1000 | 1000 | 1000 | | |
| 109 | 4930 | | | 180 | | 750 | | 1000 | 1000 | 1000 | 1000 | | |

TABLE 3-continued

Restricted Partial Binary Values

| Pos. | Total Cap. | F1 (47) | F2 (91) | F3 (180) | F4 (390) | F5 (750) | F6 (1500) | C1 (1000) | C2 (1000) | C3 (1000) | C4 (1000) | C5 (1000) | C6 (1000) |
|---|---|---|---|---|---|---|---|---|---|---|---|---|---|
| 110 | 4977 |    |    | 180 |     | 750 |      | 1000 | 1000 | 1000 | 1000 |      |      |
| 111 | 5000 |    |    |     |     |     |      | 1000 | 1000 | 1000 | 1000 | 1000 |      |
| 112 | 5047 | 47 |    |     |     |     |      | 1000 | 1000 | 1000 | 1000 | 1000 |      |
| 113 | 5091 |    | 91 |     |     |     |      | 1000 | 1000 | 1000 | 1000 | 1000 |      |
| 114 | 5138 | 47 | 91 |     |     |     |      | 1000 | 1000 | 1000 | 1000 | 1000 |      |
| 115 | 5180 |    |    | 180 |     |     |      | 1000 | 1000 | 1000 | 1000 | 1000 |      |
| 116 | 5227 | 47 |    | 180 |     |     |      | 1000 | 1000 | 1000 | 1000 | 1000 |      |
| 117 | 5271 |    | 91 | 180 |     |     |      | 1000 | 1000 | 1000 | 1000 | 1000 |      |
| 118 | 5318 | 47 | 91 | 180 |     |     |      | 1000 | 1000 | 1000 | 1000 | 1000 |      |
| 119 | 5390 |    |    |     | 390 |     |      | 1000 | 1000 | 1000 | 1000 | 1000 |      |
| 120 | 5437 | 47 |    |     | 390 |     |      | 1000 | 1000 | 1000 | 1000 | 1000 |      |
| 121 | 5481 |    | 91 |     | 390 |     |      | 1000 | 1000 | 1000 | 1000 | 1000 |      |
| 122 | 5528 | 47 | 91 |     | 390 |     |      | 1000 | 1000 | 1000 | 1000 | 1000 |      |
| 123 | 5570 |    |    | 180 | 390 |     |      | 1000 | 1000 | 1000 | 1000 | 1000 |      |
| 124 | 5617 | 47 |    | 180 | 390 |     |      | 1000 | 1000 | 1000 | 1000 | 1000 |      |
| 125 | 5661 |    | 91 | 180 | 390 |     |      | 1000 | 1000 | 1000 | 1000 | 1000 |      |
| 126 | 5708 | 47 | 91 | 180 | 390 |     |      | 1000 | 1000 | 1000 | 1000 | 1000 |      |
| 127 | 5750 |    |    |     |     | 750 |      | 1000 | 1000 | 1000 | 1000 | 1000 |      |
| 128 | 5797 | 47 |    |     |     | 750 |      | 1000 | 1000 | 1000 | 1000 | 1000 |      |
| 129 | 5841 |    | 91 |     |     | 750 |      | 1000 | 1000 | 1000 | 1000 | 1000 |      |
| 130 | 5888 | 47 | 91 |     |     | 750 |      | 1000 | 1000 | 1000 | 1000 | 1000 |      |
| 131 | 5930 |    |    | 180 |     | 750 |      | 1000 | 1000 | 1000 | 1000 | 1000 |      |
| 132 | 5977 | 47 |    | 180 |     | 750 |      | 1000 | 1000 | 1000 | 1000 | 1000 |      |
| 133 | 6000 |    |    |     |     |     |      | 1000 | 1000 | 1000 | 1000 | 1000 | 1000 |
| 134 | 6047 | 47 |    |     |     |     |      | 1000 | 1000 | 1000 | 1000 | 1000 | 1000 |
| 135 | 6091 |    | 91 |     |     |     |      | 1000 | 1000 | 1000 | 1000 | 1000 | 1000 |
| 136 | 6138 | 47 | 91 |     |     |     |      | 1000 | 1000 | 1000 | 1000 | 1000 | 1000 |
| 137 | 6180 |    |    | 180 |     |     |      | 1000 | 1000 | 1000 | 1000 | 1000 | 1000 |
| 138 | 6227 | 47 |    | 180 |     |     |      | 1000 | 1000 | 1000 | 1000 | 1000 | 1000 |
| 139 | 6271 |    | 91 | 180 |     |     |      | 1000 | 1000 | 1000 | 1000 | 1000 | 1000 |
| 140 | 6318 | 47 | 91 | 180 |     |     |      | 1000 | 1000 | 1000 | 1000 | 1000 | 1000 |
| 141 | 6390 |    |    |     | 390 |     |      | 1000 | 1000 | 1000 | 1000 | 1000 | 1000 |
| 142 | 6437 | 47 |    |     | 390 |     |      | 1000 | 1000 | 1000 | 1000 | 1000 | 1000 |
| 143 | 6481 |    | 91 |     | 390 |     |      | 1000 | 1000 | 1000 | 1000 | 1000 | 1000 |
| 144 | 6528 | 47 | 91 |     | 390 |     |      | 1000 | 1000 | 1000 | 1000 | 1000 | 1000 |
| 145 | 6570 |    |    | 180 | 390 |     |      | 1000 | 1000 | 1000 | 1000 | 1000 | 1000 |
| 146 | 6617 | 47 |    | 180 | 390 |     |      | 1000 | 1000 | 1000 | 1000 | 1000 | 1000 |
| 147 | 6661 |    | 91 | 180 | 390 |     |      | 1000 | 1000 | 1000 | 1000 | 1000 | 1000 |
| 148 | 6708 | 47 | 91 | 180 | 390 |     |      | 1000 | 1000 | 1000 | 1000 | 1000 | 1000 |
| 149 | 6750 |    |    |     |     | 750 |      | 1000 | 1000 | 1000 | 1000 | 1000 | 1000 |
| 150 | 6797 | 47 |    |     |     | 750 |      | 1000 | 1000 | 1000 | 1000 | 1000 | 1000 |
| 151 | 6841 |    | 91 |     |     | 750 |      | 1000 | 1000 | 1000 | 1000 | 1000 | 1000 |
| 152 | 6888 | 47 | 91 |     |     | 750 |      | 1000 | 1000 | 1000 | 1000 | 1000 | 1000 |
| 153 | 6930 |    |    | 180 |     | 750 |      | 1000 | 1000 | 1000 | 1000 | 1000 | 1000 |
| 154 | 6977 | 47 |    | 180 |     | 750 |      | 1000 | 1000 | 1000 | 1000 | 1000 | 1000 |
| 155 | 7021 |    | 91 | 180 |     | 750 |      | 1000 | 1000 | 1000 | 1000 | 1000 | 1000 |
| 156 | 7068 | 47 | 91 | 180 |     | 750 |      | 1000 | 1000 | 1000 | 1000 | 1000 | 1000 |
| 157 | 7140 |    |    |     | 390 | 750 |      | 1000 | 1000 | 1000 | 1000 | 1000 | 1000 |
| 158 | 7187 | 47 |    |     | 390 | 750 |      | 1000 | 1000 | 1000 | 1000 | 1000 | 1000 |
| 159 | 7231 |    | 91 |     | 390 | 750 |      | 1000 | 1000 | 1000 | 1000 | 1000 | 1000 |
| 160 | 7278 | 47 | 91 |     | 390 | 750 |      | 1000 | 1000 | 1000 | 1000 | 1000 | 1000 |
| 161 | 7320 |    |    | 180 | 390 | 750 |      | 1000 | 1000 | 1000 | 1000 | 1000 | 1000 |
| 162 | 7367 | 47 |    | 180 | 390 | 750 |      | 1000 | 1000 | 1000 | 1000 | 1000 | 1000 |
| 163 | 7411 |    | 91 | 180 | 390 | 750 |      | 1000 | 1000 | 1000 | 1000 | 1000 | 1000 |
| 164 | 7458 | 47 | 91 | 180 | 390 | 750 |      | 1000 | 1000 | 1000 | 1000 | 1000 | 1000 |
| 165 | 7500 |    |    |     |     |     | 1500 | 1000 | 1000 | 1000 | 1000 | 1000 | 1000 |
| 166 | 7547 | 47 |    |     |     |     | 1500 | 1000 | 1000 | 1000 | 1000 | 1000 | 1000 |
| 167 | 7591 |    | 91 |     |     |     | 1500 | 1000 | 1000 | 1000 | 1000 | 1000 | 1000 |

It is understood that the variable capacitor 75-1 does not need to go sequentially through each step to achieve a desired total capacitance, but instead can use software to lookup the desired capacitor position to switch to it directly. It is further understood that while the exemplified embodiment uses two sets of coarse capacitors (first coarse capacitors and second coarse capacitors) in other embodiments more or less sets of coarse capacitors can be used. For example, three sets of course capacitors could be used, each with a different capacitance value. It is further understood that the variable capacitance system 55-1 can form part of any one of the impedance matching networks discussed above. For example, a matching network may include an input configured to operably couple to an RF source, an output configured to operably couple to a plasma chamber for manufacturing a semiconductor, and the variable capacitance system 55-1 of FIG. 18A. In other embodiments, the variable capacitance system discussed above can be used in other systems requiring variable capacitance.

Figure 18B:
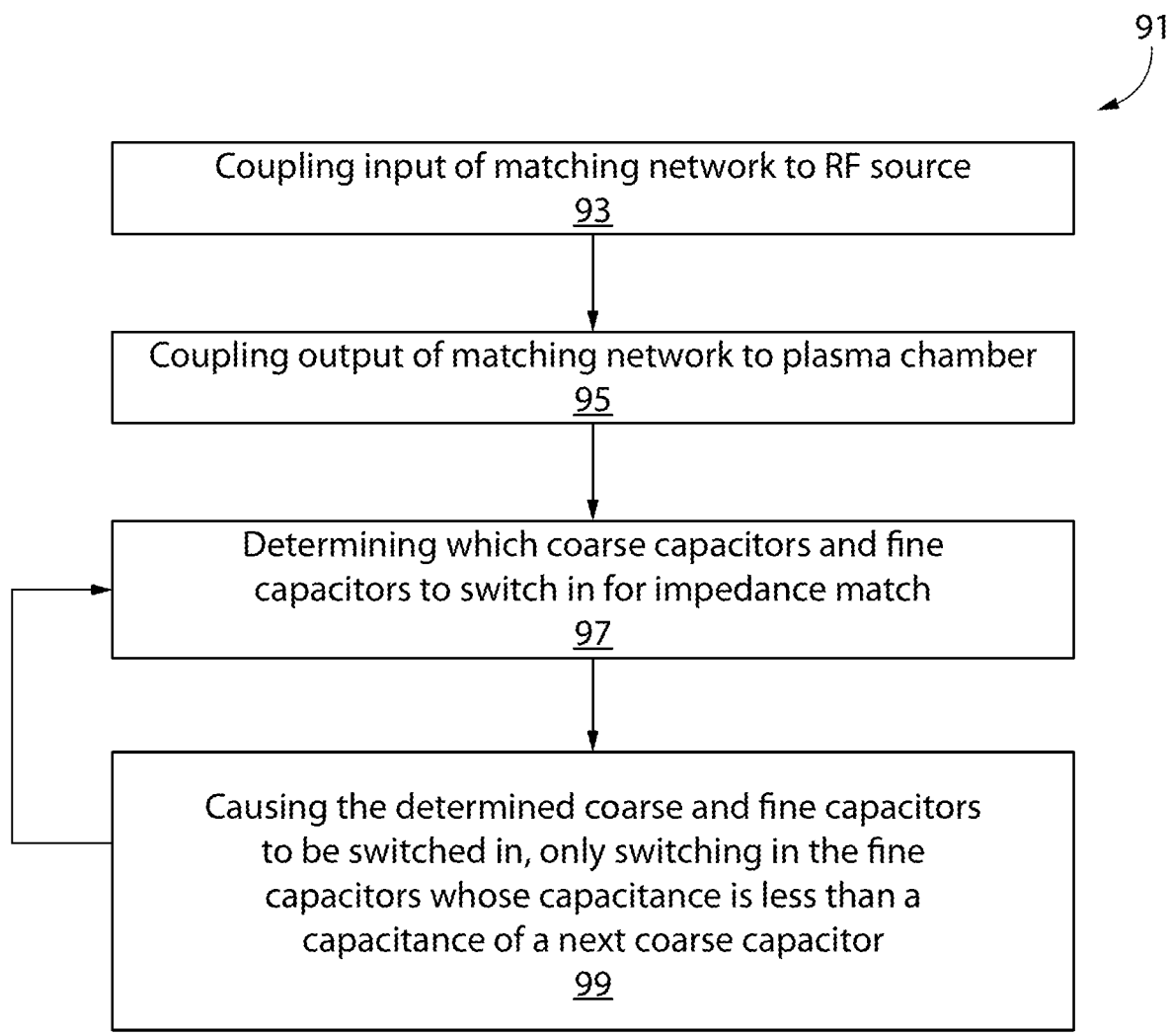
FIG. 18B is a flow chart of a method of matching impedance utilizing a restricted partial binary method for varying capacitance according to one embodiment.

FIG. 18B is a flow chart 91 of a method of matching impedance utilizing a restricted partial binary method for varying capacitance according to one embodiment. An input of a matching network is operably coupled to an RF source (operation 93). Further, an output of the matching network is operably coupled to a plasma chamber for manufacturing a semiconductor (operation 95). The matching network includes the variable capacitance system discussed above. The control unit determines which of the coarse capacitors and the fine capacitors to have switched in to achieve an impedance match (operation 97). The control circuit then causes the determined coarse and fine capacitors to be switched in (operation 99). The fine capacitors are restricted in being switched into the circuit in the manner described above in discussion of FIG. 18A. A method of manufacturing a semiconductor (such as the system displayed shown in FIG. 1) can also utilize the above restricted partial binary variable capacitance system. Further, a semiconductor processing tool (comprising a plasma camber and impedance matching network) can utilize the above restricted partial binary variable capacitance system, specifically, by incorporating the restricted partial binary variable capacitance system into its matching network.

The restricted partial binary setup described above provides multiple advantages. For example, by restricting one or more fine capacitors from switching in, the setup avoids overlap, that is, instances where there is more than one solution for a given impedance value. Further, the restricted partial binary setup allows the variable capacitor to provide a large range of capacitance values by allowing for the use of a high percentage of coarse capacitors. Further, the setup avoids large gaps in capacitance values. Further, less capacitors are needed, thus requiring less switches and causing the variable capacitor to take up less area.

Switching Circuit for Faster Matching

Figure 19:
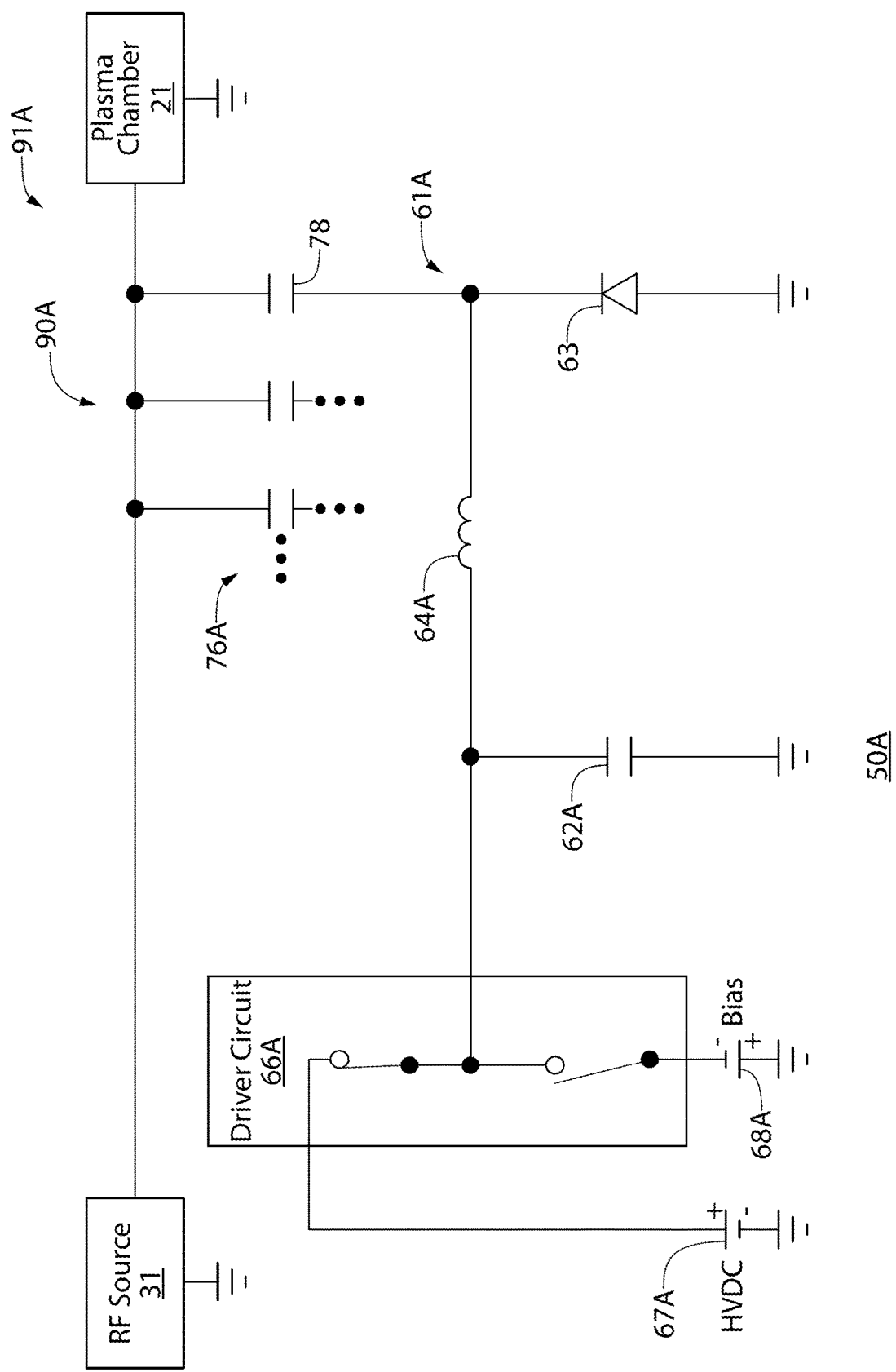
FIG. 19 is a system for manufacturing a semiconductor, the system including a matching network whose EVC utilizes a PIN-diode-based first switching circuit according to an embodiment.

In a matching network, a PIN diode may be used as an RF switch for each discrete capacitor of an EVC. FIG. 19 shows a system 50A for manufacturing a semiconductor, the system including a matching network 90A whose EVC 76A utilizes a PIN-diode-based first switching circuit 61A to switch in or out a discrete capacitor 78 of the EVC 76, according to an embodiment. Similar to FIG. 1, the system 50A includes an RF source 31 and a plasma chamber 21.

In the exemplified embodiment of FIG. 19, the PIN diode 63 is switched OFF by being reverse biased by a high voltage DC supply (HVDC 67A), and switched ON by being forward biased by a current supply (Bias 68A). Because RF voltage is also applied to the switch 63, the biases need to pass through a choke 64A to reduce the RF voltage at the driver circuit 66A. In this embodiment, the choke 64A used to apply the biases usually has large inductance values and may even be self-resonate at or near the RF frequency. This choke design creates a large attenuation and allows for a maximum bandwidth. This ensures that a minimum attenuation is met even with numerous variations.

This choke design may have drawbacks. The main problem is that it may affect the overall switching speed, where large voltages can be generated across the inductor. As shown in Equation 1 (voltage across an inductor), the voltage is equal to the inductance times the rate of change in current.

$$V = L\frac{di}{dt} \quad \text{(Equation 1)}$$

The current comes from the Bias and therefore is fixed. If the inductance of the choke needs to be large, then the bias being applied must gradually increase and decrease. As an example, if the inductance is 60 uH, the bias current is 0.5 Amps, and the switching speed is 10 ns, the voltage generated across the inductor would be 3000 Volts. This could damage components on the driver circuit. This voltage also oscillates and will cause the PIN diode to turn ON and OFF rapidly. If the switching speed is changed to 50 us, this voltage drops to only 0.6 Volts. To drop the inductance would also have a similar effect, but the isolation required prevents this.

The exemplified matching network 90A further includes a filtering capacitor 62A that is used for filtering to help block the RF from the driver circuit 66A. This filtering capacitance is typically a large value to give a low impedance to ground for the RF signal. This large capacitance, however, may add stress to the driver circuit 66A circuitry by creating additional power dissipation. The filtering capacitor 62A and choke inductor 64A can together be considered a filter.

The dissipation is difficult to calculate because of the complexity of the circuit, especially with the slow, nonlinear transition times of the driver circuit 66A. We do know the energy stored in the discrete capacitor 78 and the filtering capacitor 62A and the amount of time that it takes to fully discharge. Thus, the power dissipated per charge and discharge can be roughly calculated for the full system. Equation 2 may be used to calculate the energy stored in the discrete capacitor 78.

$$E = \tfrac{1}{2}CV^2 \quad \text{(Equation 2)}$$

Equation 3 may be used to calculate power dissipation from the energy dissipated over time.

$$P = \frac{E}{t} \quad \text{(Equation 3)}$$

If Equation 2 is substituted into Equation 3, the total power dissipated in the system from the discrete capacitor 78 charge/discharge can be calculated as seen in Equation 4.

$$P = \frac{CV^2}{2t} \quad \text{(Equation 4)}$$

Accordingly, the total power dissipation per switching circuit 61A can be calculated. To continue with the previous example, the switching speed is 50 us. If the HVDC is set to 1650V and the total capacitance is 3400 pF, then the total power dissipated in the system is 93 W. This dissipation includes losses in the driver circuit switch, the power supply, the bias resistor, and anything else in series with the capacitor while it either charges or discharges.

Switching Circuit Utilizing Two PIN Diodes in Parallel

Figure 20:
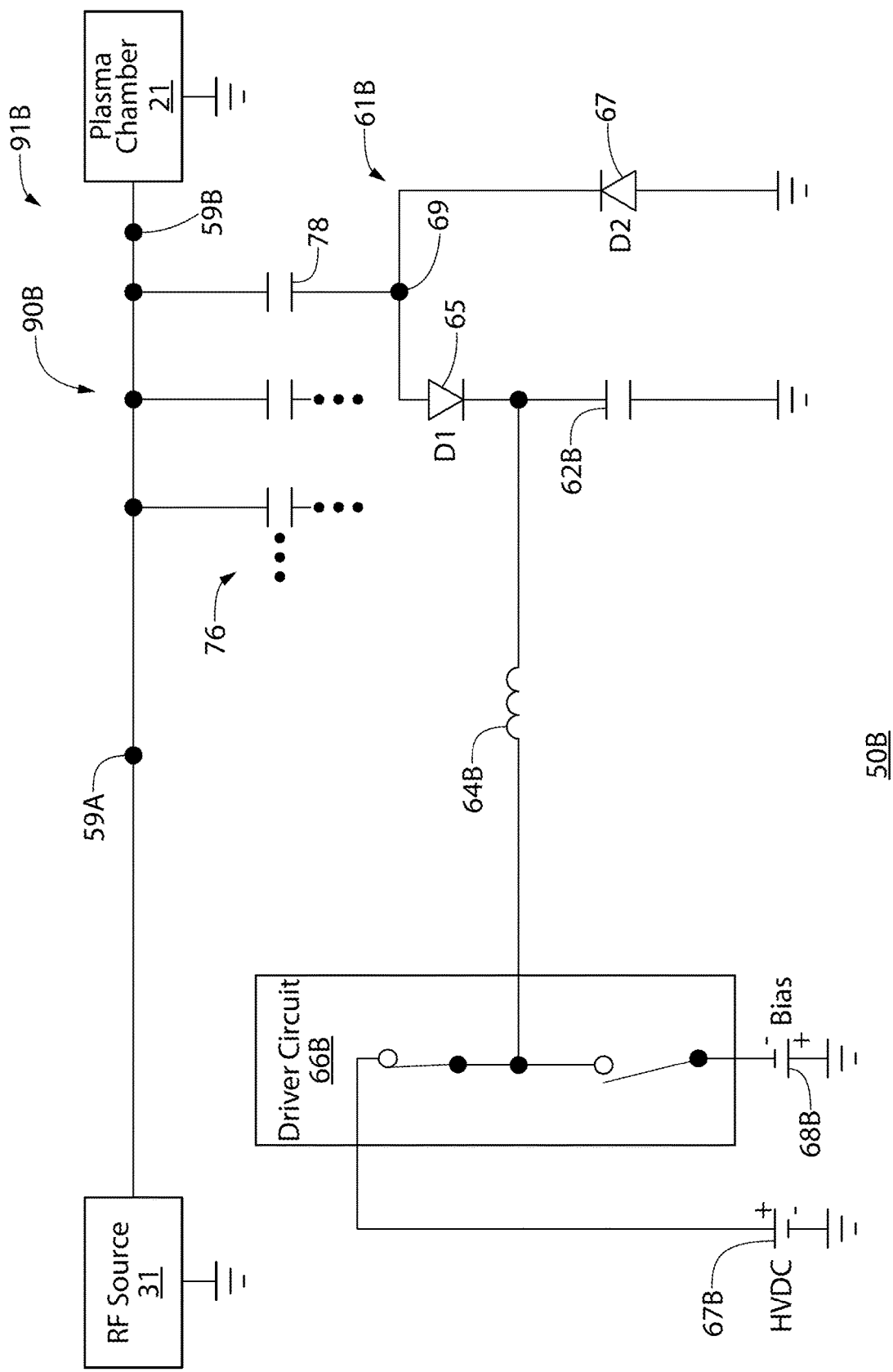
FIG. 20 is a system for manufacturing a semiconductor, the system including a matching network whose EVC utilizes a PIN-diode-based second switching circuit according to an embodiment.

FIG. 20 shows a system 50B for manufacturing a semiconductor similar to FIG. 19, but where the EVC 76 of the matching network 90B utilizes a second switching circuit 61B that has two PIN diodes 65, 67 connected in parallel, rather than a single PIN diode. The second RF switch (diode) is used to filter out the RF from the driver's circuitry, rather than a using a more complicated filter. Similar to FIG. 19, the system 50B includes an RF source 31 and a plasma chamber 21. Further, the matching network 90B includes an RF input 59A coupled to the RF source 31, and an RF output 59B coupled to the plasma chamber 21. The potential variations to the RF source, plasma chamber, and matching network discussed above with respect to the foregoing embodiments may apply also the components of system 50B. Further it is noted that, while matching network 90B includes only one shunt EVC 76, the invention is not so limited, as the matching network may be any type of matching network utilizing one or more EVCs, including a matching network having a series EVC, and/or a second shunt EVC.

In the exemplified embodiment of FIG. 20, the switching circuit 61B is switched OFF by being reverse biased by a high voltage DC supply (HVDC 67B), and switched ON by being forward biased by a current supply (Bias 68B). The invention is not so limited, however, as the switching circuit may be switched ON and OFF by alternative means. When the switching circuit 61B is in the ON condition, current flows from the Bias 68B through the two diodes 65, 67 to ground. This is shown in FIG. 21A, which represents the switching circuit 61B in the ON state. In this state, the diodes 65, 67 are equivalent to low value resistors 65-1, 65-2. This creates a low impedance. Since, from the perspective of the RF source 31, the second diode 67 is parallel to the first diode 65 and filtering capacitor 62B, the total impedance is low. This forces the RF voltage to drop across the discrete capacitor 78 with a relatively high impedance in comparison to the total impedance of the switching circuit 61B.

Figure 21B:
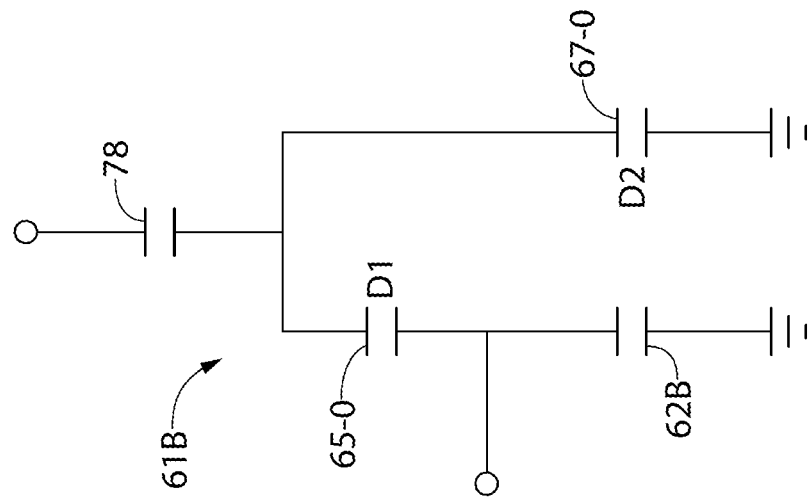
FIGS. 21A and 21B represent the second switching circuit in the ON and OFF states, respectively.
Figure 21A:
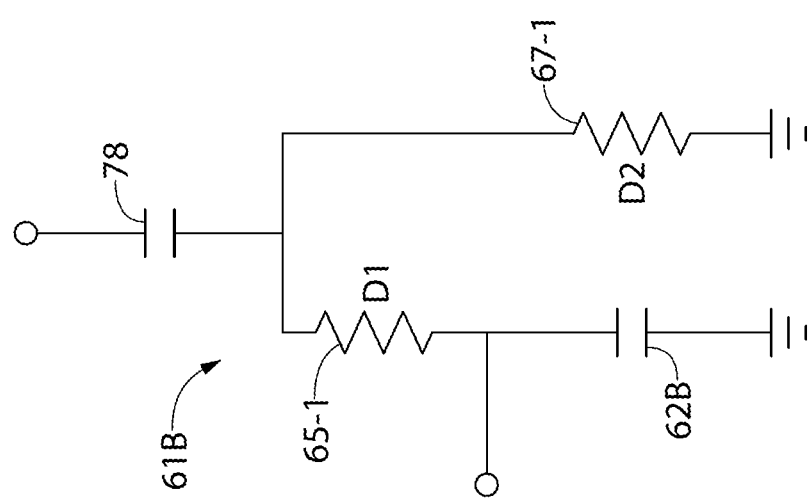

As shown in FIG. 21B, in the OFF condition, the diodes 65, 67 look like low value capacitors 65-0, 67-0. In this state, the HVDC 67B is applied to the diodes 65, 67. There should be an even DC voltage drop across the two diodes 65, 67. So, the node 69 between the diodes 65, 67 should be half the voltage of HVDC 67B. The filtering capacitor 62B creates an RF voltage divider with first diode 65. The voltage going to the driver circuit 66B is proportionate to this divider ratio plus some small drop across the discrete capacitor 78.

It will be noted that the first diode 65 has an anode and a cathode, and the second diode 67 has an anode and a cathode. In the exemplified embodiment, the anode of the first diode 65 is operably coupled to a first terminal of the discrete capacitor 78, the cathode of the second diode 67 is operably coupled to the first terminal of the discrete capacitor 78, and the anode is operably coupled to ground. Further, the cathode of the first diode 65 is coupled to the filtering capacitor 62B, the first diode 65 and the filtering capacitor 62B being parallel to the second diode 67. Further, the cathode of the first diode is coupled to the choke 64B, and the choke 64B is coupled to a driver circuit 66B. The invention, however, is not so limited, as other arrangements or components may be utilized. For example, in an alternative embodiment, the diodes' orientation is switched such that, while still in an opposing orientation, the cathode of the first diode is operably coupled to the first terminal of the discrete capacitor, and the anode of the second diode is operably coupled to the first terminal of the discrete capacitor. Further, while the exemplified embodiments use PIN diodes, the invention is not so limited, as other types of diodes may be utilized. For example, in an alternative embodiment, the second diode 67 is a PIN diode but the first diode is a different type of commonly available diode.

The following provides a comparison of the first switching circuit 61A (FIG. 19) and the second switching circuit 61B (FIG. 20) for a certain use case. The 13 MHz match will continue to be used for this comparison. The worst-case attenuation specification from the filter 62A, 64A of FIG. 19 is 45 dB. In the ON case, the attenuation comes from the second diode 67 creating a low impedance to ground. In the OFF case, the attenuation comes from the voltage divider of the first diode 65 and the filtering capacitor 62B.

For the ON case, each diode 65, 67 has a resistance of 150 mΩ. The discrete capacitor 78 is where the RF voltage will drop. To achieve the required attenuation, the discrete capacitor 78 needs to be 2780 pF or less. This is a very large value, and the match would easily exceed the current rating of the capacitor or diode. Typically, the maximum capacitance used for matching at 13 MHz is around 100 pF. So, this is a nonissue.

For the OFF case, if each diode 65, 67 is assumed to have 2.5 pF of capacitance. To achieve 45 dB of attenuation, the filtering capacitor 62B needs a minimum value of 442 pF. The next standard value would be 470 pF. This gives an attenuation of 45.5 dB.

The power dissipation can now be calculated as before. With this reduced capacitance value, the dissipation goes down to 12.8 W. If the maximum acceptable power dissipation is 93 W, as before, then the switching transition time can be decreased from 50 us to 6.9 us, an 86% reduction. One could go a step further in reducing the capacitance by replacing the filtering capacitor 62B with a series LC resonator. This would create a very low impedance while also reducing the capacitance seen by the driver circuit 66B. Care should be taken, as half of the RF current from the discrete capacitor 78 will now flow through the LC resonator, which can be significant and could produce large voltages across the LC resonator's inductor and capacitor.

The choke 64B (or more advanced filter topology) is not needed, but provides additional isolation to the driver circuit 66B. Since this inductance value will be low, the voltage generated from it is negligible. An additional filtering capacitor may also be placed on the node where the choke meets the driver circuit. This would add to the total capacitance that is seen from the driver, and therefore would increase the dissipation seen from the driver circuit 66B. The other filtering capacitor may be reduced to help reduce this.

The second switching circuit 61B provides many advantages. A major benefit of the second switching circuit 61B is that the RF voltage is significantly dropped before the choke 64B. This means that the choke 64B can be drastically reduced or even eliminated. The high voltage ringing may be eliminated, and therefore the choke 64B may no longer be the limiting factor on switching speed. Further, the filtering capacitor 62B of the second switching circuit 61B may be significantly smaller. Thus, the power dissipated from the switching is reduced, allowing either the switching speed to be increased or the frequency of switching to be increased, or some combination of both. This could also increase the reliability of the driver circuit 66B as the power dissipation is considerably reduced. Using two PIN diodes 65, 67 in parallel per discrete capacitor 78 allows for more current per channel. The current will not be split evenly, unless the filtering capacitor 62B is replaced with an LC resonator, and therefore the maximum current will be doubled.

It is noted that, as a result of using two PIN diodes, the HVDC is dropped across twice as many PIN diodes. To have the same blocking voltage, the HVDC voltage must be doubled. Further, using two PIN diodes will require an adjustment to the Bias. If a dual PIN diode switch was originally used, then there will now be four diodes in series. If there is a 0.5 Volt drop per diode, the total drop would be 2 Volts instead of one. This may require the Bias voltage to be increased, which could require it to have a higher power dissipation, or require multiple bias supplies.

It is further noted that the switching circuits discussed above may be used as part of a method of matching impedance, or a method of manufacturing a semiconductor, where the switching circuits are used to switch in or out discrete capacitors of an EVC to thereby cause an impedance match. Further, a matching network using one or more of the switching circuits discussed above may for part of a semiconductor processing tool (such as tool 91A or 91B), the semiconductor processing tool further comprising a plasma chamber (such as chamber 21).

Frequency Tuning During Impedance Matching Using VVC Adjustment

EVC-based impedance matching networks can utilize frequency tuning, where the matching network has full control of the frequency of the generator. This may offer large cost advantages, but may also have disadvantages. The two major disadvantages are a reduction in efficiency and/or a narrow tuning range, which are inversely related to each other. If the tuning range covers a large area, the efficiency will be reduced, and if the efficiency needs to be high, the tuning range will be limited. These disadvantages are caused by the frequency tuning elements in the match, particularly the inductor of the LC series network. This network creates a large change in impedance as frequency is varied, more than what either component could generate alone.

Figure 22B:
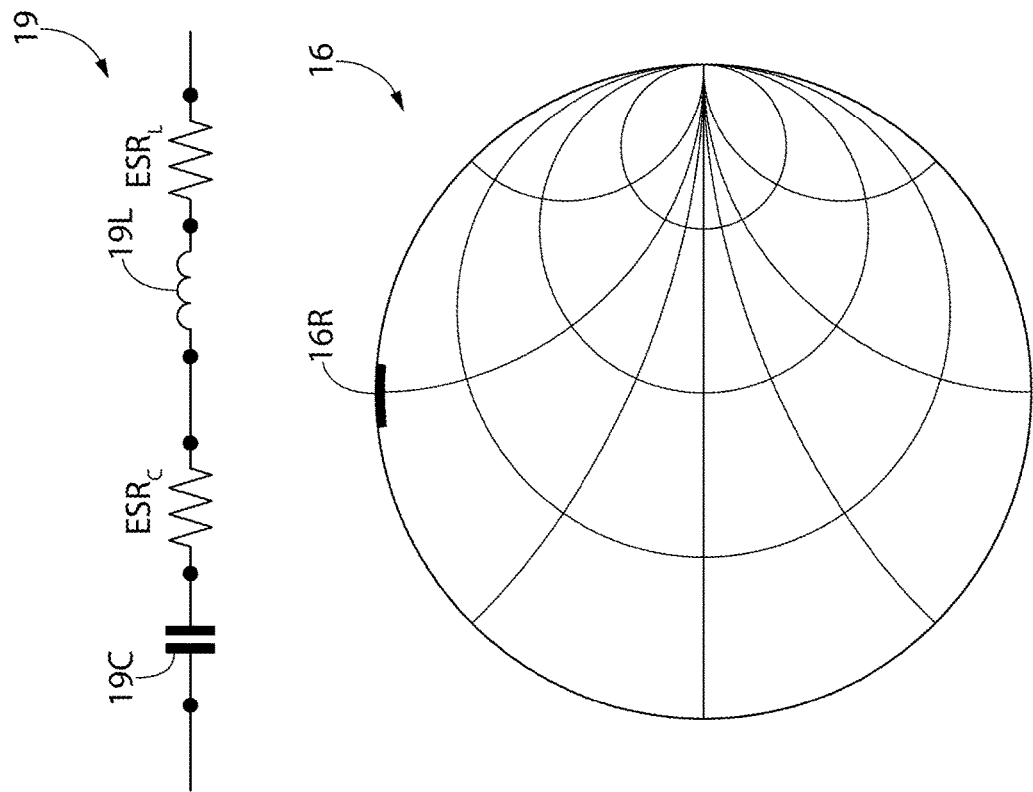
FIGS. 22A-B are frequency tune circuits and corresponding impedance plots.
Figure 22A:
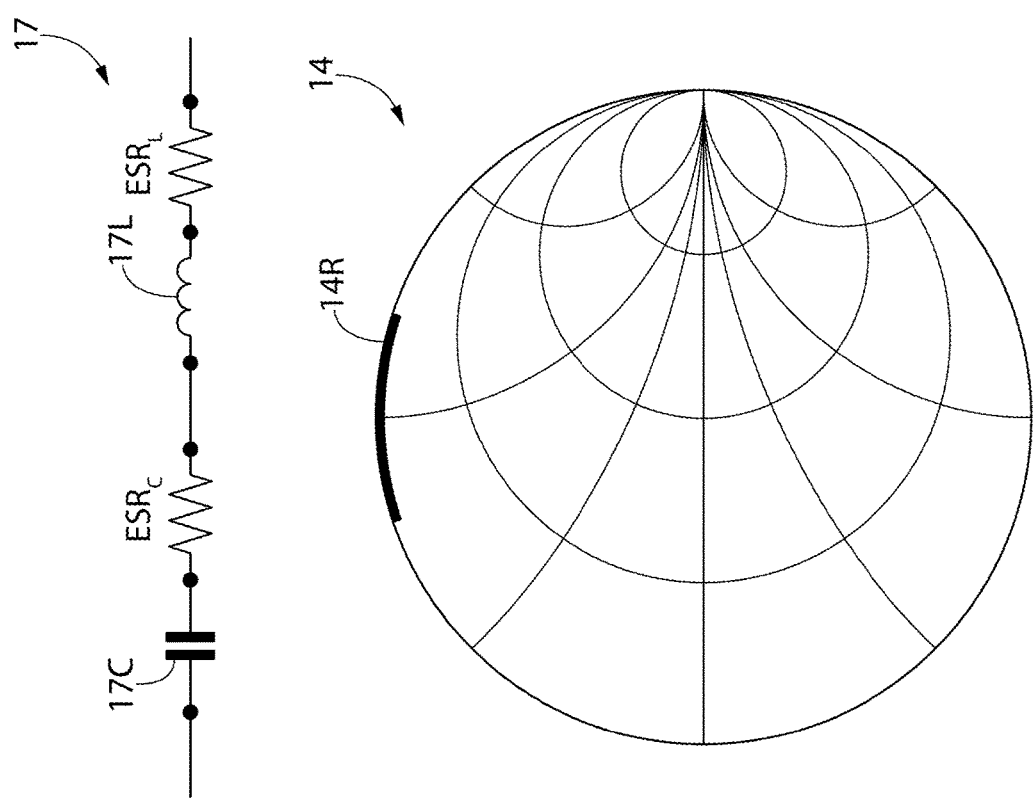

FIGS. 22A-B show two frequency tune circuits 17, 19 and their corresponding impedance plots 14, 16 on a Smith chart. In FIG. 22A, capacitor 17C has a capacitance of 43 pF and inductor 17L has an inductance of 4 uH. In FIG. 22B, capacitor 19C has a capacitance of 350 pF and inductor 19L has an inductance of 1 uH. These two circuits are swept in frequency from 12.88 MHz to 13.5 MHz and centered at about j50Ω. This can be seen in impedance plots 14, 16. As can be seen, the ranges 14R, 16R are very different. Circuit 17 has an impedance range, min to max, of 28.5Ω, while circuit 19 has a range of 5.5Ω.

The efficiency is another story. As an example, if a load of 0.5-j50 were placed at the output of the circuit, and other ideal components were added to the matching network, when tuned, the efficiency of circuit 17 would be 60.8%, while the efficiency of circuit 19 would be 87.0%. This means that circuit 19 would deliver 43% more power than circuit 17. A similar drop in efficiency would occur if the frequency tuning elements were in shunt. The difference in efficiency is caused by the difference in ESR (equivalent series resistance). At j50Ω, circuit 17 has an $ESR_C$ of 2 mΩ for capacitor 17C, and an $ESR_L$ of 320 mΩ for inductor 17L, for a total resistance of 322 mΩ. By contrast, circuit 19 has an $ESR_C$ of 2 mΩ for capacitor 19C, and an $ESR_L$ of 73 mΩ for inductor 19L, for a total resistance of only 75 mΩ. Even though the quality factor of both inductors is well over 1000, when the series capacitor is added, the apparent inductance is reduced. Both apparent inductances are equal, but circuit 17 has about 3.3× more ESR. The minimum loss would occur when the capacitor is completely removed from the circuit, but this would give the smallest possible tuning range.

It is known that one way to increase the range of a matching network without significantly affecting the efficiency is to utilize a variable capacitor. The following embodiment will use a vacuum variable capacitor (VVC). In other embodiments, the VVC can be replaced with another mechanically variable capacitor (MVC). An MVC is any capacitor that varies its capacitance by physically moving the location of its components (e.g., varying the distance between the plates, or the amount of plate surface area that overlaps). An MVC may be contrast with an electronically variable capacitor, such as those discussed herein that vary capacitance by switching in or out discrete capacitors.

Figure 23A:
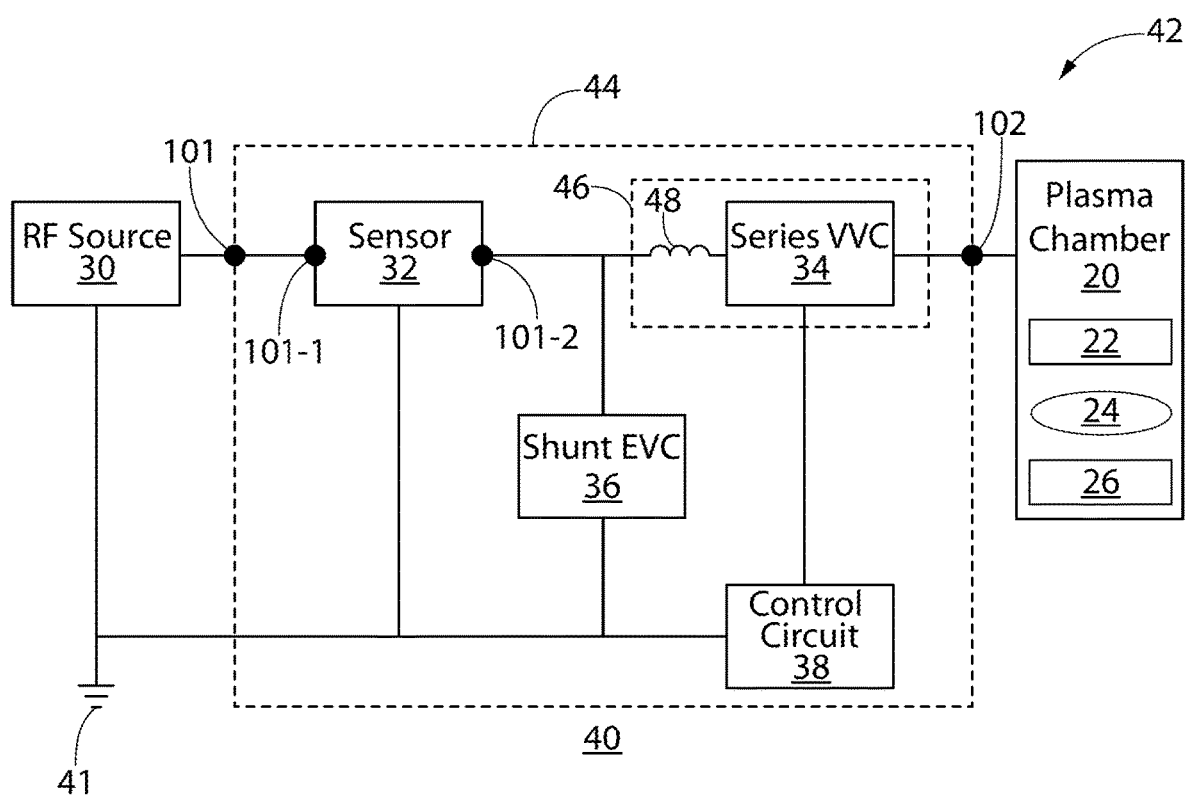
FIG. 23A is a semiconductor manufacturing system utilizing an impedance matching circuit having a frequency tune circuit according to a first embodiment.

FIG. 23A is a semiconductor manufacturing system 40 utilizing an impedance matching circuit 44 having a frequency tune circuit 46 according to a first embodiment, the frequency tune circuit 46 utilizing a series VVC 34 along with a series inductor 48. VVCs are motor driven and therefore are slow tuning versus the response with varying frequency. In the field, the capacitor may be set to a certain predefined value for each process. This requires that the frequency tuning range is only as wide as the process that covers the largest area.

Semiconductor Processing System and Matching Network

As is shown, the semiconductor device manufacturing system 40 utilizes an RF generator 30 (sometimes referred to as an RF source). The system 40 includes the RF generator 30 and a semiconductor processing tool 42. The semiconductor processing tool 42 includes a matching network 44 and a plasma chamber 20. In other embodiments, the generator 30 or other power source can form part of the semiconductor processing tool.

The semiconductor device can be a microprocessor, a memory chip, or other type of integrated circuit or device. A substrate 24 can be placed in the plasma chamber 20, where the plasma chamber 20 is configured to deposit a material layer onto the substrate 24 or etch a material layer from the substrate 24. Plasma processing involves energizing a gas mixture by imparting energy to the gas molecules by introducing RF energy into the gas mixture. This gas mixture is typically contained in a vacuum chamber (the plasma chamber 20), and the RF energy is typically introduced into the plasma chamber 20 through electrodes 22, 26. In processes that are well known in the art, the first and second electrodes 22, 26, in conjunction with appropriate control systems (not shown) and the plasma in the plasma chamber, enable one or both of deposition of materials onto a substrate 24 and etching of materials from the substrate 24.

In a typical plasma process, the RF generator 30 generates power at a radio frequency (RF)—which is typically within the range of 3 kHz and 300 GHz—and this power is transmitted through RF cables and networks to the plasma chamber 20. In order to provide efficient transfer of power from the RF generator 30 to the plasma chamber 20, an intermediary circuit is used to match the fixed impedance of the RF generator 30 with the variable impedance of the plasma chamber 20. Such an intermediary circuit is commonly referred to as an RF impedance matching network, or more simply as an RF matching network. The purpose of the RF matching network 44 is to transform the variable plasma impedance to a value that more closely matches the fixed impedance of the RF generator 30. Commonly owned U.S. patent application Ser. No. 14/669,568, the disclosure of which is incorporated herein by reference in its entirety, provides an example of such a matching network.

As shown in FIG. 23A, the matching network 44 has an RF input 101 connected to the RF source 30 and an RF output 102 connected to the plasma chamber 20. An RF input sensor 32 can be connected between the RF impedance matching network 44 and the RF source 30, the sensor 32 and RF source (among other components) being coupled to a common ground 41. It is noted that the sensor 32 has an input 101-1 and an output 101-2. Note that alternatively (or in addition), an RF output sensor can be connected between the RF impedance matching network 44 and the plasma chamber 20 so that the RF output from the impedance matching network, and the plasma impedance presented by the plasma chamber 20, may be monitored.

As discussed above, the RF impedance matching network 44 serves to help maximize the amount of RF power transferred from the RF source 30 to the plasma chamber 20 by matching the impedance at the RF input 101 to the fixed impedance of the RF source 30. The matching network 44 can consist of a single module within a single housing designed for electrical connection to the RF source 30 and plasma chamber 20. In other embodiments, the components of the matching network 44 can be located in different housings, some components can be outside of the housing, and/or some components can share a housing with a component outside the matching network.

As is known in the art, the plasma within a plasma chamber 20 typically undergoes certain fluctuations outside of operational control so that the impedance presented by the plasma chamber 20 is a variable impedance. Since the variable impedance of the plasma chamber 20 cannot be fully controlled, and an impedance matching network may be used to create an impedance match between the plasma chamber 20 and the RF source 30. Moreover, the impedance of the RF source 30 may be fixed at a set value by the design of the particular RF source 30. Although the fixed impedance of an RF source 30 may undergo minor fluctuations during use, due to, for example, temperature or other environmental variations, the impedance of the RF source 30 is still considered a fixed impedance for purposes of impedance matching because the fluctuations do not significantly vary the fixed impedance from the originally set impedance value. Other types of RF sources 30 may be designed so that the impedance of the RF source 30 may be set at the time of, or during, use. The impedance of such types of RF sources 30 is still considered fixed because it may be controlled by a user (or at least controlled by a programmable controller) and the set value of the impedance may be known at any time during operation, thus making the set value effectively a fixed impedance.

The RF source 30 may be an RF generator of a type that is well-known in the art, and generates an RF signal at an appropriate frequency and power for the process performed within the plasma chamber 20. The RF source 30 may be electrically connected to the RF input 101 of the RF impedance matching network 44 using a coaxial cable, which for impedance matching purposes would have the same fixed impedance as the RF source 30.

In the exemplified embodiment, the RF impedance matching network 44 includes a series VVC 34, a shunt EVC 36, and a series inductor 48 to form an 'L' type matching network. The shunt variable capacitor 36 is shown shunting to a reference potential, in this case ground, between the series VVC 34 and the series inductor 48, and one of skill in the art will recognize that the RF impedance matching network 44 may be configured with the shunt EVC 36 shunting to a reference potential at the RF input 101 or at the RF output 102. It is further noted that while the shunt variable capacitor 36 is an EVC in this embodiment, in other embodiments it may be another type of capacitor capable of varying its capacitance.

While the exemplified matching network 44 is in an L configuration, the matching network may be configured in other matching network configurations, such as a 'T' type configuration or a 'I' or 'pi' type configuration. In certain embodiments, the variable capacitors and the switching circuit described below may be included in any configuration appropriate for an RF impedance matching network.

Each of the variable capacitors 34, 36 (as well as RF source 30) are connected to a control circuit 38, which is configured with an appropriate processor and/or signal generating circuitry to provide a signal for controlling the capacitors 34, 36. One or more power supplies (not shown) may be connected to components of the matching network 44 to provide operational power. It is understood that one or more of the variable capacitors may be operable coupled to choke, filter, and/or driver circuits for carrying out the functions described herein.

In the exemplified embodiment, the control circuit 38 includes a processor. The processor may be any type of properly programmed processing device, such as a computer or microprocessor, configured for executing computer program instructions (e.g., code). The processor may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

The control circuit 38 is the brains of the matching network 44, as it receives multiple inputs, from sources such as the RF input sensor 32 and the variable capacitors 34, 36, and the RF source 30, and delivers commands to the variable capacitors 34, 36 (and RF source in the case of frequency tuning) to create the impedance match. The control circuit 38 is of the type of control circuit that is commonly used in semiconductor fabrication processes, and therefore known to those of skill in the art. Any differences in the control circuit 38, as compared to control circuits of the prior art, arise in programming differences, which, along with the matching network components and architecture, enable increased speed and reliability.

Impedance Plots for Different VVC Configurations

Figure 23B:
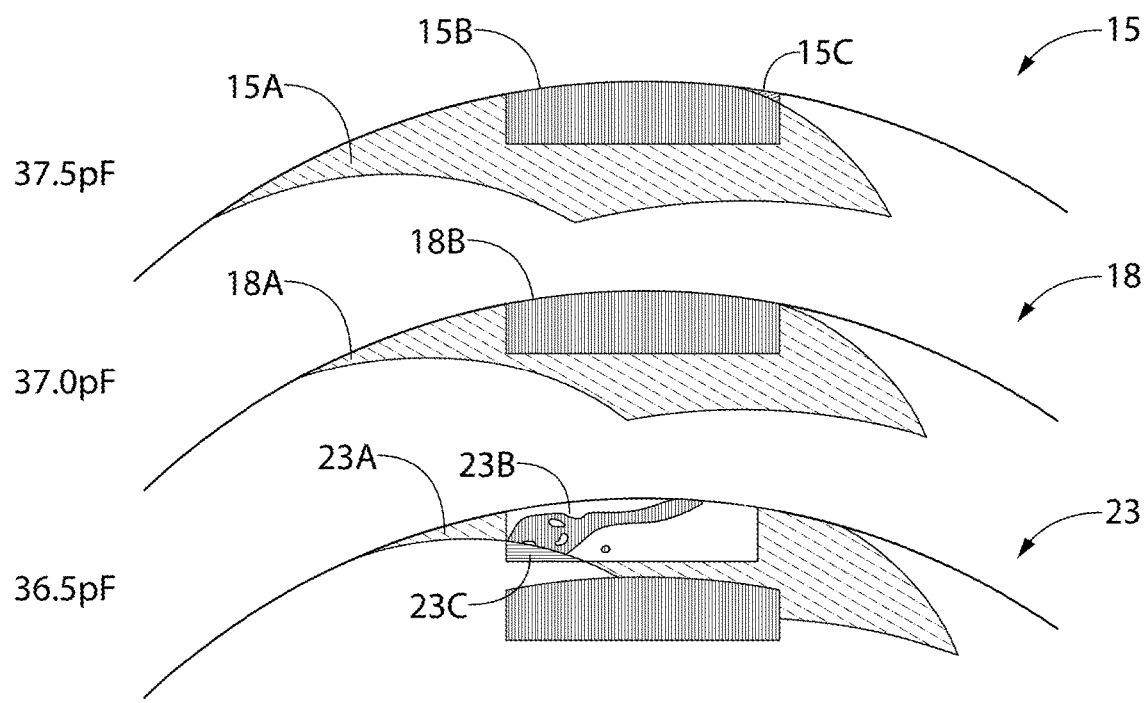
FIG. 23B shows impedance plots for the frequency tune circuit of FIG. 23A at different VVC capacitances.

FIG. 23B shows example impedance plots 15, 18, 23 on a Smith chart for the frequency tune circuit of FIG. 23A at different VVC capacitances. As shown in impedance plot 18, with the VVC set to 37.0 pF, the load impedance values to which the matching network can match (matchable load impedance values 18A) include the actual load impedance values of the plasma chamber (load impedance values 18B). Thus, the matching network covers the full range with the VVC set to 37.0 pF. Varying by just ±0.5 pF, however, puts either edge of the process out of range. That is, for impedance plot 15, with the VVC set at 37.5 pF, the load impedance values to which the matching network can match (matchable load impedance values 15A) do not cover all the actual load impedance values of the plasma chamber (load impedance values 15B). Specifically, the matching network does not cover load impedance values 15C. Further, for impedance plot 23, with the VVC set at 36.5 pF, the load impedance values to which the matching network can match (matchable load impedance values 23A) do not cover all the actual load impedance values of the plasma chamber (load impedance values 23B). Specifically, the matching network does not cover load impedance values 23C. If multiple units were to be constructed and mounted to multiple chambers, the impedance maps would show that there is variation from each system. There could also be slight variations from run to run or between cleanings.

To compensate for these minor variations, since the matching network lacks future knowledge of the process to know where the VVC needs to be set, the exemplified control unit 38 is programmed to set the VVC to some predetermined position, and then change the VVC's capacitance to achieve a matched condition. It might also be necessary to have a narrow tuning range to have the efficiency increased. In this case, some variation would need to take place to match. In either case, the matching network needs to know how to accomplish this.

Process Variation Adjustment

According to a first method, the matching network takes fixed steps towards a VVC capacitance sufficient to cause the RF source frequency to be within a desired range. In one embodiment, according to a first process, tuning tables of a typical variable frequency EVC match are created, where an S-Map (an S-parameter map) is taken (other parameter matrices may alternatively be utilized). Each shunt capacitor position is swept with frequency. These datapoints are then used to generate tables where the unit can calculate the load impedance and then look up the best matching position for that impedance according to the first process. If the table finds that the calculated frequency is at the minimum or the maximum frequency for the RF source, the control unit will, according to a second process, reduce or increase the VVC capacitance until the input of the matching network is matched within the frequency range. The step size for the VVC can be as large or small as desired by the user. Since the best match frequency is at or outside of the edge of the S-Map, the units will always know which direction to adjust the VVC.

In this embodiment, while the VVC is being adjusted, the generator's frequency will be changed accordingly to either the minimum or maximum frequency, pursuant to the first process, to reduce the amount of reflected power, until the control unit determines that the best match frequency is within its frequency tuning range. Small steps would allow the VVC to adjust, and not overstep the needed change in capacitance. If a larger step is used, it is possible that the VVC would need to be readjusted if the process requires the control unit to go near or beyond the opposite extreme during a later step in the process. It would not be a problem to match once the load impedance is in range. The RF source would be able to continuously shift frequency while the VVC is still adjusting, once the load impedance is within the frequency tuning range. A larger step may allow the VVC to only be adjusted once, allowing the best match to be achieved faster, because the VVC is not adjusted multiple times. This balancing act would need to be optimized on the tool and could be different depending on the process.

According to another method, the matching network takes fixed step and knows that the load is outside of the tuning range. For example, S-parameters may be taken with two additional points, one below the minimum operating frequency, and one above the maximum operating frequency, for each shunt capacitor position. When the control unit determines the best matching frequency is one of these outside frequencies, it will know to change the capacitance, instead of automatically changing when it might not be necessary. These outside points could be spaced such that when they are found to be the best match, the generator will see some minimum VSWR. This would reduce the tendency for capacitor adjustments. This would have to be already calculated in the table.

According to another method, the steps are a ratio of the frequency outside of the desire range. One of the drawbacks of the previous two methods to compensate for when the matching network is unable to achieve a perfect match is that it may take more than one step to put the matching network in the proper range. It may take several steps depending on what the step size is and how much compensation is needed. This could cause a significant delay in matching.

An improvement to these methods would be to measure additional S-parameters outside the frequency range of the matching network and take a guess as to how much the control unit needs to adjust the capacitor. This would allow the unit to know about how much to adjust the capacitor. A simple ratio could be used, such as 0.1 pF/1 MHz, for example. More complicated equations could be used based on what is found to work with the matching network. Based on what the user finds, a curve could be fit to optimize the tuning speed. This could be a more general equation that would work well for a whole product line, or it could be calibrated with each unit.

Fully Calculated Compensation

According to another method, an equation is used to determine step size. Specifically, the range is adjusted to calculate exactly the change in capacitance needed. This is more complicated. It requires the unit to know its VVC's capacitance at all possible setpoints and the inductance. The unit would then know, based on what the calculated best match frequency is outside of the tuning range, what the new capacitance should be to achieve a perfect match. If the capacitance is known, the inductance can be calculated by finding the resonant frequency, where the inductor and capacitor cancel out each other's impedances, leaving only the resistive part. This can be found in Equation 1 (Inductance Calculation), where L is the inductance, C is the capacitance, and f is the resonant frequency.

$$L = \frac{1}{(2\pi f)^2 C} \qquad \text{(Equation 1)}$$

Multiple capacitance values can be used to vary the resonant frequency. These different calculated inductance values can then be averaged together to improve the accuracy.

Next, the relationship between the calculated frequency outside the range and the new capacitance may be found. Equation 2 (Impedance Calculation) shows how to calculate the impedance of the circuit, X. It is assumed that the resistances are negligible, and do not have a large effect on the calculation.

$$X = X_L + X_C = 2\pi F L - \frac{1}{2\pi F C} \qquad \text{(Equation 2)}$$

The new impedance (X') can be calculated by substituting the next frequency step (F') that is outside of the range and the present capacitance value C. This would be equivalent to adjusting the capacitor to some new value (C') when the frequency (F'') is set to either the minimum or maximum, whichever is closest, to generate the same impedance. This can be found in Equation 3 (Impedance Equivalence).

$$X' = 2\pi F'L - \frac{1}{2\pi F'C} = 2\pi F''L - \frac{1}{2\pi F''C'} \qquad \text{(Equation 3)}$$

C' can then be solved. This is shown in Equation 4 (New Capacitance). Note that another frequency within the tuning range may be used to add some buffer, which may prevent the match from needing to retune the capacitor. An example would be the maximum frequency minus one percent of the tuning range, or the minimum plus one percent.

$$C' = \left[4\pi^2 F''L(F'' - F') + \frac{F''}{F'C}\right]^{-1} \qquad \text{(Equation 4)}$$

Another example of what the calculated method could be used for is centering the frequency range. While a process is running, it may be desirable to adjust the frequency to its midpoint, giving the maximum margin for frequency tuning. Some examples may be used to maximize the matching speed when there is some variability in the process, between process steps, when changes are unknown, or if certain process steps cause transients. The calculation for this is like before, as seen in Equation 5 (Impedance Equivalence) and Equation 6 (New Capacitance) below. Here, F and C are the present frequency and capacitance and $F_{mid}$ and C' are the center frequency and the new capacitance value. While the VVC is changing its position, the control unit can adjust the frequency as needed to allow for minimum reflected power throughout the transition $$X = 2\pi FL - \frac{1}{2\pi FC} = 2\pi F_{mid} L - \frac{1}{2\pi F_{mid} C'} \qquad \text{(Equation 5)}$$

$$C' = \left[ 4\pi^2 F' L (F_{mid} - F) + \frac{F_{mid}}{FC} \right]^{-1} \qquad \text{(Equation 6)}$$

The foregoing calculated method could also be used to implement a matching window. While the process is running, frequency would have a keep out area, for example less than 25% and greater than 75% of the frequency tuning range. This could also be hysteretic where the tuning will adjust the VVC to some position to have the frequency closer to the center. For example, if the frequency hits its lower or upper 25%, the VVC will be adjusted so that the calculated frequency is tuned to 30% or 70%.

Calculating the Load Impedance

It may be desired, for various reasons, to calculate the load impedance. There are a few different ways to accomplish this, which includes different setups and desired accuracies. Referring back to FIG. 23A, the S-Map may be taken from the input 101 to the node between the series inductor 48 and the series VVC 34, for the first case, or, for the second case, the input 101 to the output 102 with some predetermined series VVC 34 setpoint.

For the first case, the series VVC 34 capacitance is known. After the load impedance is calculated, which includes series VVC 34, the capacitor's impedance can be simply subtracted from the load. The only information needed is the capacitance of series VVC 34, and the known frequency. This isn't the most accurate method, as it does not include parasitics and other elements that may be in the circuit between series inductor 48 and the output 102.

The next method, which is more accurate, is to take S-parameters between the node between series VVC 34 and series inductor 48, and the output 102. These parameters can be used to de-embed series VVC 34 from the load 20. This would require more complex calculations than the previous method. It also requires a table and additional memory of series VVC 34 position versus frequency, for all the desired capacitances and frequencies.

The second case is more difficult to conceptualize. The S-Map Data is collected with series VVC 34, and the change in series VVC 34 will appear to be a change in the load impedance. This change will not impact the auto matching, but it will create an erroneous load impedance calculation.

The first method will use the change in capacitance of series VVC 34 to determine the actual load impedance. To do this, the series VVC 34 capacitance must be known when the S-Map data is collected. This will be used as a fixed capacitance. Changes to series VVC 34 are equivalent to having a variable capacitor (CP) in parallel with series VVC 34. Equivalently, a variable capacitor (CS) can be placed in series with series VVC 34.

The above relationship between is expressed in Equation 7 (Parallel to Series Capacitors Equivalence) below. Solving for CS can be found in Equation 8 (Calculate for CS). The impedance of CS can now be calculated and subtracted from the load impedance.

$$C + CP = \left( \frac{1}{C} + \frac{1}{CS} \right)^{-1} \qquad \text{(Equation 7)}$$

$$CS = -\frac{C(C + CP)}{CP} \qquad \text{(Equation 8)}$$

S-parameter can be used to give a more accurate load calculation using the second case. To do this, series VVC 34 must be known when the S-Map data is collected. Next, S-parameters of series VVC 34 need to be taken, from the node between series VVC 34 and series inductor 48, and the output 102. During run time, these parameters will be used to de-embed the original series VVC 34 setting, which was the setting during S-Map, from the output S-Map data for the current match settings, and embed the current series VVC 34 setting. The match would then calculate the actual load impedance.

Another circuit that would work well with the previous methods would be a parallel inductor and capacitor. The S-Map data could be taken in the same ways, and the adjustments be could preformed in any of the previously mentioned tuning methods. The only changes would be the equations in the fully calculated compensation.

For the fully calculated version of the parallel circuit, Equation 1 (Inductance Calculation) could be used. Equation 10 (Parallel Impedance Calculation) below shows how the impedance is calculated for a parallel LC network. The equivalence of changing the frequency versus changing capacitance is found Equation 11 (Parallel Impedance Equivalence), where the variables are similar to Equation 3 (Impedance Equivalence). Finally, the new capacitance is found in Equation 12 (New Parallel Capacitance).

$$X = X_L \| X_C = \left( \frac{1}{X_L} + \frac{1}{X_C} \right)^{-1} = \left( \frac{1}{2\pi FL} - 2\pi FC \right)^{-1} \qquad \text{(Equation 10)}$$

$$\left( \frac{1}{2\pi F'L} - 2\pi F'C \right)^{-1} = \left( \frac{1}{2\pi F''L} - 2\pi F''C' \right)^{-1} \qquad \text{(Equation 11)}$$

$$C' = \frac{F' - F''}{4\pi^2 F''^2 F'L} + \frac{F'C}{F''} \qquad \text{(Equation 12)}$$

Figure 24A:
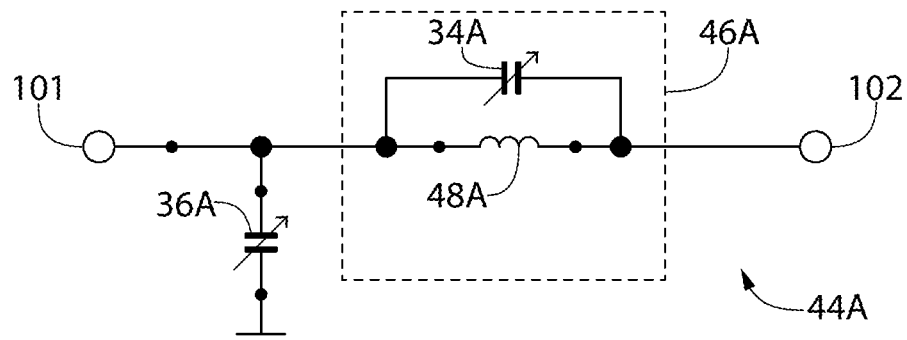
FIGS. 24A-24D are alternative impedance matching networks utilizing various frequency tune circuits.
Figure 24B:
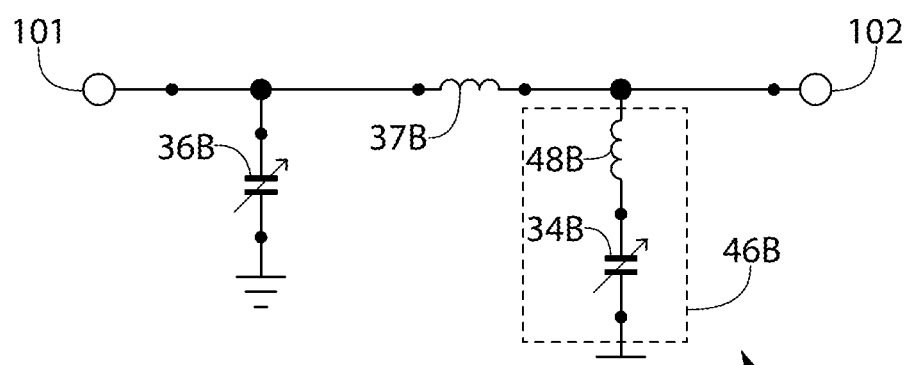
Figure 24C:
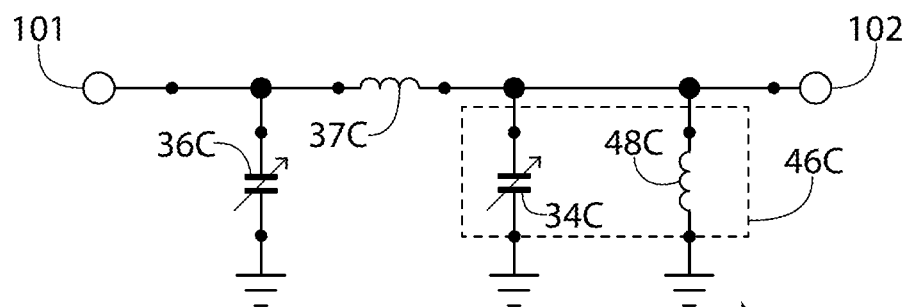
Figure 24D:
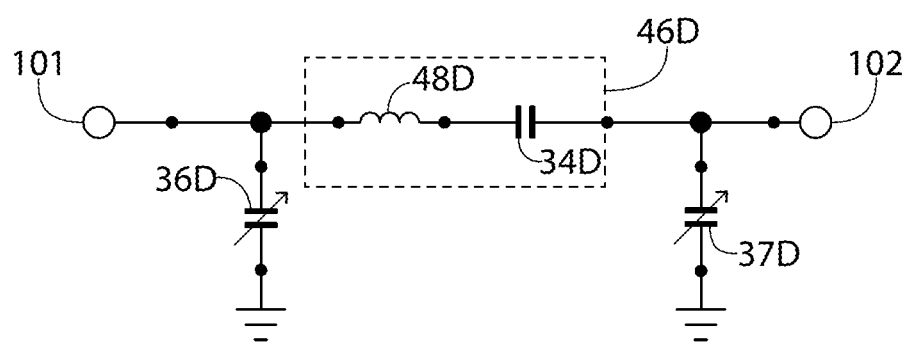

There are many other matching network circuits that could be designed to utilize the methods discussed above. FIGS. 24A-24D are alternative impedance matching networks 44A, 44B, 44C, 44D utilizing various frequency tune circuits 46A, 46B, 46C, 46D. Each matching network includes a shunt variable capacitor 36A, 36B, 36C, 36D. FIG. 24A's frequency tune circuit 46A comprises a series inductor 48A having a variable capacitor 34A coupled in parallel. FIG. 24B includes a series inductor 37B, as well as an inductor 48B and a variable capacitor 34B coupled in series in a second shunt of the matching network 44B. FIG. 24C includes a series inductor 37B, as well as a frequency tune circuit 46C comprising a variable capacitor 34C in a second shunt and an inductor 48C in a third shunt. FIG. 24D has a variable capacitor 37D in its second shunt, as well as frequency tune circuit 46D comprising an inductor 48D and a capacitor 34D coupled in series. In another embodiment, similar to FIG. 24D, capacitor 34D could be a variable capacitor and variable capacitor 37D could be a fixed capacitor. It should be noted that the inputs and outputs 101, 102 could be swapped, which would give a different tuning response.

Figure 25:
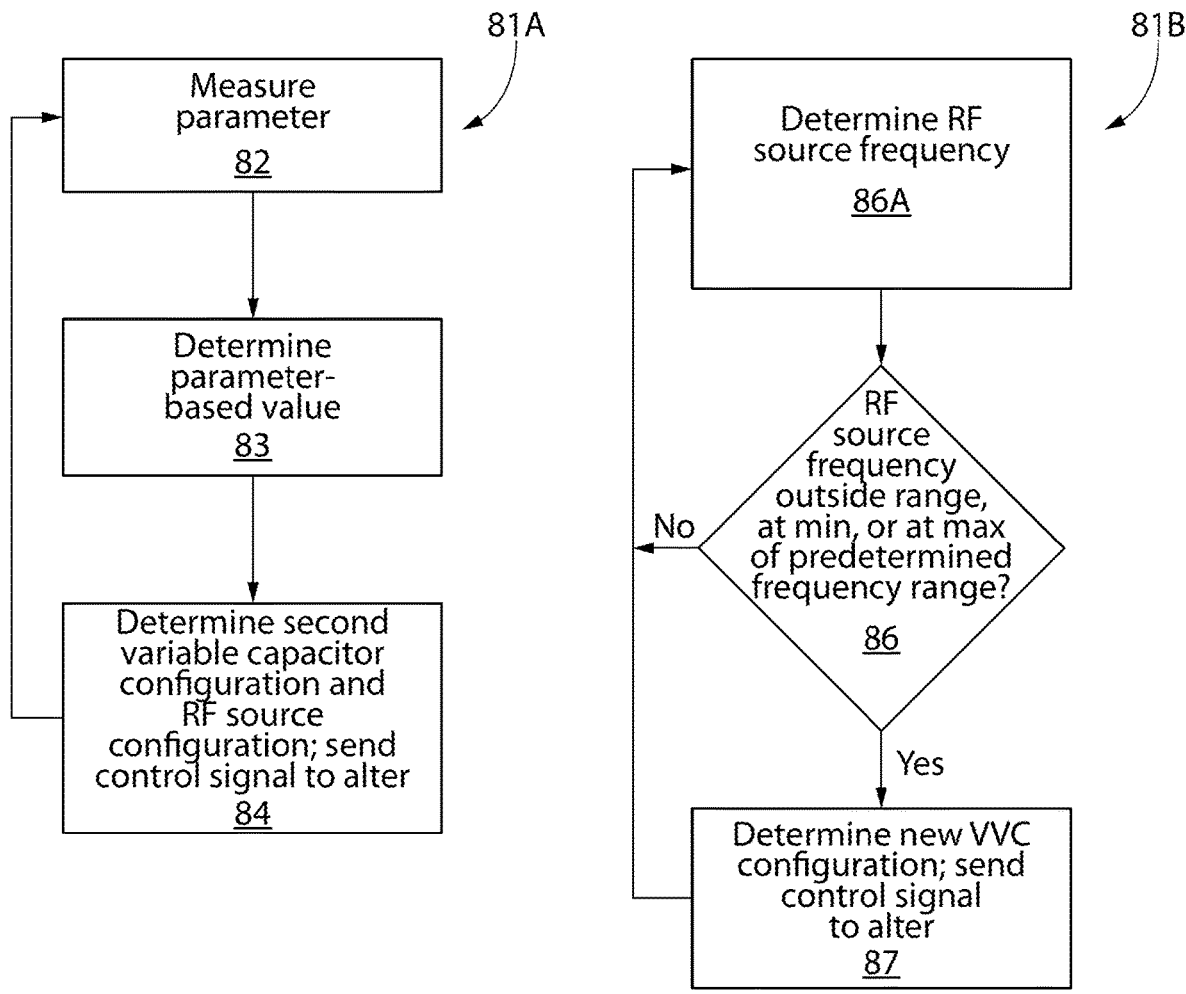
FIG. 25 is a flowchart for a method of matching an impedance while keeping a frequency within a predetermined range according to one embodiment.

FIG. 25 is a flowchart for a method 81 of matching an impedance while keeping a frequency within a predetermined range according to one embodiment. The matching network for this embodiment includes, similar to FIG. 23A, an RF input configured to operably couple to an RF source, an RF output configured to operably couple to a plasma chamber, a mechanically variable capacitor (which may be a VVC, though is not so limited), an inductor coupled in series or parallel to the MVC, a second variable capacitor (which may be an EVC, though is not so limited), a sensor configured to measure a parameter related to the plasma chamber, and a control circuit operably coupled to the MVC, the second variable capacitor, and the sensor.

The method 81 includes a first process 81A and a second process 81B. According to the first process 81A, a sensor configured measures a parameter related to the plasma chamber (operation 82). The parameter may be, for example, a voltage, a current, and/or a phase at the RF input of the matching network, or a forward and/or reflected power at the RF input of the matching network. The invention, however, is not so limited, as the parameter may be any parameter related to the plasma chamber.

Next, the control circuit determines a parameter-based value based on the measured parameter (operation 83). In one embodiment, the parameter-based value is a load impedance value, the measured parameter value is used to determine an input impedance value, and the input impedance value is used to determine the load impedance value. Further, the load impedance value may be determined by entering an impedance value for the input of the matching network into a first parameter matrix, such as an S-Map. The invention, however, is not so limited, as the parameter-based value may be any value based on the measured parameter (including the measured parameter itself), and a parameter matrix need not be utilized. It is understood that, while S-parameters and S-Maps are discussed in certain embodiments herein, such may be replaced with other types of parameter matrices. It is further noted that any of the parameter matrices discussed herein may form part of a parameter look-up table.

Next, the control circuit, using the parameter-based value (e.g., load impedance), determines a second variable capacitor configuration and an RF source frequency for reducing a reflected power, and then sends a signal to alter the second variable capacitor to the second variable capacitor configuration and the RF source to the RF source frequency (operation 84). In one embodiment, the second variable capacitor configuration and the RF source frequency for reducing the reflected power are determined by inputting the parameter-based value into a second parameter matrix, though the invention is not so limited.

As for the second process 81B, first, the RF source frequency is determined (operation 86A). Next, there is a determination whether the alteration of the RF source frequency has caused the RF source frequency to be outside, at a minimum, or at a maximum of a predetermined frequency range (operation 86). If so, the control circuit determines a new MVC configuration to cause the RF source frequency, according to the first process 81A, to be altered to be within or closer to the predetermined frequency range, and sends a signal to alter the MVC to the new MVC configuration (operation 87). The determination of the new MVC configuration is based on the RF source frequency and the predetermined frequency range. The determination of the new MVC configuration may also be based on the second variable capacitor configuration. In one embodiment, the new MVC configuration is determined using a parameter matrix with a look-up table, though the invention is not so limited.

In certain embodiments, the predetermined frequency range comprises a plurality of frequency values, the alteration of the RF source frequency has caused the RF source frequency to be at the minimum or at the maximum of the plurality of frequency values, and the new MVC configuration causes the RF source frequency, according to the first process, to be altered to be within the predetermined frequency range such that the RF source frequency is no longer at the minimum or at the maximum of the plurality of frequency values. In other embodiments, the predetermined frequency range is a single frequency value (e.g., 13.56 MHz), the alteration of the RF source frequency has caused the RF source frequency to not be at the single frequency value, and the new MVC configuration causes the RF source frequency, according to the first process, to be at or closer to the single frequency value.

As shown in FIG. 25, the control circuit may be further configured to repeat the first process and the second process. Thus, the control circuit may repeat the alteration of the second variable capacitor to the second variable capacitor configuration, and the RF source to the RF source frequency to reduce reflected power. Further, in parallel, the control circuit may repeat the alteration of MVC to the new MVC configuration upon the determination that the alteration of the RF source frequency according to the first process has caused the RF source frequency to be outside, at a minimum, or at a maximum of a predetermined frequency range.

As shown above, there are multiple ways to adjust the tuning range of a matching network utilizing and a variable capacitor (such as an EVC), frequency tuning, and an MVC (such as a VVC), which may further include use of a parameter matrix (such as an S-Map). The matching network can quickly calculate the need for a change and then adjust of the tuning range with the VVC if necessary. This achieves very fast tuning with a minimal frequency tuning range to reduce inefficiencies.

In certain embodiments, the matching networks discussed above may form part of a semiconductor processing tool (such as tool 42) that comprises a matching network and a plasma chamber. Further, the methods of impedance matching discussed above may form part of a method of manufacturing a semiconductor.

S-Map with Frequency-Sensitive Variable Capacitor

As discussed above with regard to frequency tuning during impedance matching using VVC adjustment, matching networks that have control of the frequency of the RF source can provide several advantages, including cost advantages. But there are potential disadvantages, such as a reduction in efficiency and/or a narrow tuning range, which are discussed above with respect to FIGS. 22A and 22B. One way to increase the range of the matching network without significantly affecting the efficiency is to utilize a variable capacitor, such as the series VVC 34 discussed above with respect to FIG. 23A. In other embodiments, this capacitor can be any type of variable capacitor. For example, the series VVC 34 may be replaced with an EVC.

Adding a variable capacitor requires that the tuning range is only as wide as the process that covers the largest area, as shown in plot 18 of FIG. 23B. In plot 18, the load impedance values to which the matching network can match (matchable load impedance values 18A) cover the range of potential load impedance values of the chamber (load impedance values 18B) with some margin, while having some sacrifice in efficiency. The capacitor's capacitance may be varied prior to running each variable process. Referring to both FIG. 23A and FIG. 23B, the frequency of RF source 30 and the capacitance of series variable capacitor 34 move the matched load impedance value clockwise or counterclockwise within range 18A, while the capacitance of the shunt variable capacitor 36 moves the matched load impedance value in and out from the center of the Smith chart.

Another way to further increase the efficiency without sacrificing tuning range or increasing cost is to measure the S-Map with quantized values of the variable capacitor, adding an extra dimension to the S-Map. As used herein, the term "quantized" refers to using multiple discrete values for the variable capacitor in question. Using quantized or discrete values adds an additional dimension to the S-Map because, instead of ignoring the fact that the variable capacitor can change and measuring S-parameters only for one value of the variable capacitor, the system can measure multiple S-Maps, each for a different value of the variable capacitor. According to this approach, each variable capacitor would be set to some values when measured, and the variable capacitor would not be able to change between values during operation. This would allow for a decrease in the series inductor (such as series inductor 48), which would increase the efficiency. Such an approach will increase the size of the tuning tables derived from the S-Map, because an additional dimension is added, requiring more memory (e.g., by a factor of the number of quantized steps). The required memory may be reduced, however, by reducing the number of frequency points taken in the S-Map. Since the area for each capacitance has been reduced, the same resolution can be found. The number of points may be reduced by the same factor that the number of points were increased to achieve the same resolution, but it is recommended that there is some overlap to avoid gaps in the S-Map.

As discussed above, the variable capacitor may be a VVC or an EVC. An EVC has an advantage over a VVC in that an EVC can adjust itself extremely quickly, potentially thousands of times faster than a VVC. This is because VVCs are a mechanical device that need to spin a shaft to vary the capacitance, while EVCs use solid state switches. These switches can adjust the full range of capacitance in one control cycle. Typically, VVCs are set to a predetermined capacitance to work effectively. Otherwise, it could take a significant amount of time to match. An EVC typically uses many switches, each corresponding with an individual capacitor, to produce a wide range of values without creating large gaps in capacitance. These large gaps would create quantization errors, in the sense that the ideal capacitor value is not achievable, as it is with a traditional VVC with potentially unlimited resolution. Thus, many switching elements, drivers, and capacitors are required to minimize this error, which require additional cost.

With the new multi-dimensional S-Map, however, the number of switched capacitors for an EVC can be reduced significantly. Only coarse step capacitors would be needed, because fine tuning can be accomplished using frequency tuning. For example, if series variable capacitor 34 was an EVC, only 3 coarse capacitors could be used to switch in and out (e.g., 3 coarse capacitors of 7.5 pF each). This could reduce the cost of the EVC enough that it becomes a cost advantage over a VVC. Alternatively, if series variable capacitor 34 was a VVC, the stepping size could be every 7.5 pF (providing, e.g., 90 pF, 97.5 pF, and 105 pF), instead of a more typical step size of every 0.1 pF. The large step size can cause large gaps between values in the S-Map, but these large gaps can be filled in by the frequency adjustment.

Figure 26A:
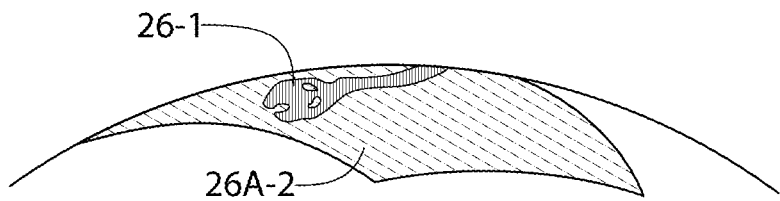
FIGS. 26A-E are impedance plots for variations of the frequency tune circuit of FIG. 23A.
Figure 26B:
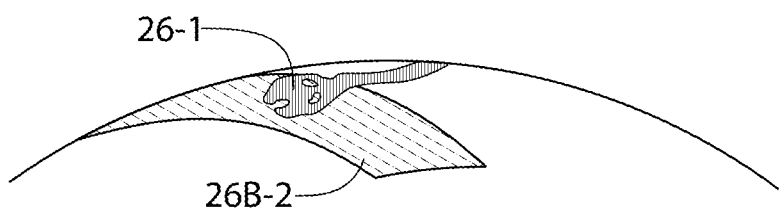
Figure 26C:
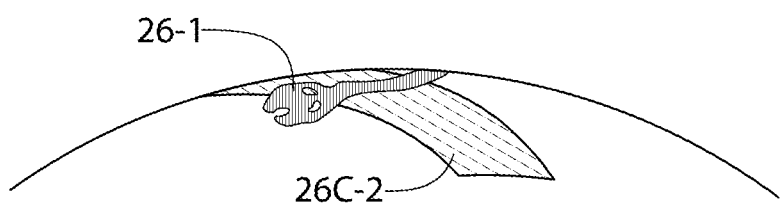
Figure 26D:
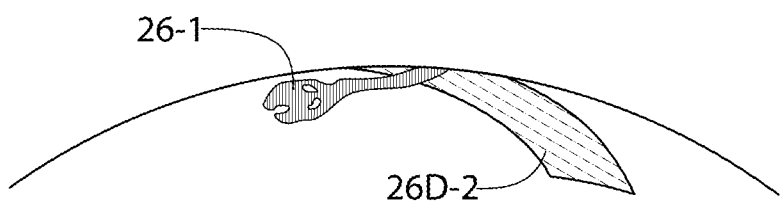
Figure 26E:
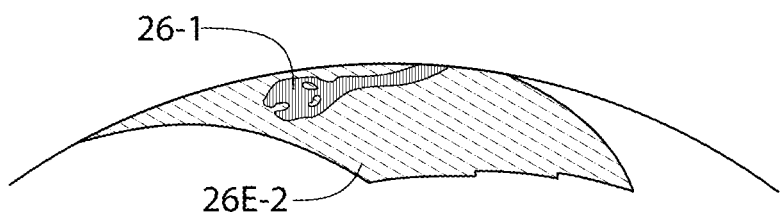

FIGS. 26A-E provide impedance plots on Smith Charts illustrating the ability to use a smaller inductor while achieving a comparable tuning range. For each of these example plots, a system similar to system 40 of FIG. 23A is used, but where the variable capacitors 34, 36 may be any type of variable capacitor. In FIG. 26A, inductor 48 is a typically large inductor enabling the load impedance values to which the matching network can match (matchable load impedance values 26A-2) to cover the potential load impedance values of the chamber (potential load impedance values 26-1). For FIGS. 26B-D, a smaller inductor 48 is used, and therefore the range of potential load impedance values is small. FIG. 26B shows the potential load impedance values 26B-2 when series capacitor 34 is fixed at 105 pF. FIG. 26C shows the potential load impedance values 26C-2 when series capacitor 34 is fixed at 97.5 pF. And FIG. 26D shows the potential load impedance values 26D-2 when the series capacitor 34 is fixed at 90 pF. In each case, the range is insufficient to cover the potential load impedance values 26-1. But for FIG. 26E, the series capacitor 34 is a variable capacitor that can be switched between 90 pF, 97.5 pF, and 105 pF. As can be seen, when the ranges of each of these series capacitor settings is combined, the matchable load impedance values 26E-2 cover each of the potential load impedance values 26-1, similar to the coverage provided by the large inductor in FIG. 26A.

The variable capacitor that is added to the frequency tuning matching network allows for a wider tuning range to be attained without increasing loss. The variable capacitor can be added to the S-Map calibration at various quantized capacitance values, enabling the matching network to quickly tune the circuit by varying both frequency and capacitance. This method could also be used to reduce the cost of an EVC matching network by reducing the number of switched capacitors needed.

There are many circuits that could be designed to utilize this method. For example, in addition to the matching network 44 shown in FIG. 23A (including where series VVC 34 is a different variable capacitor, such as an EVC), any of the matching networks shown in FIGS. 24A-D may be utilized.

Figure 27:
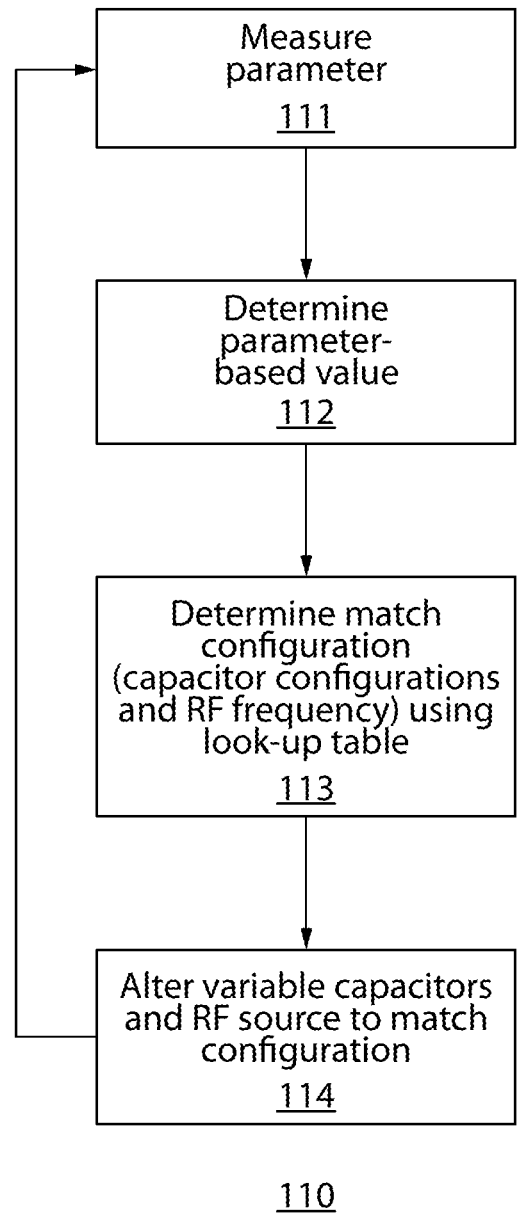
FIG. 27 is a flowchart for a method of matching an impedance utilizing a match configuration look-up table for capacitor and frequency configurations according to one embodiment.

FIG. 27 provides a flow chart for a method 110 for matching an impedance. The method may use, for example, the matching network described above, which includes a first variable capacitor, a second variable capacitor, and a sensor. In a first step, the sensor measures a parameter (operation 111). The parameter could be any of the measured parameters discussed above, including voltage, current, phase, or reflected power. Next, a parameter-based value is determined (operation 112). The parameter-based value may be any of the values discussed above based on the measured parameter, and in a preferred embodiment the parameter-based value is a load impedance. In one embodiment, the load impedance value is determined by inputting an input impedance value for the input of the matching network into a parameter matrix look-up table, and the input impedance value is determined based on the measured parameter. The input impedance value may be determined according to any of the methods discussed above.

Next, the parameter-based value (e.g., load impedance) is input into a match configuration look-up table to determine a match configuration for reducing a reflected power (operation 113). The match configuration includes a first variable capacitor configuration, a second variable capacitor configuration, and an RF source frequency for reducing a reflected power. Next, the first variable capacitor is altered to the first variable capacitor configuration, the second variable capacitor is altered to the second variable capacitor configuration, and the RF source is altered to the RF source frequency to cause a reduction of the reflected power.

In certain embodiments, the matching networks discussed above may form part of a semiconductor processing tool (such as tool 42 of FIG. 23A) that comprises a matching network and a plasma chamber. Further, the methods of impedance matching discussed above may form part of a method of manufacturing a semiconductor.

Parameter Matrices

The exemplified impedance matching network may be characterized by one of several types of parameter matrices known to those of skill in the art. An S-parameter matrix and a Z-parameter matrix are two examples of such parameter matrices. Other examples include, but are not limited to, a Y-parameter matrix, a G-parameter matrix, an H-parameter matrix, a T-parameter matrix, and an ABCD-parameter matrix. Those of skill in the art will recognize also that these various parameter matrices may be mathematically converted from one to the other for an electrical circuit such as a matching network.

A parameter look-up table includes a plurality of parameter matrices, with each parameter matrix being associated with a particular configuration of a variable capacitor and/or RF source. In embodiments in which the parameter look-up table includes multiple types of parameter matrices, the different types of parameter matrices may be associated within the parameter look-up table in such a way so as to eliminate the need for mathematical conversions between the different types of parameter matrices. For example, the T-parameter matrix may be included as part of the parameter look-up table, with each T-parameter matrix associated with the associated S-parameter matrix that would result from conversion between the two matrices.

The match configuration look-up table is a table of match configurations for the variable capacitors and RF source, and it may include each possible array configuration of the variable capacitors, and each possible frequency configuration for the RF source. As an alternative to using a match configuration look-up table, the actual capacitance values or switch configurations for each variable capacitor (and the actual RF frequency for the RF source) may be calculated during the process, such real-time calculations of the capacitance values are inherently slower than looking up the match configurations in the match configuration look-up table.

The altering of the variable capacitors and RF source may include a control circuit sending one or more control signals to cause the change to the match configuration. For example, a control signal may be sent to a driver circuit to control a capacitor configuration. When the variable capacitors and the RF source are switched to the match configurations, the input impedance may match the fixed RF source impedance (e.g., 50 Ohms), thus resulting in an impedance match. If, due to fluctuations in the plasma impedance, a sufficient impedance match does not result, the process may be repeated one or more times to achieve an impedance match, or at least a substantial impedance match.

The look-up tables used in the process described above are compiled in advance of the RF matching network being used in conjunction with the plasma chamber. In one embodiment, in creating the look-up tables, the matching network is tested to determine at least one parameter matrix of each type and the load impedance associated with each match configuration of the variable capacitors and RF source prior to use with a plasma chamber. The parameter matrices resulting from the testing are compiled into the parameter look-up table so that at least one parameter matrix of each type is associated with a respective match configuration of the variable capacitors and RF source. Similarly, the load impedances are compiled into the match configuration look-up table so that each parameter matrix is associated with a respective match configuration of the variable capacitors and RF source. The pre-compiled look-up tables may take into consideration the fixed RF source impedance (e.g., 50 Ohms), the power output of the RF source, and the one or more operational frequencies of the RF source, among other factors that are relevant to the operation of the RF matching network. Each look-up table may therefore have tens of thousands of entries, or more, to account for all the possible configurations of the variable capacitors and RF source. The number of possible configurations is primarily determined by how many discrete capacitors make up each of the variable capacitors and the number of possible frequency values provided by the RF source. In compiling the look-up tables, consideration may be given to possible safety limitations, such as maximum allowed voltages and currents at critical locations inside the matching network, and this may serve to exclude entries in one or more of the look-up tables for certain configurations of the variable capacitors or RF source.

As is known in the art, the S-parameter matrix is composed of components called scatter parameters, or S-parameters for short. An S-parameter matrix for the impedance matching circuit has four S-parameters, namely S11, S12, S21, and S22, each of which represents a ratio of voltages at the RF input and the RF output. All four of the S-parameters for the impedance matching circuit are determined and/or calculated in advance, so that the full S-parameter matrix is known. The parameters of the other types of parameter matrices may be similarly determined and/or calculated in advance and incorporated into the parameter matrix. For example, a Z-parameter matrix for the impedance matching circuit has four Z-parameters, namely Z11, Z12, Z21, and Z22.

By compiling the parameter look-up table in this manner, the entire time cost of certain calculations occurs during the testing phase for the RF matching network, and not during actual use of the RF matching network with a plasma chamber. Moreover, because locating a value in a look-up table can take less time than calculating that same value in real time, using the look-up table can aid in reducing the overall time needed to achieve an impedance match. In a plasma deposition or etching process which includes potentially hundreds or thousands of impedance matching adjustments throughout the process, this time savings can help add directly to cost savings for the overall fabrication process.

Filters for Switching Circuit

As EVC matching networks become more prevalent, end users will seek to push the limits of the technology. The matching speed of EVC matching networks far surpasses that of the traditional VVC matches, enabling applications previously unavailable. An example would be level-to-level pulse matching, where power is pulsed but the state is either high or low, rather than ON or OFF. The RF source generates a multi-level pulse signal such that the RF signal has cyclically recurring pulse intervals with differing amplitude levels. In some cases, the change in the power setpoint amplitude level can be very frequent and of the order of a few tens of hundreds of microseconds. An example of a matching network using level-to-level pulsing is described in co-owned U.S. patent application Ser. No. 16/592,453, which is incorporated herein by reference in its entirety.

Such a level-to-level pulsing application would require the matching network to be in a state of continuous matching. This is because the match is required to match for a short duration for either the high or low pulse. Then it will be required to match again when the next pulse state is initiated. Depending on the period and duty cycle, this may require the match to switch continuously.

As discussed above, EVCs comprise several discrete capacitors. In EVC-based matching networks, PIN (or NIP) diodes may be used as the RF switching device for switching in and out the discrete capacitors of the one or more EVCs in the matching network. In the matching network 90A of FIG. 19, for example, to operate the switch (PIN diode 63), a forward bias current (Bias 68A) is used to turn ON the device, or a high voltage (HVDC 67A) is used to reverse bias the device, turning it OFF.

Referring again to FIG. 19, because RF voltage is also applied to the switch (PIN diode 63), the biases are passed through an RF choke 64A to attenuate the RF voltage at the driver circuit 66A. The exemplified choke 64A is designed to have a high inductance value and self-resonate at the RF frequency of operation. This choke design has substantial attenuation and wide bandwidth. This ensures that a minimum attenuation is met even with variations in components, frequency, etc.

But this choke design also has drawbacks. The main problem is that it affects the overall switching speed, where large voltages can be generated across the inductor. According Equation 1 below, the voltage across the inductor 64A is equal to the inductance times the rate of change in current. The current comes from the Bias 68A and therefore is fixed. If the inductance of the choke needs to be large, then the Bias being applied must gradually increase and decrease.

$$V = L\frac{di}{dt} \quad \text{(Equation 1)}$$

As an example, if the inductance is 60 uH, the bias current is 0.5 Amps, and the switching speed is 10 ns, the voltage generated across the inductor would be 3000 Volts. This may damage the filter 62A, driver circuit 66A, PIN diode 63 and/or discrete capacitor 78. This voltage also oscillates and will cause the PIN diode 63 to turn ON and OFF rapidly. If the switching speed is changed to 50 us, this voltage drops to only 0.6 Volts. To drop the inductance by the same magnitude would also have a similar effect, but the isolation required prevents this.

Filtering capacitor 62A is a lowpass filter that helps block the RF from the driver circuit. This capacitance is typically a large value (e.g., 3000 pF for a 13.56 MHz operating frequency) to give a low impedance to ground for the RF signal. This large capacitance, however, adds stress to the driver circuit 66A by creating additional power dissipation. The power dissipation is difficult to calculate because of the complexity of the circuit, especially with the slow, nonlinear transition times of the driver circuit. We know the energy stored in the capacitor and the minimum amount of time that it takes to fully charge and discharge, however, so the power dissipated per charge and discharge can be roughly calculated for the full system.

Equation 2 shows how to calculate the stored energy in the filtering capacitor 62A. Equation 3 shows how to calculate power dissipation from the energy dissipated over time. If Equation 2 is substituted into Equation 3 then the total power dissipated in the system from the capacitor charge/discharge can now be calculated as seen in Equation 4.

$$E = \frac{1}{2}CV^2 \quad \text{(Equation 2)}$$

$$P = \frac{E}{t} \quad \text{(Equation 3)}$$

$$P = \frac{CV^2}{2t} \quad \text{(Equation 4)}$$

Using Equation 4, the total power dissipation per transition can be calculated. To continue with the previous example, the switching speed is 50 us. If the HVDC is set to 1650V and the capacitance is set to 3400 pF, then the total power dissipated in the system is about 92.6 W. This dissipation includes losses in the driver circuit switch, the power supply, the bias resistor, and anything else in series with the capacitor while it either charges or discharges.

The power dissipation will generate a considerable amount of heat. The heat will degrade components and reduce their lifetime. This will require the match to reduce the number of transitions in a given amount of time.

Another issue is that the HVDC supply needs to be able to supply current for multiple switches. In the previous example, the HVDC 67A would be applied to the PIN diode 63 every other OFF transition. Thus, the supply would need to power 46.3 W. For a worst-case scenario, this would then need to be multiplied by the number of switches. If the matching network has 50 PIN diodes, for example, the HVDC supply would need to be rated for over 2300 Watts. This calculated power requirement is a worst-case example, as the probability of the switches needing to transition from all OFF to all ON continuously is very low.

Figure 28:
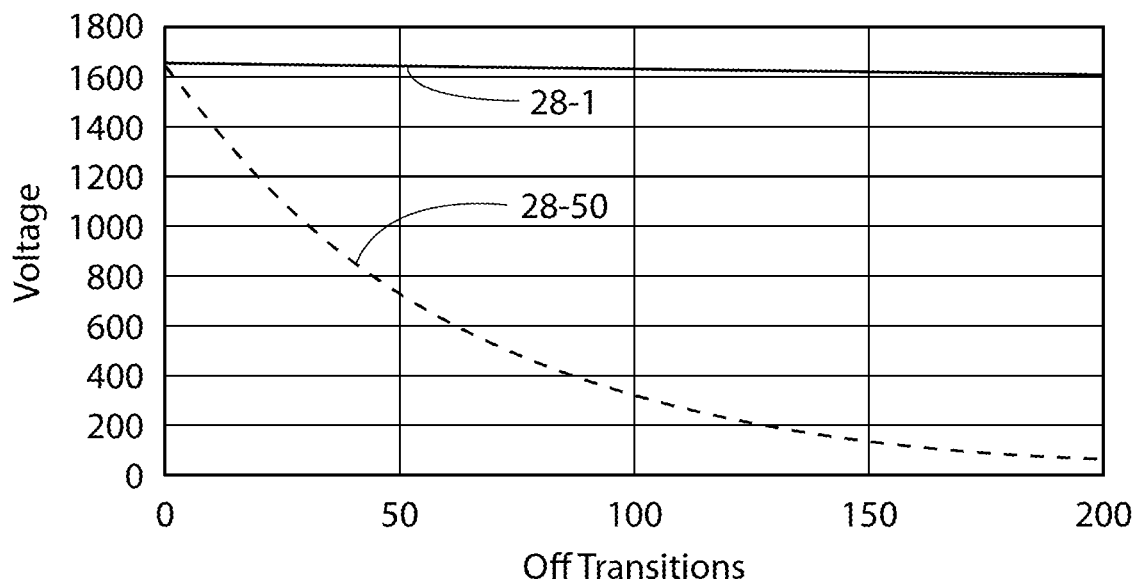
FIG. 28 is a graph showing the voltage drop from switching, according to one embodiment.

A way to help with the required power is to place a very large capacitance on the HVDC supply. This will work for non-level-to-level processes or very short level-to-level processes. Using the worst-case scenario, assuming the HVDC supply was able to supply 23 Watts, or half of a switch, the unit would need to switch in and out 3400 pF multiplied by 49.5 switches per every OFF transition. If a 10 uF capacitor is used to store charge, with 100 us between off transitions, and a minimum voltage of 1600 VDC was required, the switches would be able to have two OFF transitions. This would give a total time of 200 us before stopping. For the best-case scenario, the unit would only change a single switch or have 0.5 switches per transition. In this case, the unit would be able to make 182 off transitions, or run continuously for 18.2 ms, before the HVDC drops below 1600 VDC. FIG. 28 provides a graph comparing these two extremes for the voltage drop from switching. Specifically, plot 28-1 is the voltage drop for a single switch, while plot 28-50 is a plot for the voltage drop for 50 switches.

The plots of FIG. 28 were generated by modifying Equation 5 below. Calculating the charge at step n, as seen in Equation 6, the voltage after the transition where the capacitors are all charged can be calculated in Equation 7. Thus, the charge at Step 0 is equal to 1650V multiplied by the HVDC capacitor, $C_1$, of 10 uF. The filter capacitor(s) then share the charge by adding to the total capacitance, $C_2$, which is equal to 10 uF, plus 3400 pF times the number of switches, minus half a switch in this example. This new voltage is then fed back into Equation 6 for the next set of off transitions.

$$C = \frac{Q}{V} \quad \text{(Equation 5)}$$

$$Q_n = C_1 V_n \quad \text{(Equation 6)}$$

$$V_{(n+1)} = \frac{Q_n}{C_2} = \frac{C_1 V_n}{C_2} \quad \text{(Equation 7)}$$

The HVDC supply capacitor can be increased, but at a certain point the size of the capacitor, or group of smaller capacitors, will become very large and would have a significant cost. Another option is to simply reduce the capacitance of the filter capacitors. This option is not ideal, however, because the filter response is critical to the operation of the driver circuit. Without it, EMI would cause the driver circuit to not operate properly.

Band-Stop Filter for Switching Circuit

Figure 29:
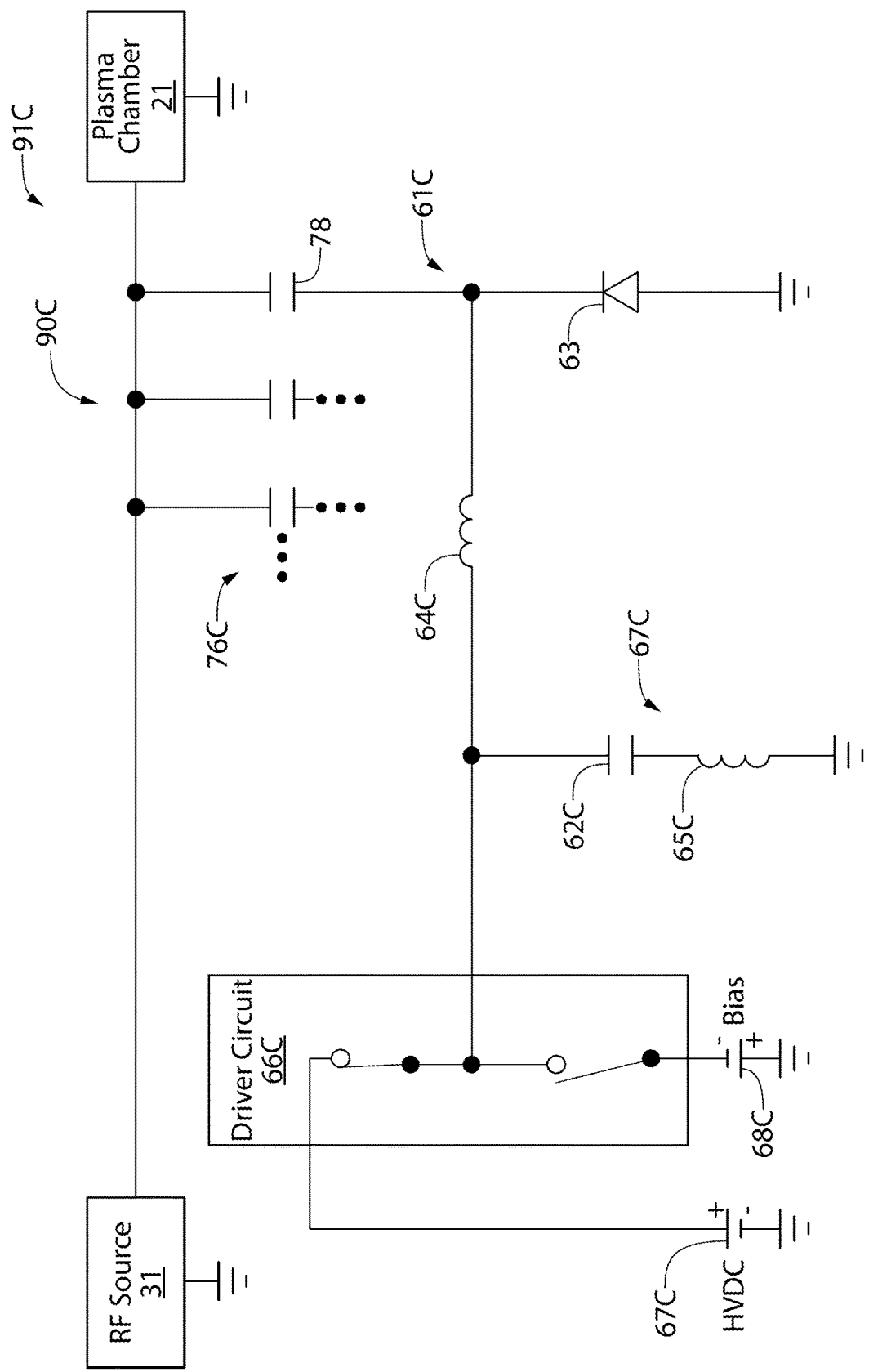
FIG. 29 is a system for manufacturing a semiconductor, the system including a matching network utilizing a band-stop filter according to an embodiment.

FIG. 29 illustrates an alternative solution using a band-stop filter 67C rather than a lowpass filter 62A. The band-stop filter 67C of the exemplified system 50C for manufacturing a semiconductor allows the capacitance of the filtering capacitor 62C to be reduced by adding an inductor 65C in series with the filtering capacitor 62C, creating a resonant circuit. The resonant frequency may be close to the center of the frequency range. This design will reduce the capacitance of the filtering capacitor 62C while also keeping the required attenuation to prevent issues from EMI. The exemplified filter can bias a PIN diode switch while blocking RF from the biasing circuitry.

In the exemplified embodiment, for a 13.56 MHz matching network, the filtering capacitor 62C has a capacitance of 300 pF, and the inductor 65C has an inductance of 470 nH. In other embodiments, these values may differ. For example, in certain embodiments, the filtering capacitor may have a capacitance of 110 pF with an inductor of 150 nH to filter 40.68 MHz. The exemplified band-stop filter 67C is parallel to the PIN diode 63, and its inductor 65C is coupled between the filtering capacitor 62C and the common ground 43. In other embodiments, the filtering capacitor may be coupled between the inductor and the common ground. In this embodiment, the biasing current supply 68C and the band stop filter circuit 67C are coupled to the common ground 43. The exemplified PIN diode 63 is also coupled to the common ground 43, though the invention is not so limited.

Similar to FIG. 19, the exemplified system 50C of FIG. 29 includes an RF source 31, a plasma chamber 21, and a matching network 90C coupled to a common ground. The matching network 90C and plasma chamber 21 together form a semiconductor processing tool 91C. The matching network includes an EVC 76C comprising discrete capacitors 78. Each discrete capacitor has a switching circuit 61C for switching the discrete capacitor 78 in and out to alter the total capacitance of the EVC 76C. The switching circuit 61C includes the switch (PIN diode 63) for switching in and out the discrete capacitor 78, the choke 64C, the band-stop filter 67C, the driver circuit 66C, the HVDC 67C, and the Bias 68C. The choke 64C is operably coupled between the PIN diode 63 and the filtering capacitor 62C. Further, to switch the switching circuit 61C ON and thereby switch in the discrete capacitor 78, a DC current flows from the biasing current supply 68C and through the PIN diode 63. The invention, however, is not limited to the exemplified embodiment. Several features on the system 50C may be altered, including those alternative features discussed above with respect to FIGS. 19 and 20. For example, certain features may be reversed to achieve a similar result.

Figure 30:
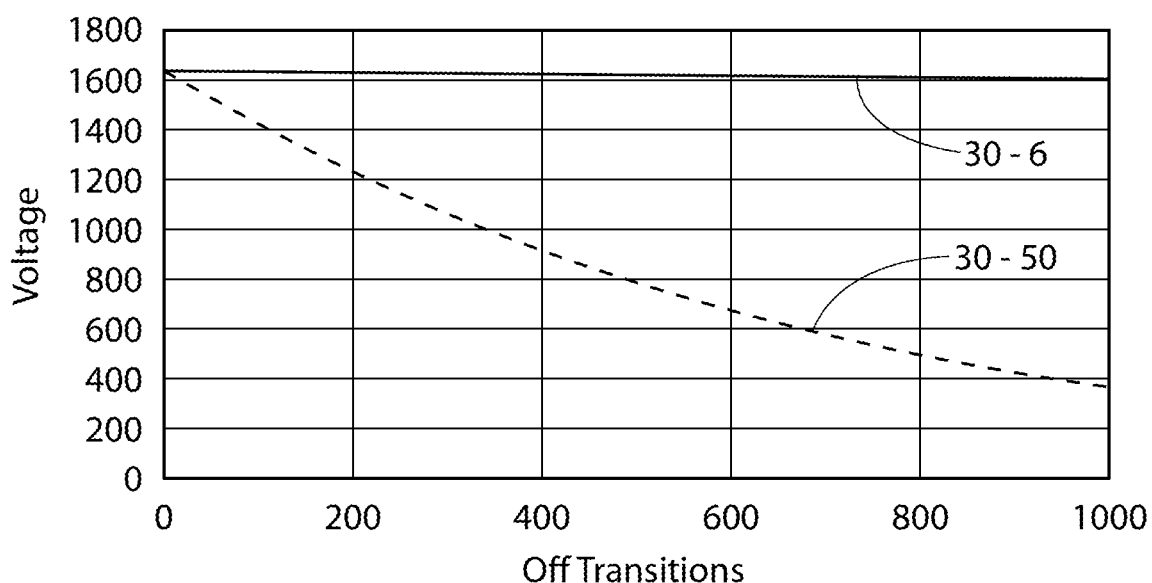
FIG. 30 is a graph showing the voltage drop from switching when utilizing the band-stop filter of FIG. 29.

As discussed above, a reduction in the capacitance of the filtering capacitors 62C for each switching circuit 61C would reduce the power dissipation. Using the previous example but allowing the capacitance to drop by a factor of 10, the power supply would now be able to handle switching five capacitors continuously, and thus the best-case scenario is switching five capacitors or less. If a sixth capacitor were to be switched continuously, the time to drop the HVDC to below 1600 VDC would be 93.3 ms. If the original capacitance was used, the time to drop the HVDC with six switches would be 1.7 ms. The worst-case scenario with the new circuit would drop the HVDC in 2.1 ms. FIG. 30 is a graph showing the voltage drop from switching when utilizing the band-stop filter of FIG. 29. Plot 30-6 shows the voltage drop with 6 switches, while plot 30-50 shows the voltage drop with 50 switches. As can be seen, plot 30-50 of FIG. 30 has a much smaller voltage drop than plot 28-50 of FIG. 28.

Figure 31:
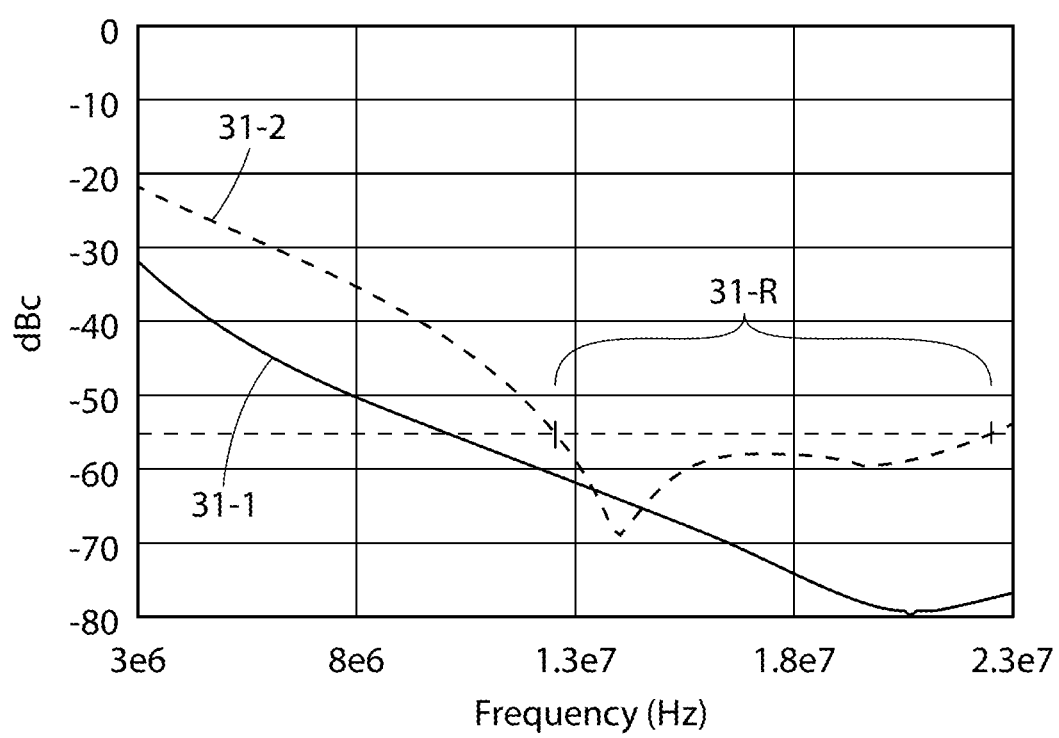
FIG. 31 is a graph showing the frequency range of the matching network of FIG. 29 as compared with a matching network utilizing a lowpass filter.

A potential disadvantage of using band-stop filters would be that the filters may need to be tuned or tightly controlled. The bandwidth where the minimum attenuation is met would be decreased, and thus the frequency range would be reduced. An example simulation of the two filter responses can be seen in FIG. 31, showing a plot 31-1 for a system not using a band-stop filter and a plot 31-2 for a system using a band-stop filter. The graph shows that, in a 50Ω system, for a system using a band-stop filter, the power ratio (decibels relative to the carrier or dBc) is only greater than 55 dBc in frequency range 31-R.

To increase the number of switches that can switch continuously, following the previous example, the total capacitance must be 1690 pF. That would be divided by the number of PIN diode switches. For a fifty-switch system, the capacitance would need to drop to 33.8 pF per switch. This may cause an undesirably narrow bandwidth, and therefore some balance must be made between the minimum number of switches that must continuously switch, and the attenuation bandwidth of the filter.

The above-described filter topologies may be used as part of a method for providing an impedance match, where an impedance is matched by at least one of the switching circuits of the EVC switching in or out its corresponding discrete capacitor to alter a total capacitance of the EVC. Further, this method of matching an impedance can form part of a method for fabricating a semiconductor, such as those methods for fabricating a semiconductor discussed above.

In view of the foregoing, changing the filter topology from a lowpass filter topology to a band-stop filter topology has multiple advantages because of the drop in the filtering capacitor. First, the band-stop filter topology reduces the power dissipation in the switching devices. This will reduce their temperature rise, allowing them to switch more often and increase their lifetime. Second, because of the lower power consumption, the power supply will allow for more switches to be switched simultaneously and more often. This design can also be modified to further increase the number of transitions. If the capacitance is dropped enough, it will no longer be the limiting factor in switching time. At that point, the RF choke will need to be reduced, and a discrete capacitor will need to be added to shift its resonant frequency. These changes will increase the switching speed, allowing for faster pulsing and matching.

Adding an inductor to the filtering capacitor to create a band-stop filter for the impedance matching network provides a new and effective means of increasing the effective capacitance of the filter without adding to the charging and discharging capability of the filter.

FET-Based Switching Circuit with Voltage Bias to Reduce Parasitic Capacitance and Capacitance Variability Typically, solid state matching networks use one of two different switching elements. The first is a PIN diode, which is controlled by either a forward bias current, to turn the switch on, or a reverse bias voltage, which turns the switch off. The other is a transistor, such as a Field Effect Transistor (FET). A FET is driven by low and high voltages to turn the devices off and on.

The main advantage of using FETs over PIN diodes is that they have a faster switching speed. This allows the matching network to match more quickly and have lower switching losses. FETs can also have a lower equivalent series resistance (ESR) per switch. There is also a larger selection of parts and more availability. The number of components needed is also reduced, as the transistor circuit is what essentially drives the PIN diode.

One disadvantage of using FETs is that the parasitic capacitance is higher than when using PIN diodes. This makes the FET's impedance at RF frequencies have less of a dynamic response when switched between the on and off states. Another disadvantage is related to the FETs' inherent design. A FET has a body diode across its drain and source. This body diode leads one to use two FETs in series with either a common source or a common drain, as shown in FIGS. 32A and 32B.

Figure 32A:
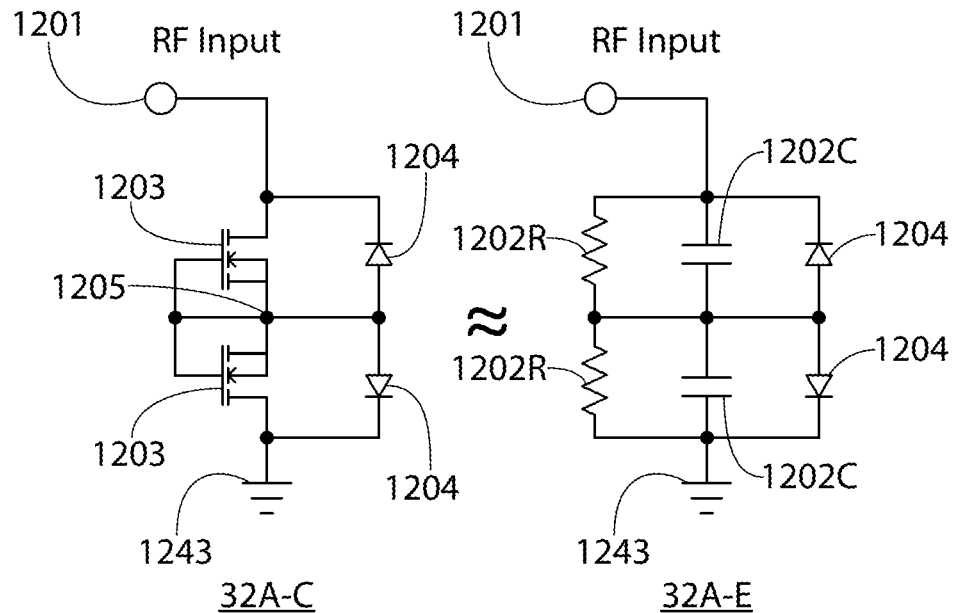
FIG. 32A is a FET-based switching circuit using a common source topology according to one embodiment.

FIG. 32A is a FET-based switching circuit 32A-C using a common source topology according to one embodiment. There are two FETs 1203 in series between an input 1201 and a common ground 1243, the FETs 1203 sharing a common source (at common point 1205) and having opposing body diodes 1204. An equivalent circuit 32A-E is also shown, which displays an equivalent resistance 1202R and capacitance 1202C.

Figure 32B:
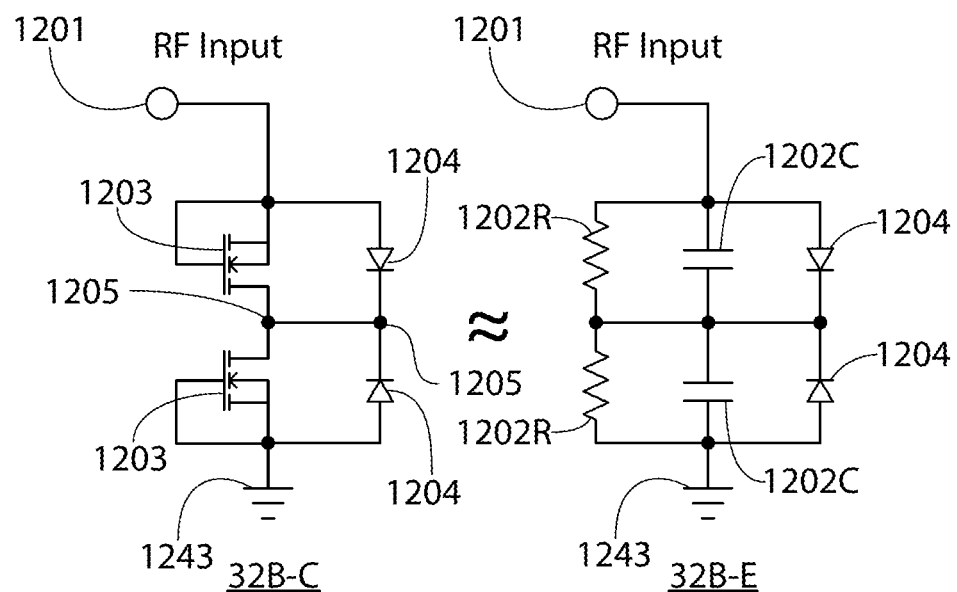
FIG. 32B is a FET-based switching circuit using a common drain topology according to one embodiment.

FIG. 32B is a FET-based switching circuit using a common drain topology according to one embodiment. There are two FETs 1203 are in series between an input 1201 and a common ground 1243, the FETs 1203 sharing a common drain (at common point 1205) and having opposing body diodes 1204. An equivalent circuit 32B-E is also shown, which displays an equivalent resistance 1202R and capacitance 1202C. In both circuits 32A-C, 32B-C, the gate to source is shorted in the off condition. This also produces a rectified voltage between the two devices.

It is noted that for the sake of clarity and convenience in describing similar components or features, the same or similar reference numbers may be used herein across different embodiments or figures. This is not to imply that the components or features identified by a particular reference number are identical across each embodiment or figure, but only to suggest that the components or features are similar in general function or identity.

Figure 33A:
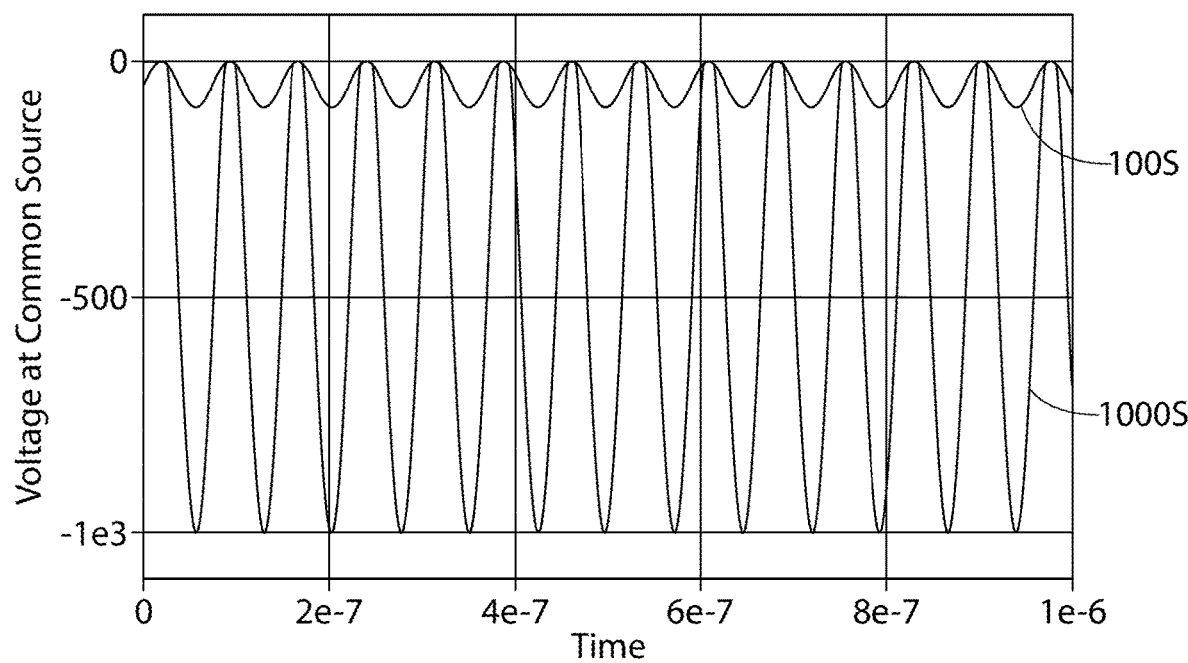
FIG. 33A is a graph of a simulation of the common source voltage of the switching circuit of FIG. 32A.
Figure 33B:
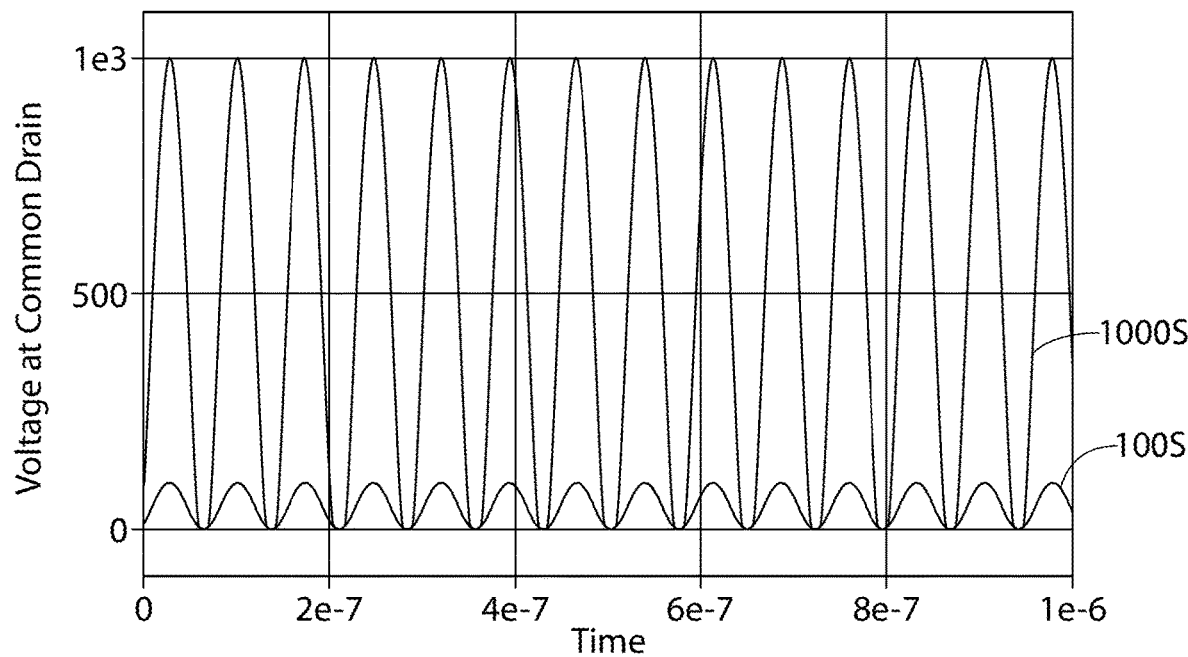
FIG. 33B is a graph of a simulation of the common drain voltage of the switching circuit of FIG. 32B.

A simulation was performed on the two equivalent circuits 32A-E, 32B-E of FIGS. 32A and 32B. A 13.56 MHz signal was applied to the RF input nodes 1201 at 100 Vpeak and 1000 Vpeak. FIG. 33A is a graph of the simulation 100S for 100 Vpeak and simulation 1000s for 1000V peak for the common source voltage of switching circuit 32A-E of FIG. 32A. FIG. 33B is a graph of the simulation 100S for 100 Vpeak and simulation 1000s for 1000V peak for the common drain voltage of switching circuit 32B-E of FIG. 32B. These simulations show that the common point 1205 rectifies the RF voltage, creating a DC offset. This DC offset, or bias, on the FETs' common node is equivalent to half the peak amplitude, 50 VDC and 500 VDC.

Figure 34:
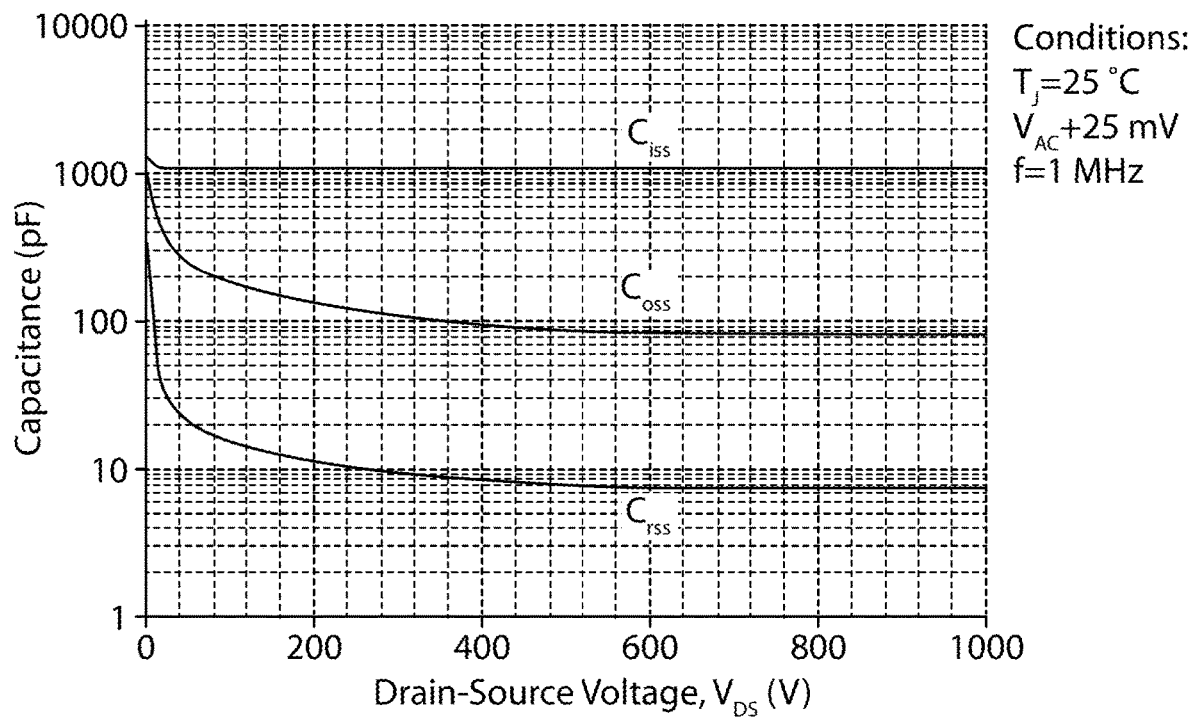
FIG. 34 is graph of the relationship between capacitance and drain-to-source voltage.

Unlike PIN diodes, the bias in the off state varies the capacitance over a wide range. The capacitive variation from the change in amplitude in existing designs will cause there to be a large difference between the S-parameter map (S-Map), which is unmatched at low power, meaning the voltage on the switches is extremely low, as opposed to when the unit is under power and matched, generating voltages that can be near or at the limit. FIG. 34 is graph of the relationship between capacitance and drain-to-source voltage for CREE C2M0080120D, a 1200V, 80 mΩ, Silicon-Carbide MOSFET from Wolfspeed. FIG. 34 shows that the output capacitance $C_{OSS}$ has over a ten times difference when $V_{DS}$ is equal to 0 VDC and when it is over 500 VDC. If we assume that the discrete capacitor being switched in and out of circuit was 100 pF, in the off condition, it would vary from about 90 pF down to 45 pF. Variation increases with the capacitor value too. For 1000 pF, the variation is 500 pF down to 75 pF. The variance is multiplied by the number of switches of the variable capacitance system.

Design 1: Voltage Bias Across Drain-to-Source of FET

In a first design embodiment described below, a switching circuit will have an applied voltage bias across the drain-to-source of the switching FET to reduce capacitance variability. The bias is applied when the FET is in the off condition, like the reverse bias to turn off a PIN diode. The description below will then show different topologies to allow the switch to operate at higher voltages.

Figure 35A:
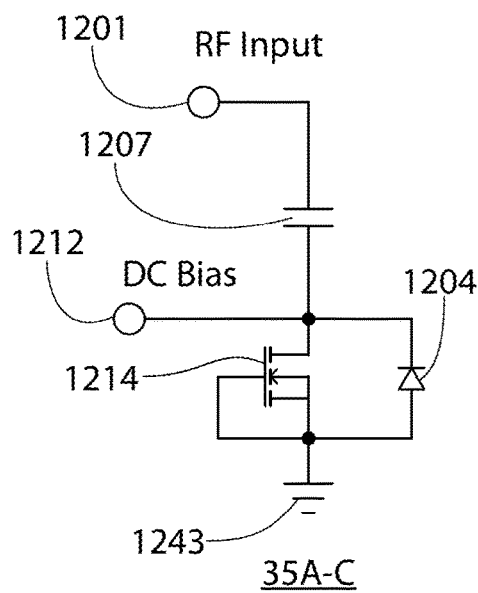
FIG. 35A is a FET-based switching circuit where a bias is applied to a drain of a switching FET according to one embodiment.
Figure 35B:
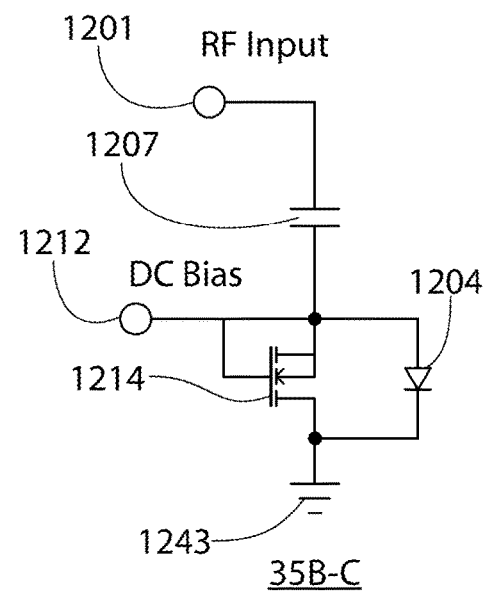
FIG. 35B is a FET-based switching circuit where a bias is applied to a source of a switching FET according to one embodiment.

FIGS. 35A-B show simple examples where the bias is applied to the common drain or the common source. Specifically, FIG. 35A is a FET-based switching circuit 35A-C where a bias 1212 is applied to a drain of a switching FET 1214 according to one embodiment. The circuit 34A-C includes an RF input 1201, a discrete capacitor 1207 to be switched in and out, and a common ground. The switching FET 1214 includes body diode 1204. By contrast, FIG. 35B is a FET-based switching circuit 35B-C where the bias 1212 is applied to the source of a switching FET 1214 according to one embodiment. Note, the drain bias is positive while the source bias is negative, referenced to ground 1243.

Figure 36A:
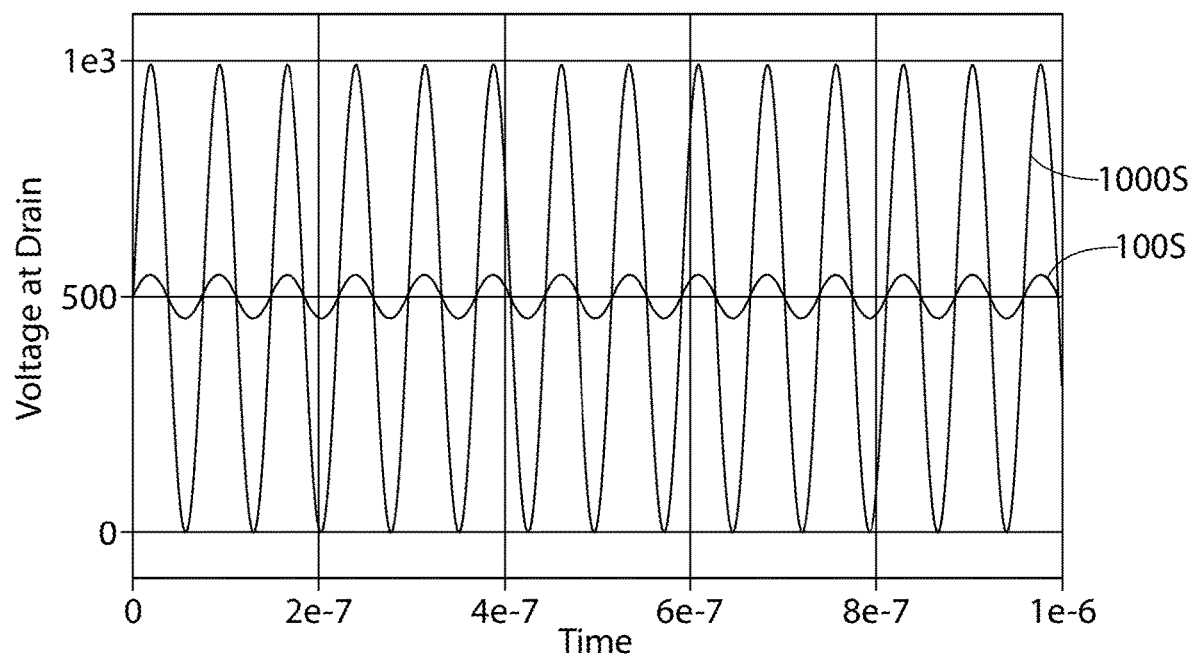
FIG. 36A is a graph of a simulation of the voltage across the biased-drain switching FET of FIG. 35A.
Figure 36B:
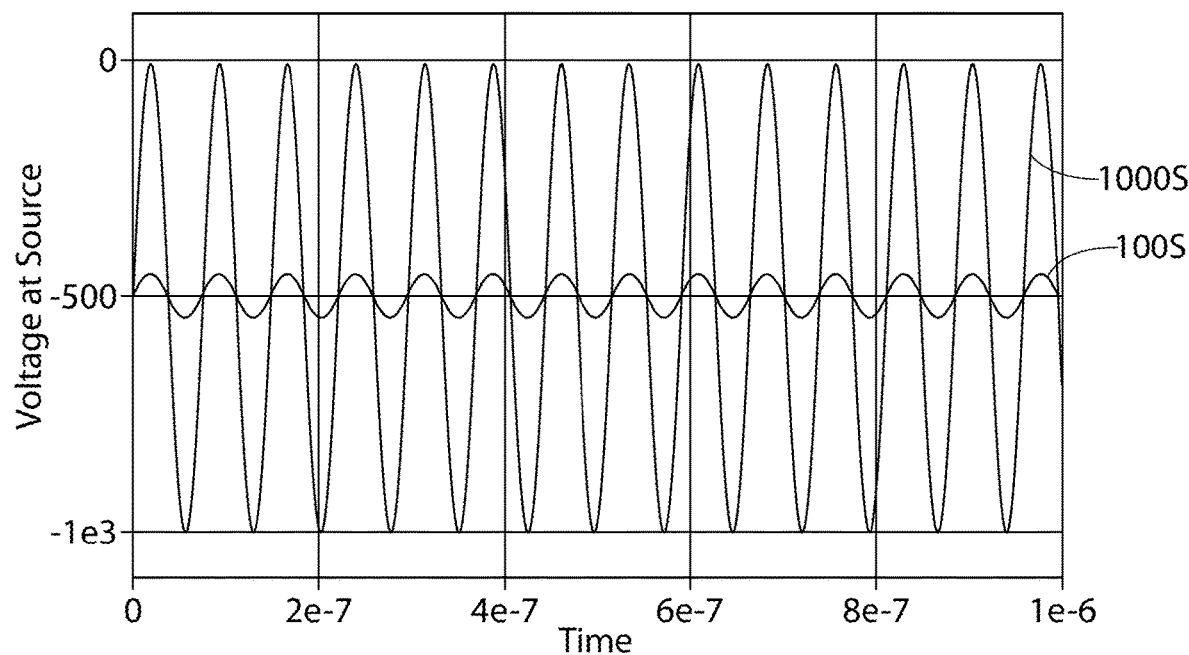
FIG. 36B is a graph of a simulation of the voltage across the biased-source switching FET of FIG. 35B.

FIG. 36A is a graph of a simulation 100S for 100 Vpeak and simulation 1000s for 1000 Vpeak for the voltage across the biased-drain switching FET 1214 of FIG. 35A. FIG. 36B is a graph of a simulation 100S for 100 Vpeak and simulation 1000s for 1000V peak for the voltage across the biased-source switching FET 1214 of FIG. 35B. In both sets of waveforms, the average voltage of the 100 Vpeak signal is equal to the average voltage with the 1000 Vpeak signal, 500V or −500V.

Figure 37A:
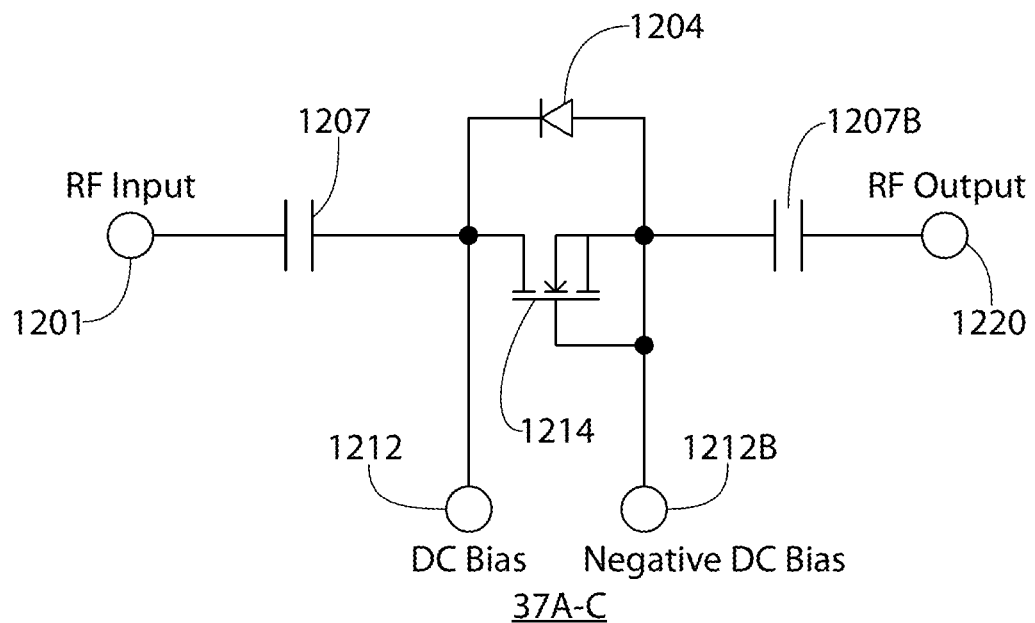
FIG. 37A is a FET-based switching circuit where a switching FET is in series and a negative and positive bias are applied according to one embodiment.
Figure 37B:
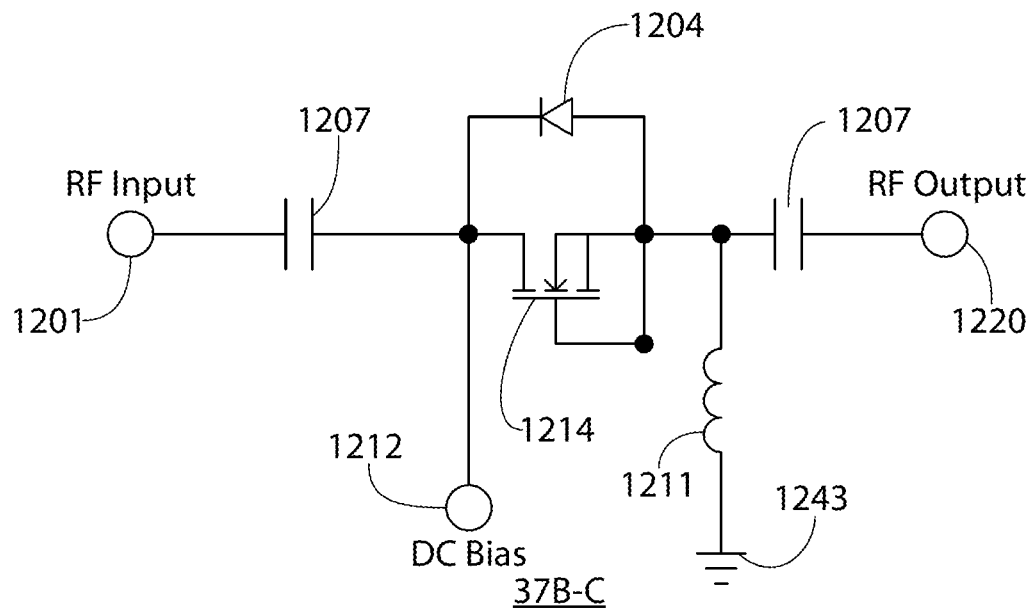
FIG. 37B is a FET-based switching circuit where a switching FET is in series and a bias is replaced with a choke to common ground according to one embodiment.

As shown in FIGS. 37A and 37B, the FETs being switched can also be placed in a series configuration. Specifically, FIG. 37A is a FET-based switching circuit 37A-C where a switching FET 1214 is in series between an RF input 1201 and an RF output 1220 and a negative bias 1212B and positive bias 1212 are applied according to one embodiment. FIG. 37B shows that in the switching circuit 37B-C one of the biases (e.g., negative bias 1212B) can be replaced with a choke 1211 to ground 1243. It is noted that in the embodiments of FIGS. 37A and 37B, rather than switching in a single discrete capacitor, two capacitors 1207 are switched in to form a discrete capacitance that is switched in. This is similarly the case for the embodiments of FIGS.

43-46 discussed below. It is noted that where this disclosure refers to switching in or out a discrete capacitor to alter a total capacitance of the EVC, this may refer to switching in a discrete capacitance that comprises more than one capacitor, such as in FIGS. 37A and 37B. It is further noted that in other embodiments, one of the discrete capacitors (e.g., the discrete capacitor 1207 adjacent the RF output 1207 in FIG. 37B) may be omitted.

Several advantages are provided by Design 1. If a DC voltage was applied across the switch at half the rated voltage, or half the maximum allowable RF peak voltage, the variation in capacitance due to changes in amplitude would be mitigated. This means that the impedance of the switching elements would be constant when taking the S-Map measurement and when applying the maximum allowable peak voltage to the device. The stability in the FETs' impedance is critical for any matching network, including those that do not utilize an S-Map. Without this, as the matching network approaches a matched condition, there is less reflected power. Therefore, the voltage on the capacitor array will increase. Thus, as a capacitor is switched in to increase the total capacitance, the voltage would be increased, which will reduce the capacitance of all the switches in the off position. This could cause an oscillation, as the capacitance would fluctuate during tuning. The other condition is where the capacitance is switched out of circuit to reduce the total capacitance. The voltage would again increase dropping the capacitance further, creating an overcompensation. This would make it difficult to predict how much to reduce the capacitance by, requiring a smaller step than what is necessary.

Another benefit of Design 1 is to reduce the parasitic capacitance of each switching circuit, which will increase its impedance in the off state, making it look more like an ideal switch. This will have two effects. The first is that it will create the lowest possible starting capacitance, creating a broader tuning range. The second, from what has been observed in literature and from Applicant's testing, is that the efficiency tends to be higher with lower capacitance. This is from the higher impedance having a lower current, reducing $I^2R$ losses.

This design would be simpler to implement than a switch with an amplitude variable inductor in parallel with each switching element. Now, a fixed inductor could be placed in parallel to further reduce the parasitic capacitance if needed. It will also have lower losses than using one or more diodes in series with the FET, creating a more efficient match.

The biggest challenge with this design is that the DC voltage takes away from the maximum RF peak. The maximum RF voltage that can be applied is less than or equal to the HVDC bias. Ideally, half the rated voltage would be applied to the FET as bias, which means the maximum RF peak is reduced to half of the rated voltage. Design 1 also requires high-voltage direct current (HVDC) to implement this design, increasing the probability of arcing and thus requiring certain precautions to be made.

In one embodiment, Design 1 utilizes a half H-bridge configuration. A bottom FET will be the RF switching element, and a top FET will be used to bias the bottom FET when it is in the off state. Note, this is just one implementation, as there are many ways to apply the bias voltage. These switch designs can also be in the series configuration as stated previously.

In certain embodiments, a blocking element is placed between the RF switches and the HVDC supply to block RF and pass HVDC. If not, the RF current may see a low impedance path to ground, giving an apparent impedance drop of the bottom FET in the off state. There are many ways of doing this, such as using chokes, diodes, or large-value resistors on each channel, or some combination of any of these per channel. As will be shown, a single element, or combination of elements, from the previously mentioned can be used for all channels.

If there is isolation between the top FET (the biasing FET) and bottom FET (the switching FET), there will not be any considerable RF current flowing through the top FET. This means that the top FET (biasing FET) only needs to have half the voltage rating of the bottom FET (switching FETE), HVDC with some margin. Thus, a much less expensive low current switching element could be used to apply the bias.

Figure 38A:
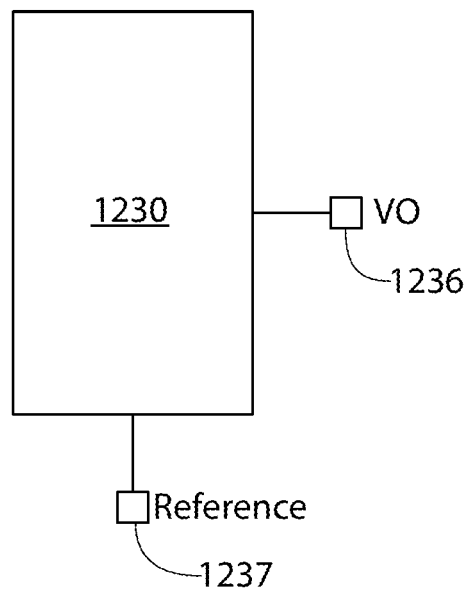
FIG. 38A is a single gate driver according to one embodiment.
Figure 38B:
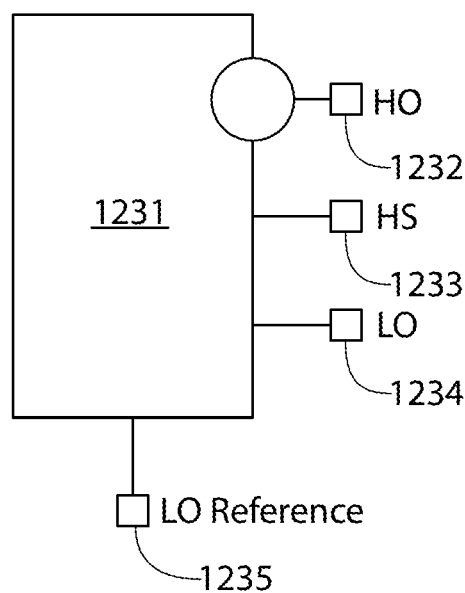
FIG. 38B is a combined low and high side gate driver according to one embodiment.

FIG. 38A shows a single gate driver 1230 according to one embodiment. Pin 1236 is the output, while pin 1237 is for reference or ground. An example of an isolated gate driver is Silicon Lab's Si826 Isolated Gate Driver. FIG. 38B shows a combined low and high side gate driver 1231 according to one embodiment. This driver 1231 has internal circuitry to control the deadtime, so that both FETs (the biasing FET and the switching FET) are never switched on at the same time, thus eliminating shoot-thru. The current generated by shoot-thru can exceed the rating of the FETs, causing permanent damage. The exemplified low and high side gate driver 1231 includes a high-side output 1232, a high-side floating ground 1233, a low-side output 1234, and a low-side reference 1235. An example of such a low and high side gate driver is TI's LM5106, where a single input signal is used to produce a dual differential output with deadtime. Two separate signals with programable deadtime may be used to control two single drivers.

Figure 48:
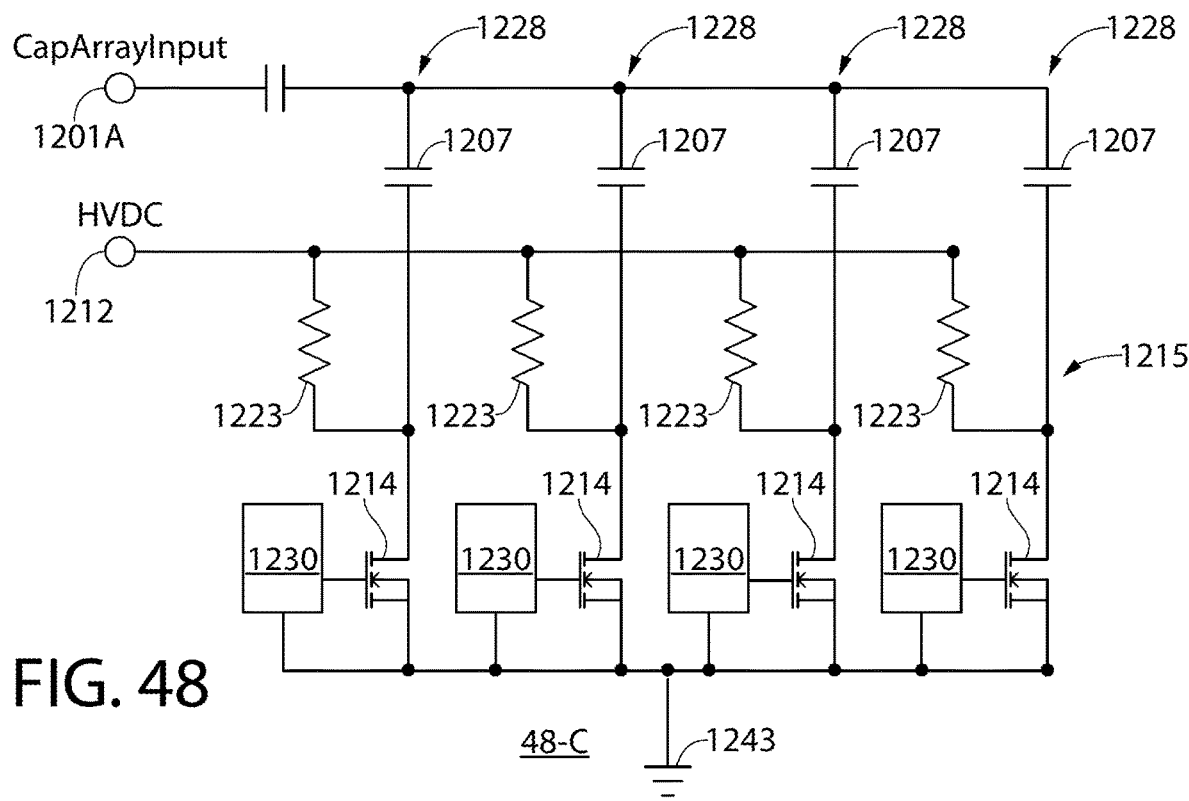
FIG. 48 is a schematic of an EVC utilizing drain-biased switching FETs and blocking resistors according to one embodiment.
Figure 49:
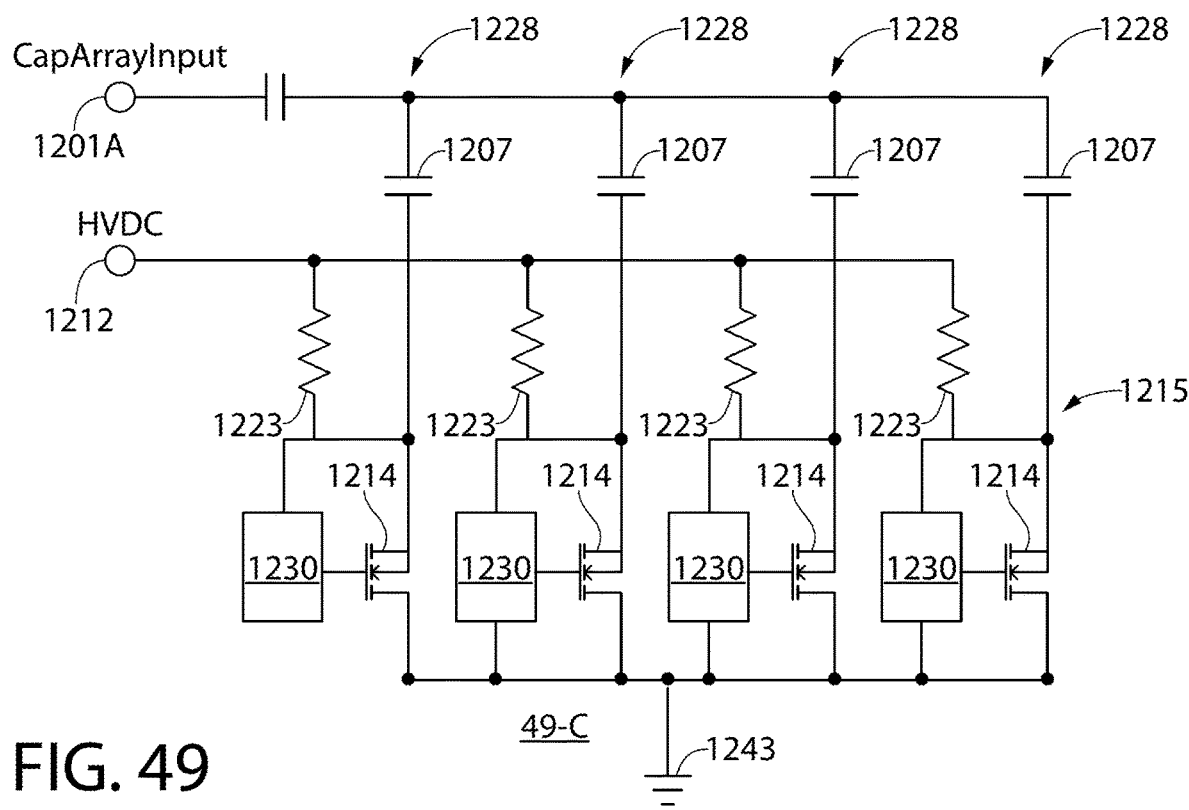
FIG. 49 is a schematic of an EVC utilizing source-biased switching FETs and blocking resistors according to one embodiment.

FIGS. 48 and 49 are schematics of EVCs using blocking resistors 1223 according to one embodiment. Specifically, FIG. 48 is a schematic of an EVC 48-C utilizing drain-biased switching FETs 1214 and blocking resistors 1223 as part of its switching circuit 1215 according to one embodiment. In this embodiment, there are four channels 1228 switching (each having a discrete capacitor 1207), but this number of channels (and discrete capacitors) can be increased or decreased to any number as needed for the design. One resistor 1223 is in series with each switching FET 1214 to apply voltage (from biasing HVDC 1212) when the FET 1214 is open. Gate drivers 1230 drive the switching FETs 1214. FIG. 49 is similar to FIG. 48, but the EVC 49-C of FIG. 49 utilizes source-biased switching FETs 1214. It is noted that each of the EVCs shown in FIGS. 48-60 include multiple channels 1228, each with its own switching circuit 1215. Further, the exemplified EVCs are shown to include a capacitor at the input 1201A for voltage reduction, though such a capacitance is not necessary. It is noted that an EVC is a type of electronically-variable capacitance system.

The advantage of using a blocking resistor as shown is that the circuit will have a very wide bandwidth. Thus, one switch design can be used for various frequencies or a multi-frequency unit. The difficulty with this design is it requires a resistor that is large enough to limit the current flowing from the RF to the HVDC supply, while also being small enough to charge the FETs' various capacitances in a short amount of time. When the switches are on, there will be a steady flow of current from the HVDC supply to ground. This implementation would have a slower switching response than other designs provided herein, but would be less expensive and easier to implement because of the simplicity of the design.

Figure 50:
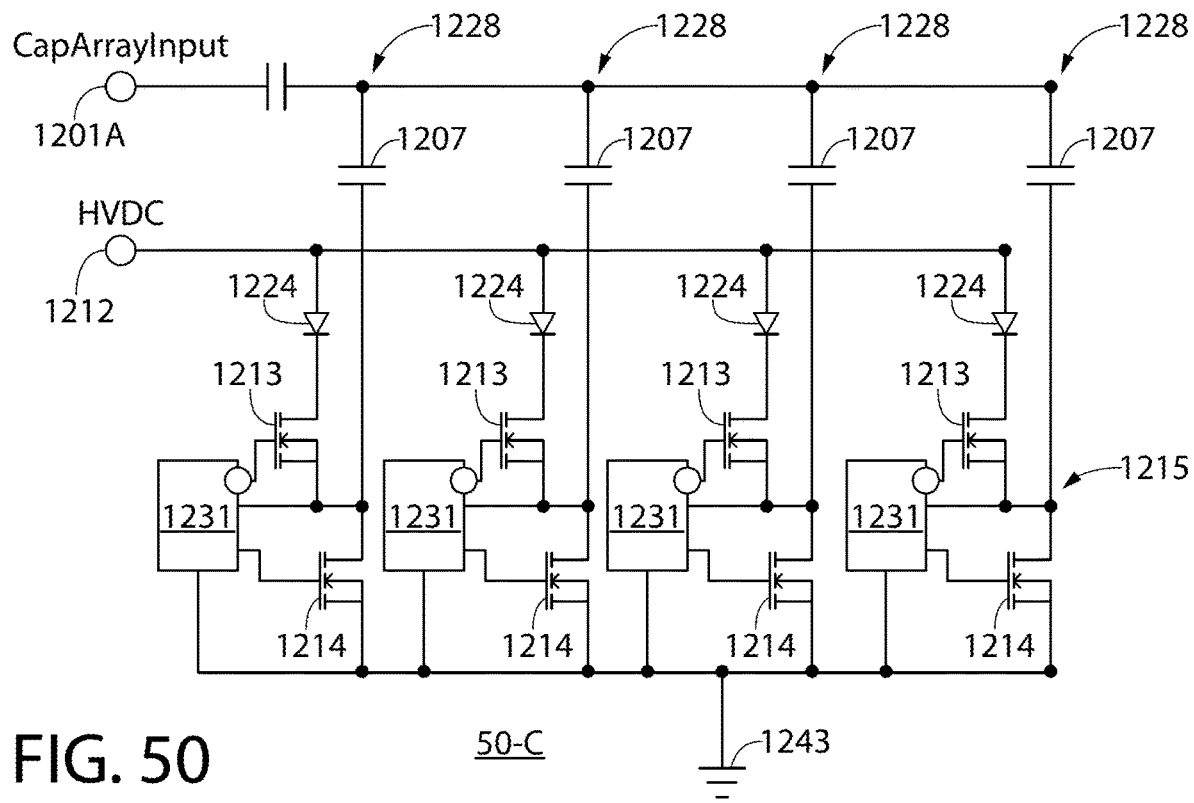
FIG. 50 is a schematic of an EVC utilizing drain-biased switching FETs and blocking diodes according to a first embodiment.
Figure 51:
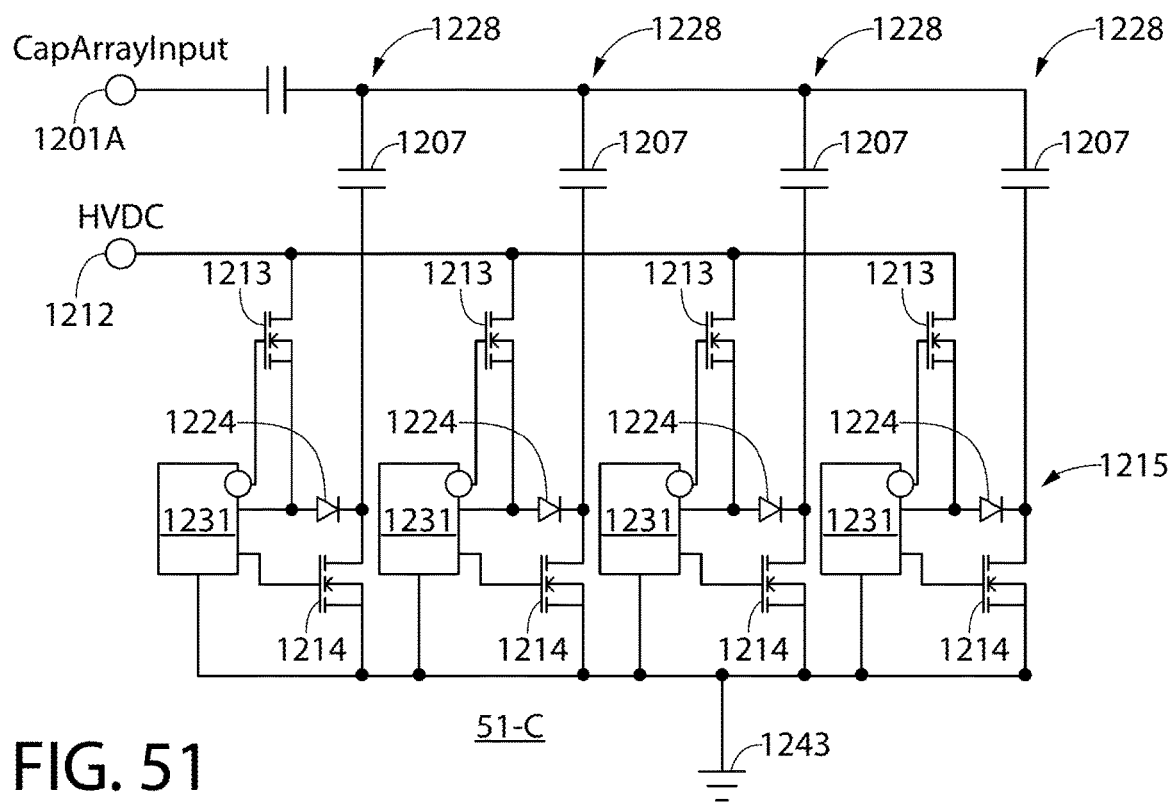
FIG. 51 is a schematic of an EVC utilizing drain-biased switching FETs and blocking diodes according to a second embodiment.

FIGS. 50 and 51 are schematics of EVCs using blocking diodes 1224 according to one embodiment. Specifically, FIG. 50 is a schematic of an EVC 50-C utilizing drain-biased switching FETs 1214 and blocking diodes 1224 according to a first embodiment, and FIG. 51 is a schematic of an EVC 51-C utilizing drain-biased switching FETs 1214 and blocking diodes 1224 according to a second embodiment. These designs use blocking diodes 1224 having a high voltage ratting and low parasitic capacitance. RF would be blocked by the blocking diode. A resistor or inductor could also be placed in series to help with isolation. This design, however, only provides a minimum bias voltage. As the RF amplitude increases, the DC offset will be equal to the biasing HVDC 1212 plus the RF peak voltage. Each channel 1228 of the exemplified EVCs includes an EVC input 1201A, a discrete capacitor 1207 to be switched in and out, a gate driver 1231, and a biasing FET 1213.

Figure 39:
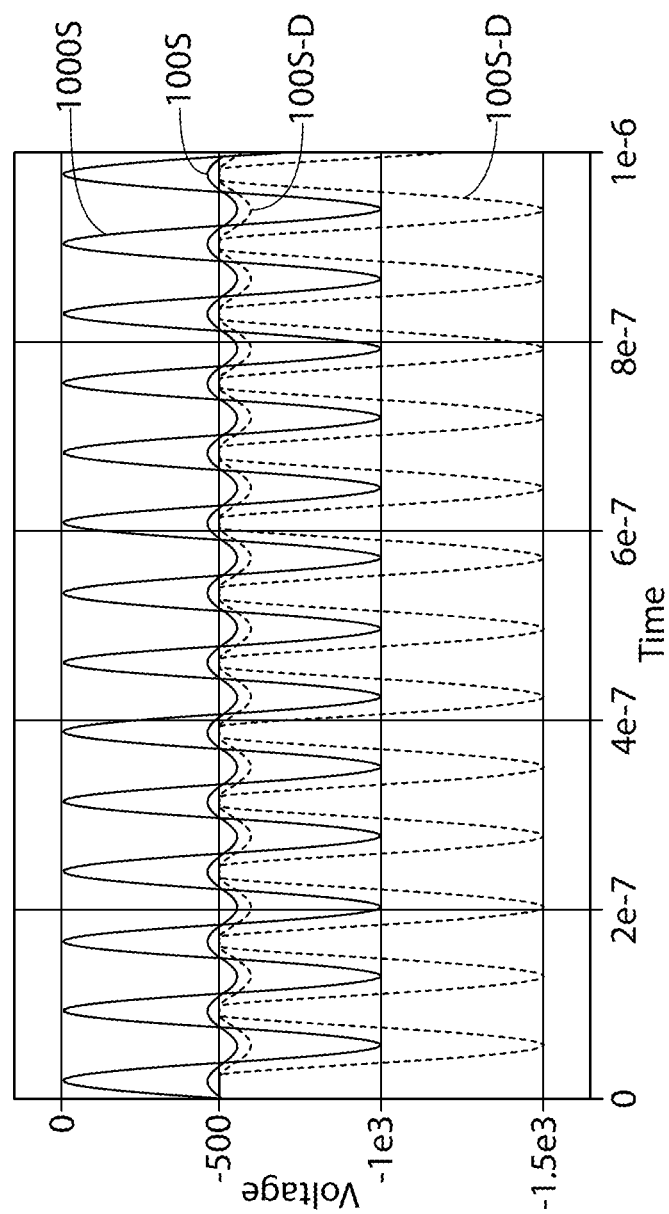
FIG. 39 is a graph of a simulation of for voltages across the switching FET and blocking diode of FIG. 50.

FIG. 39 is a graph of a simulation 100S-D for 100 Vpeak and a simulation 1000S-D for 1000 Vpeak for the voltage at the drain of the switching FET 1214 of FIG. 51, as well as a graph of a simulation 100S for 100 Vpeak and a simulation 1000S for 1000 Vpeak for the voltage at the source of the switching FET 1214 of FIG. 35B. A variable HVDC supply can fix the problem presented by the blocking diode 1224. The RF peak voltage would need to be measured. As the RF voltage increases the HVDC supply would decrease, keeping the offset at or slightly above the desired bias voltage.

Figure 52:
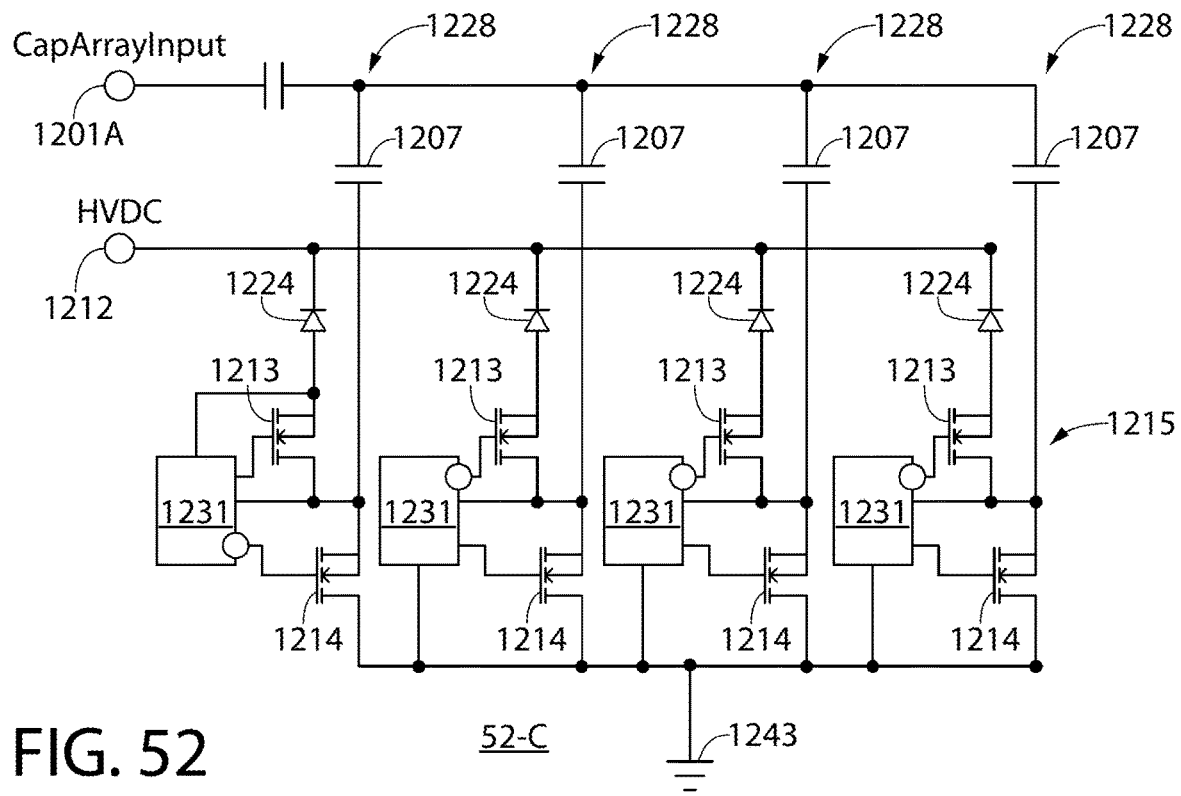
FIG. 52 is a schematic of an EVC utilizing source-biased switching FETs and blocking diodes according to a first embodiment.
Figure 53:
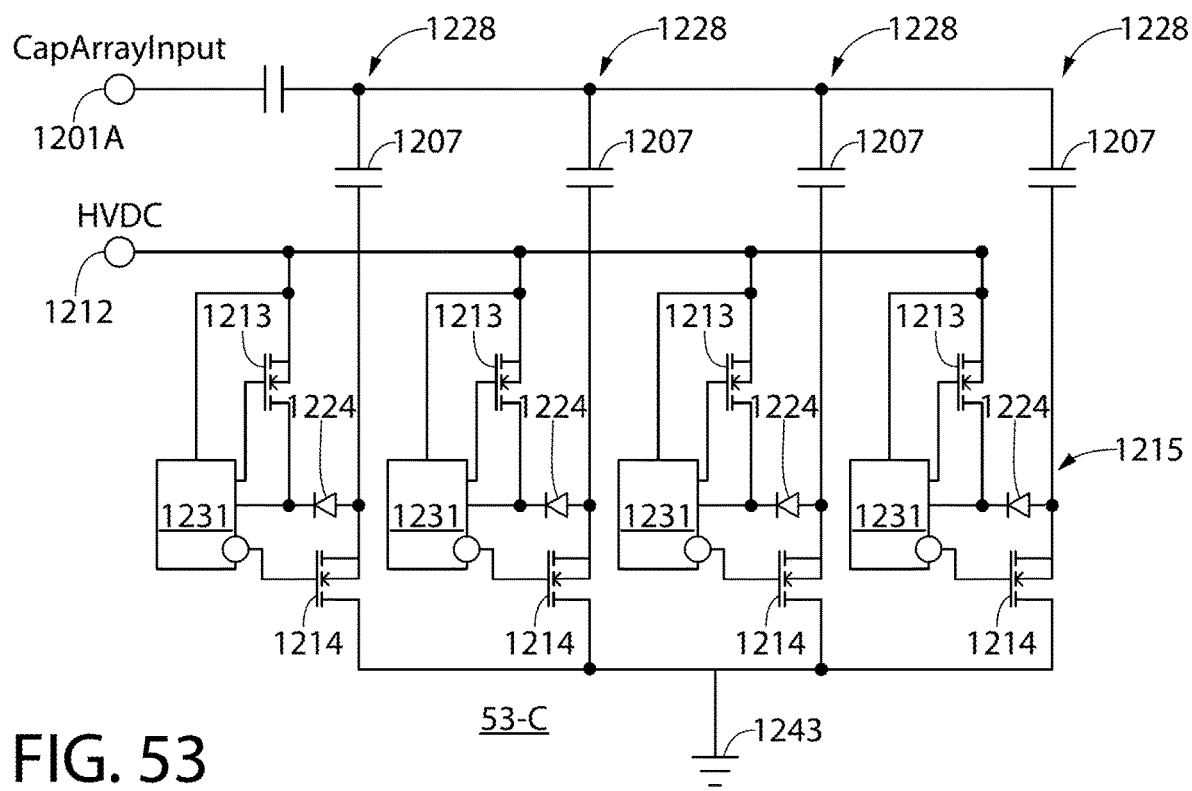
FIG. 53 is a schematic of an EVC utilizing source-biased switching FETs and blocking diodes according to a second embodiment.

FIGS. 52 and 53 are similar to FIGS. 50 and 51, respectively, but where the sources are biased instead of the drains. In these EVC designs 52-C, 53-C56, the biasing HVDC 1212 would be negative referenced to common ground 1243. Again, the DC offset may be equal to the HVDC and the RF peak voltage.

Figure 54:
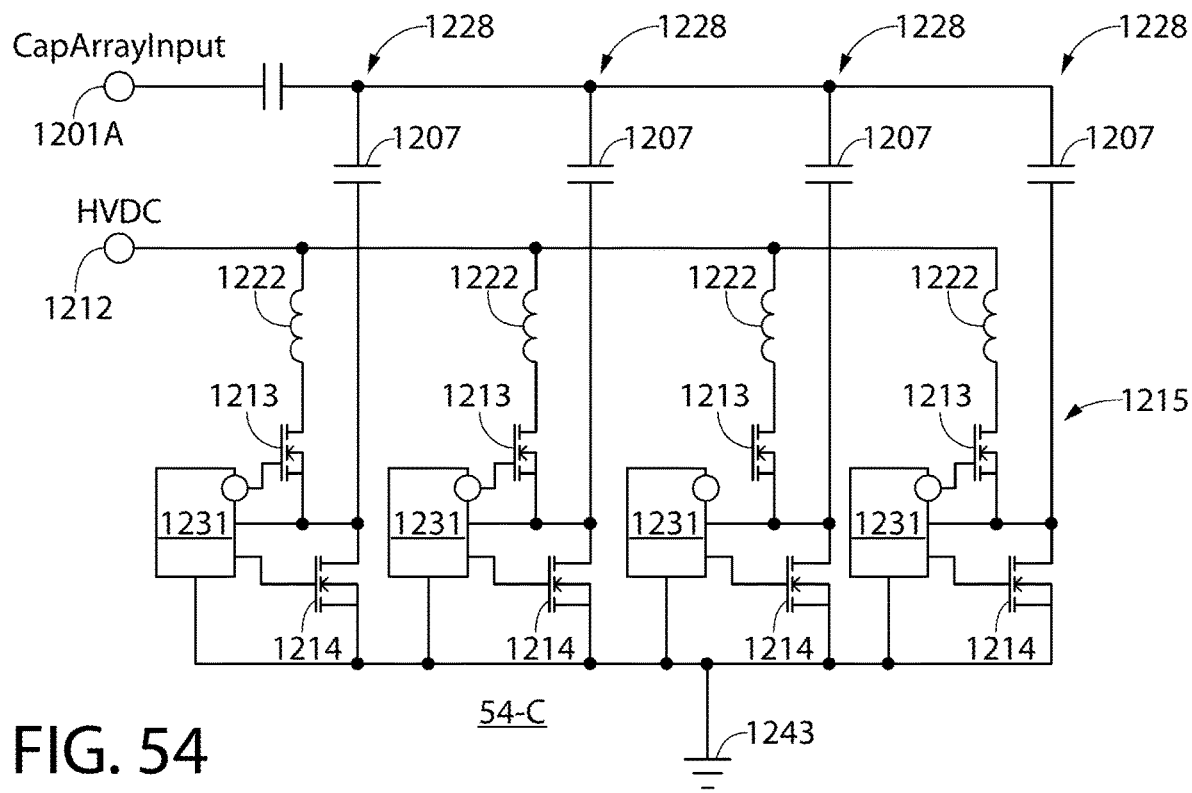
FIG. 54 is a schematic of an EVC utilizing drain-biased switching FETs and blocking chokes according to a first embodiment.
Figure 55:
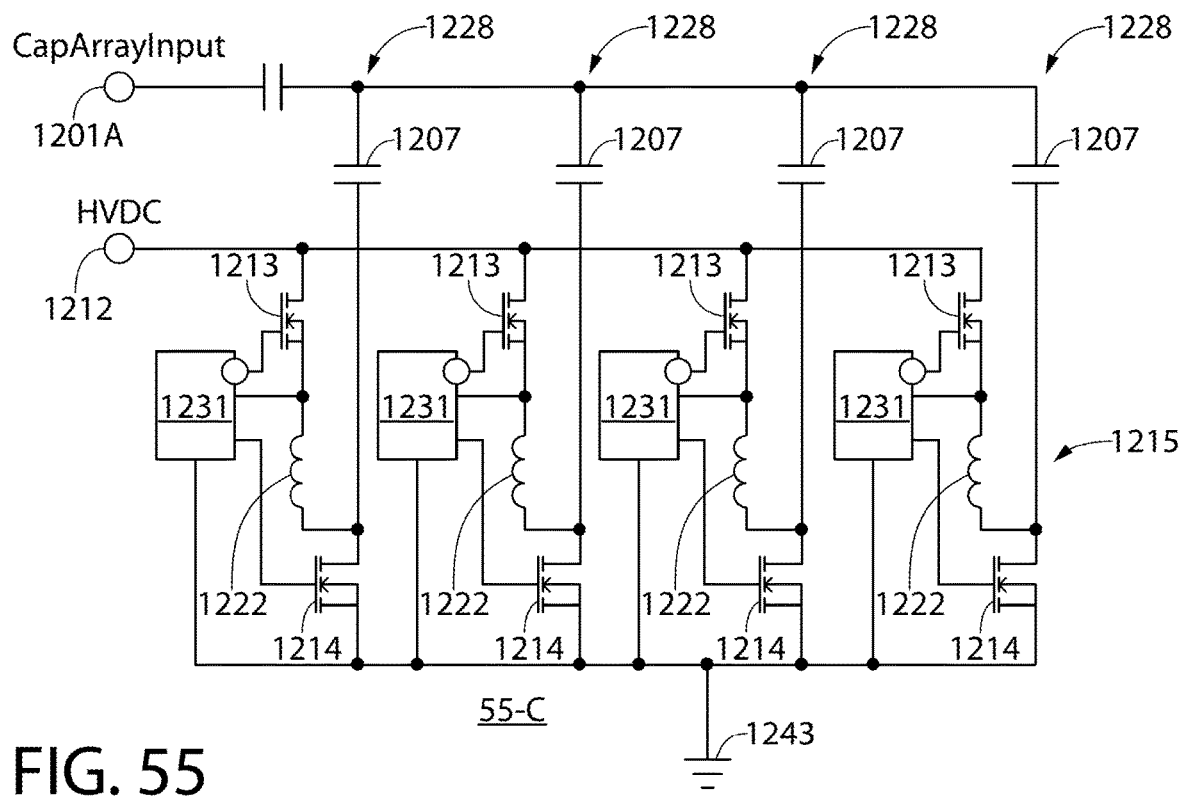
FIG. 55 is a schematic of an EVC utilizing drain-biased switching FETs and blocking chokes according to a second embodiment.

FIGS. 54 and 55 are schematics of EVCs using blocking chokes 1222 according to one embodiment. Specifically, FIG. 54 is a schematic of an EVC 54-C utilizing drain-biased switching FETs 1214 and blocking inductors 1222 according to a first embodiment. The choke 1222 is placed in series with each switching channel 1228. This will offer high RF isolation between channels and allow for the HVDC 1212 to have a low impedance when biasing the FETs. FIG. 55 is a schematic of an EVC 55-C utilizing drain-biased switching FETs 1214 and blocking chokes 1222 according to a second embodiment. According to this second embodiment, the noise getting to the FET would be low. A capacitor could also be placed in parallel with the top FET (biasing FET 1213) to help reduce the RF voltage drop across it. These embodiments utilize a low and high side gate driver 1231.

Figure 56:
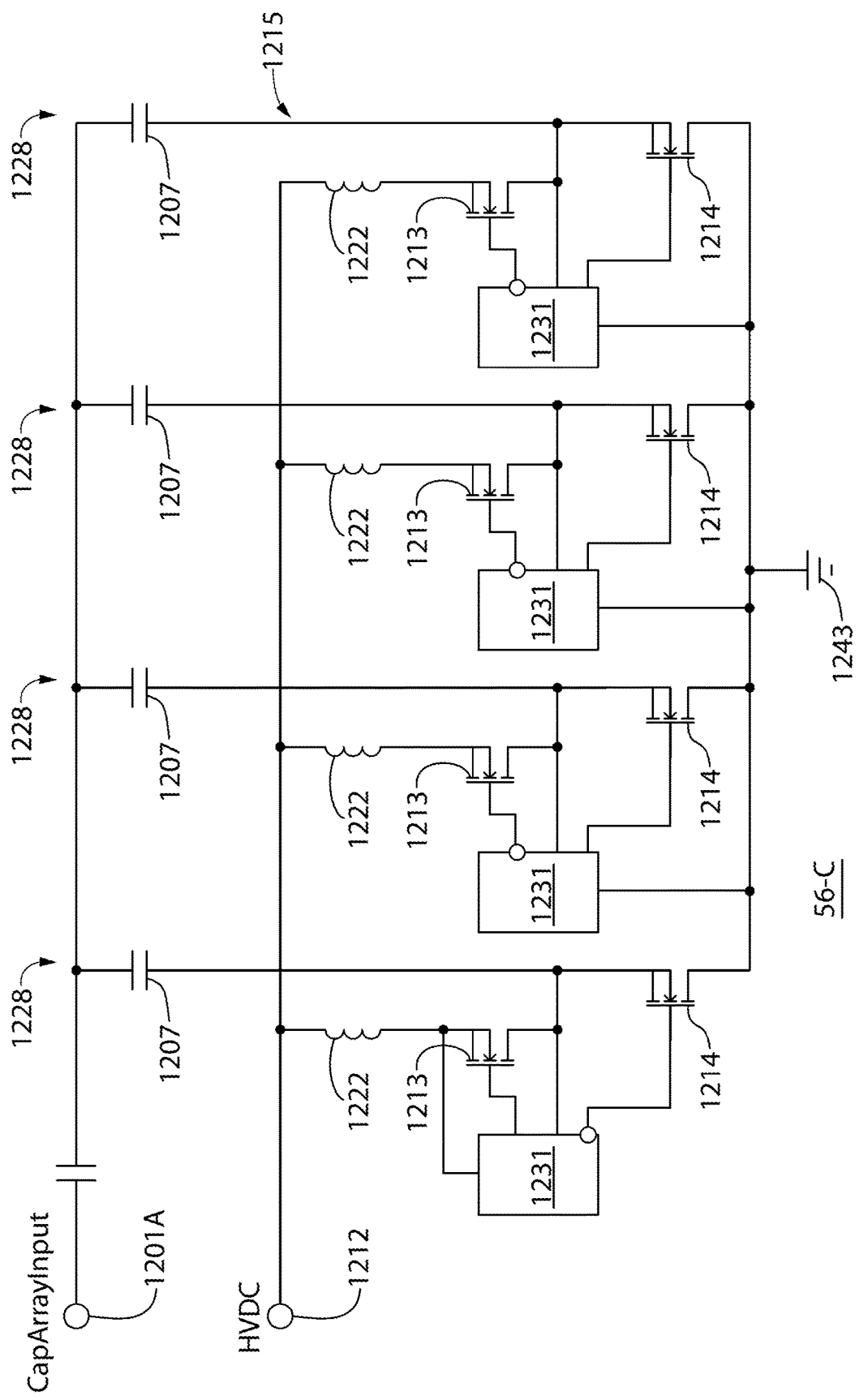
FIG. 56 is an EVC utilizing source-biased switching FETs and blocking inductors according to a first embodiment.
Figure 57:
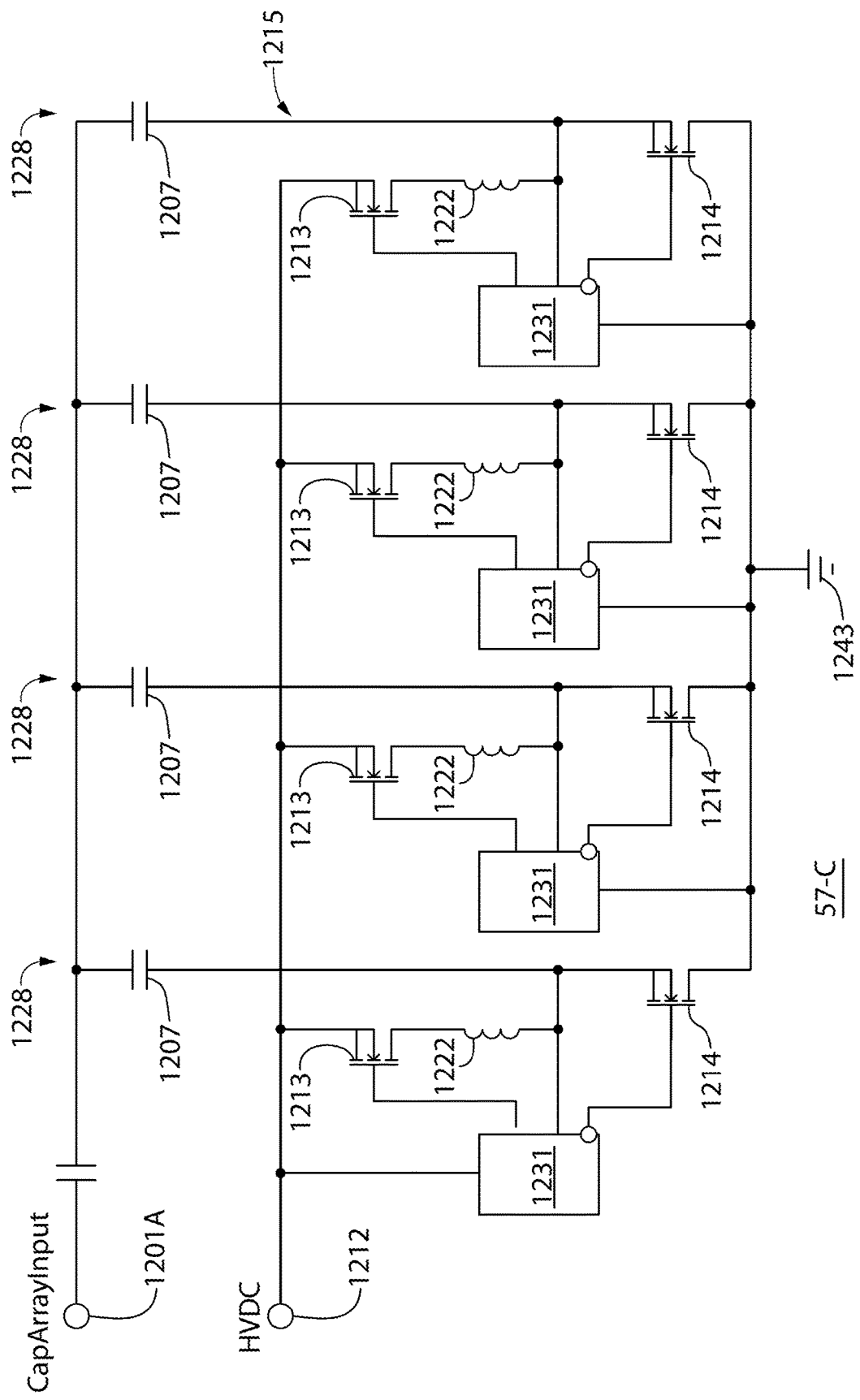
FIG. 57 is an EVC utilizing source-biased switching FETs and blocking inductors according to a second embodiment.

The higher RF isolation between channels 1228 will reduce the capacitance for each individual channel in the off case. This will drop the minimum capacitance. The low impedance for the HVDC 1212 will give the fastest possible switching. It's possible that the switching speed will cause some ringing on the inductor 1222. To reduce this, a resistor can be placed in series, slowing down the switching speed of the FETs. The resistor value can be much larger than in a typical PIN diode design, because there is no forward bias current. FIGS. 56 and 57 are similar to FIGS. 54 and 55, respectively, but where the sources are biased instead of the drains for the EVCs 56-C, 57-C.

Figure 58:
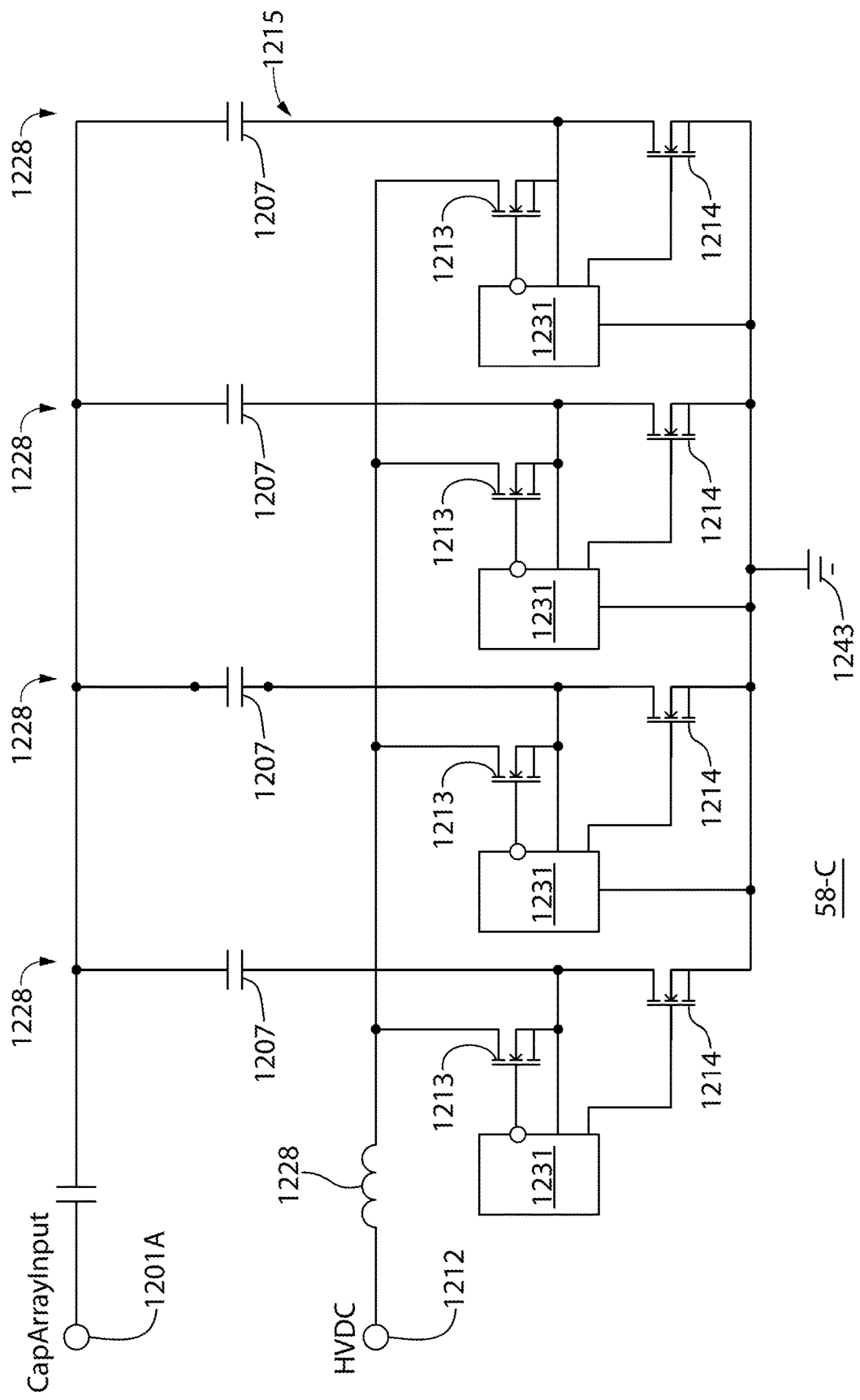
FIG. 58 is a schematic of an EVC utilizing drain-biased switching FETs and a single blocking choke according to one embodiment.
Figure 59:
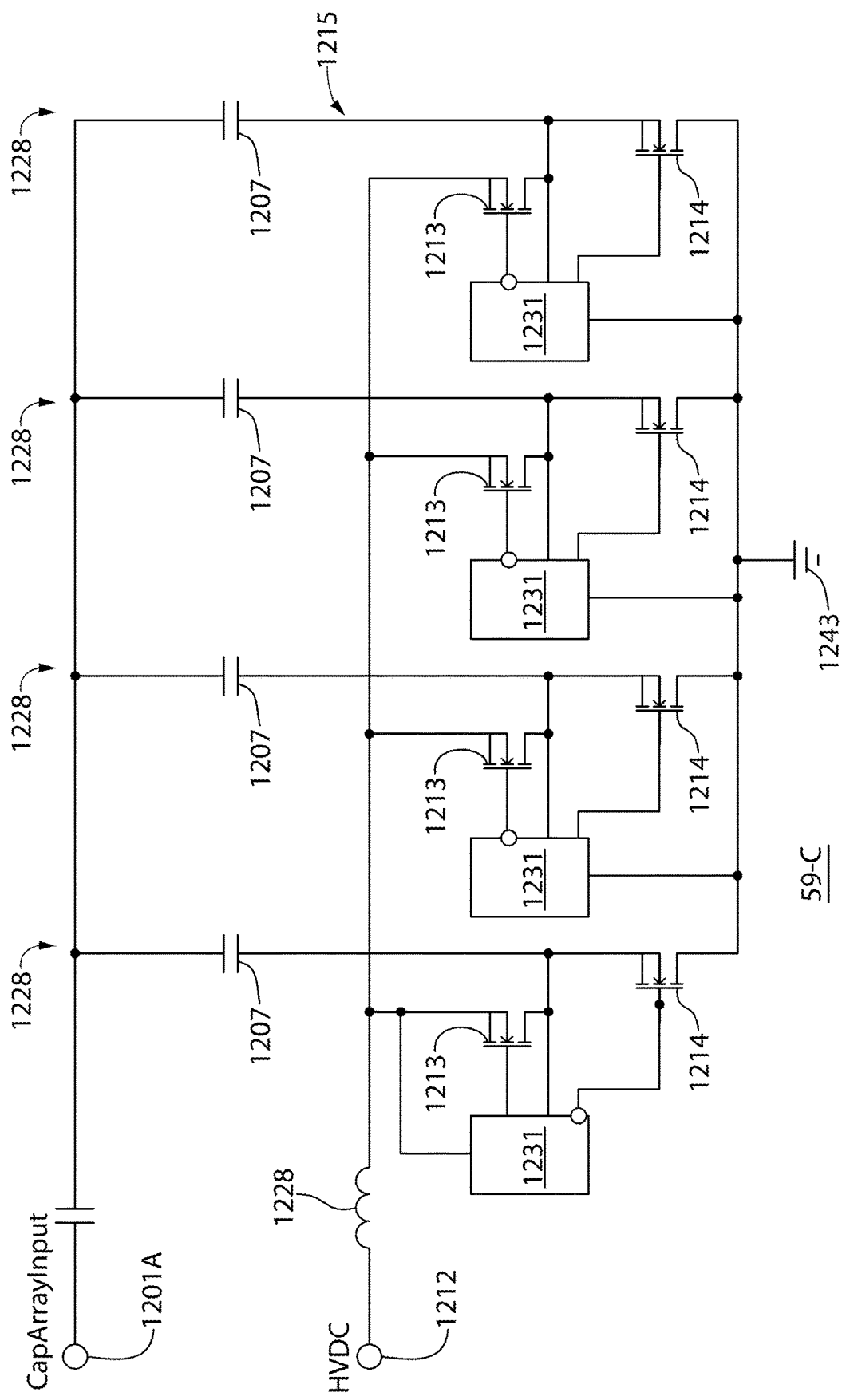
FIG. 59 is a schematic of an EVC utilizing source-biased switching FETs and a single blocking choke according to one embodiment.

FIGS. 58 and 59 are examples of EVCs using a single element 1228 to block RF. Specifically, FIG. 58 is a schematic of an EVC 58-C utilizing drain-biased switching FETs 1214 and a single blocking choke 1228 according to one embodiment, and FIG. 59 is a schematic of an EVC 59-C utilizing source-biased switching FETs 1214 and a single blocking choke 1228 according to another embodiment. Using a single blocking element 1228 would reduce the number of blocking elements and may reduce the required board space. The exemplified circuits use two FETs (a biasing FET 1213 and a switching FET 1214) in a half H-bridge configuration for each switching channel 1228. The single blocking choke 1228 would be used to block the RF current from going back to the HVDC supply 1212 when any of the biasing FETs 1213 are switched on.

Since all the channels 1228 are sharing one RF blocking element 1228, there is no isolation between channels. There are some things to consider because of this. The top biasing FET 1213 is the same as the switching FET 1214, because it will see the HVDC 1212 plus the full RF voltage. Further, the parasitic capacitance of all the channels 1228 will be in parallel. Thus, whether the other channels are on or off, there will be a FET's parasitic capacitance in parallel with the other channels that are off. This may reduce the range of the matching network.

Figure 40A:
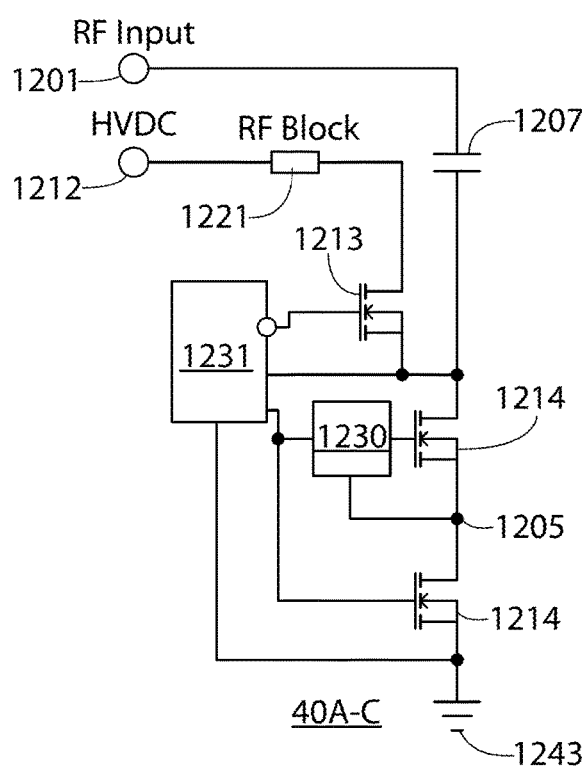
FIG. 40A is a FET-based switching circuit utilizing two switching FETs in series and a single biasing FET according to one embodiment.
Figure 40B:
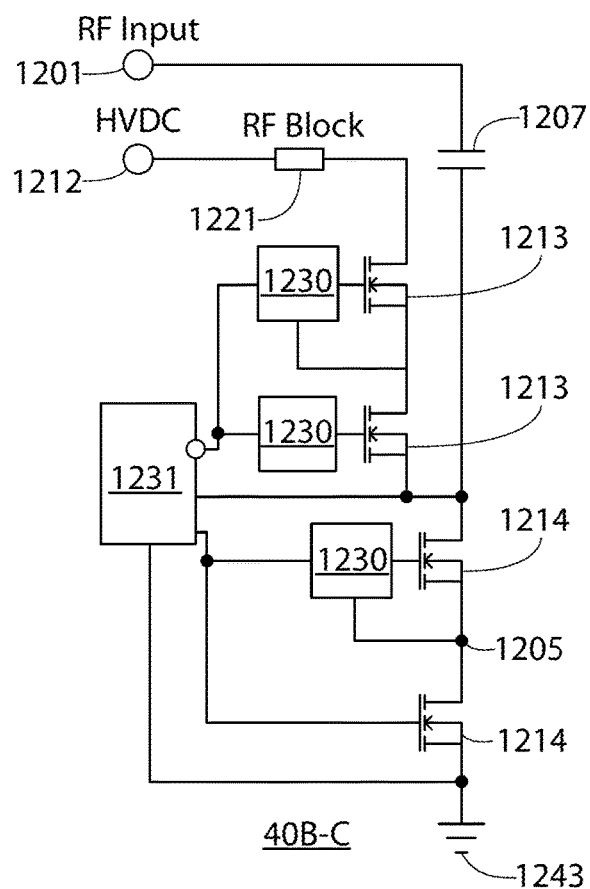
FIG. 40B is a FET-based switching circuit utilizing two switching FETs in series and two biasing FETs according to one embodiment.

It is possible to place multiple FETs in series to increase the maximum peak voltage. In the embodiments below, multiple gate drivers 1230, 1231 are be used. An input to the isolated driver was added to the left side of the driver to show how it is controlled by the half-bridge gate driver with programable deadtime. FIGS. 40A and 40B show examples of this. FIG. 40A is a FET-based switching circuit 40A-C utilizing two switching FETs 1214 in series and a single biasing FET 1213 according to one embodiment. FIG. 40B is a FET-based switching circuit 40B-C utilizing two switching FETs 1214 in series and two biasing FETs 1213 according to one embodiment. Note that these figures further include blocking elements 1221 and discrete capacitors 1207.

If there are two switching FETs 1214, the biasing FET 1213 would be chosen to have the same voltage rating. More FETs could also be stacked on the top if an even higher voltage is necessary or desired. If there are three or more switching FETs 1214, this would require more voltage on the biasing FET 1213. Since there is little to no RF current, the biasing FET 1213 could be a less expensive part with a lower voltage rating. With this scenario, it may be a cost advantage to have multiple biasing FETs 1213. A challenge of this setup is that the sharing of voltages may not be uniform across FETs. For example, the RF voltage, due to parasitic capacitance to ground 1243 from the layout, could have a larger drop across the first switching FET, than the subsequent switching FET(s) closer to ground 1243. The DC voltage may also take time to trickle down to the FETs closer to ground when the FETs are switched to the off state. These unequal sharing may cause damage to the FETs.

Design 2: Voltage Bias to Common Node of FETs

Figure 41:
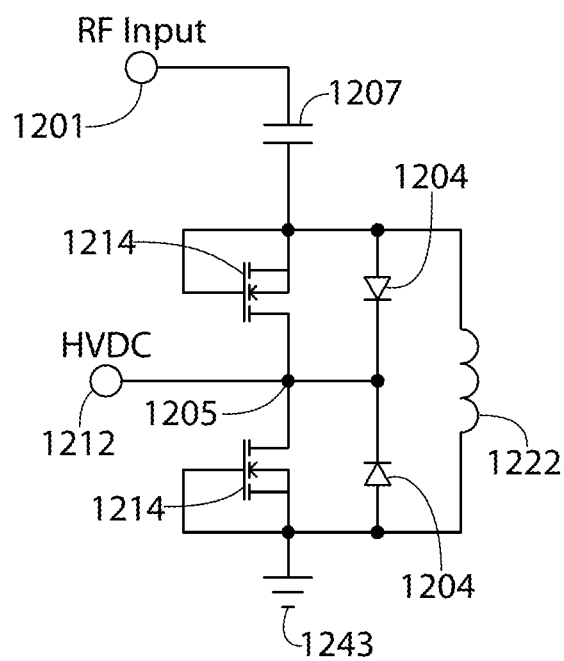
FIG. 41 is a FET-based switching circuit utilizing two switching FETs biased at a common drain according to one embodiment.

The Design 2 described below takes Design 1 with the opposing FETs and adds the bias voltage to the FETs' common node. FIG. 41 is a FET-based switching circuit 41-C utilizing two switching FETs 1214 biased at a common drain 1205 according to one embodiment to switch in and out discrete capacitor 1207. The exemplified drains are biased with a negative high voltage from the HVDC 1212. The switching circuit 41-C includes an RF input 1201, a common ground 1243, and the body diodes 1204 of the FETs 1214.

Figure 42:
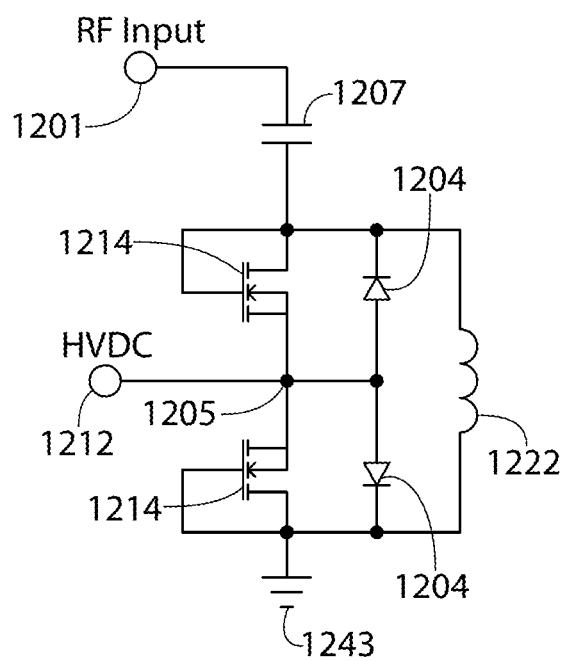
FIG. 42 is a FET-based switching circuit utilizing two switching FETs biased at a common source according to one embodiment.
Figure 60:
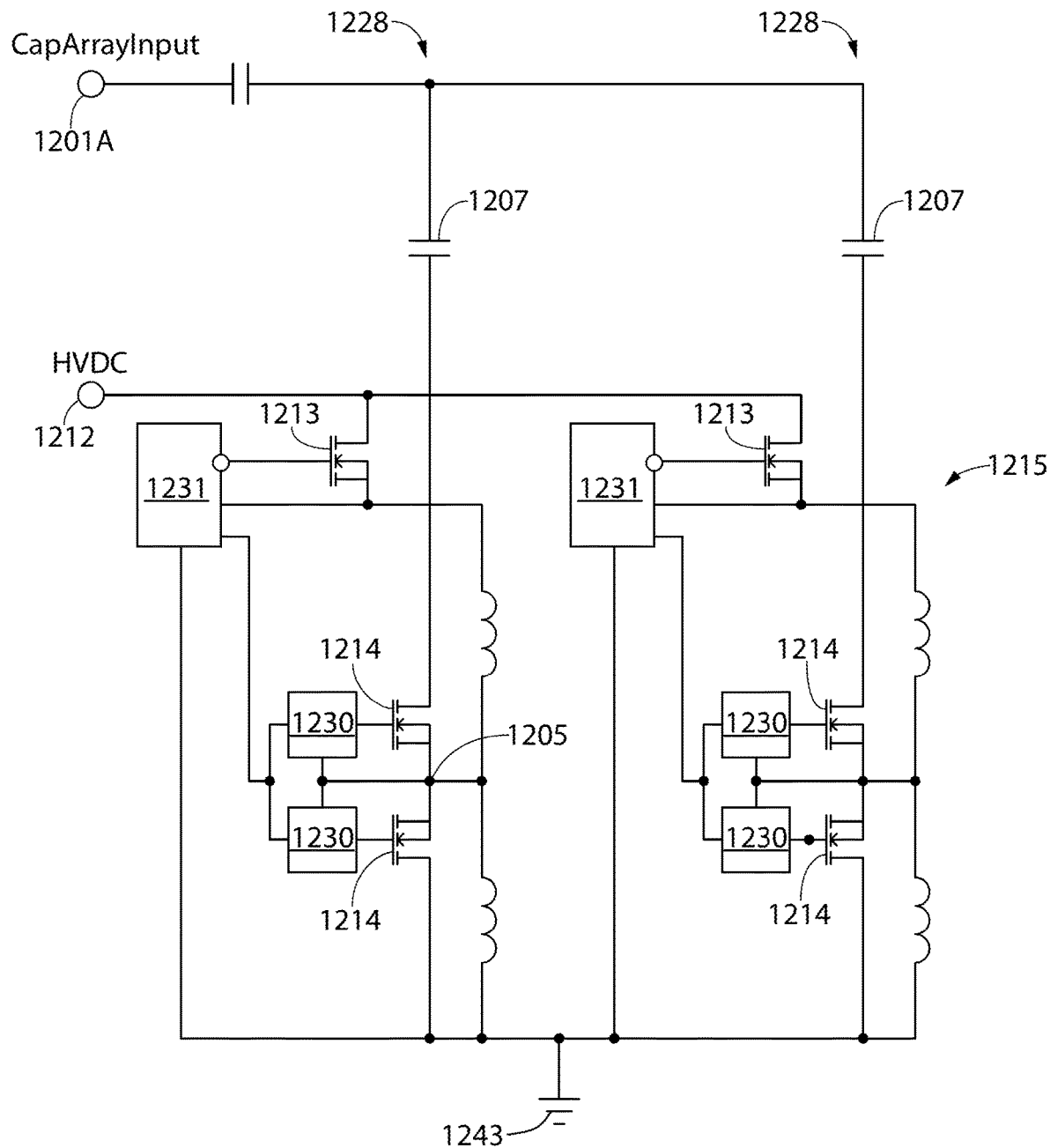
FIG. 60 is a schematic of an EVC utilizing two switching FETs in series that are biased at a common source according to one embodiment.

FIG. 42 is a FET-based switching circuit 42-C utilizing two switching FETs biased at a common source 1205 according to one embodiment. In this embodiment, the sources are biased with a positive high voltage from the HVDC 1212. Both circuits use a low impedance DC ground reference 1243, using a circuit element (blocking choke 1222) to block the RF. A diode cannot be used in these embodiments for blocking, as a diode would rectify the RF. Further, a blocking resistor would require a value on the order of a FET's off resistance and will increase losses. Thus, this design utilizes a choke 1222. An example of a common source circuit can be found at FIG. 60. Specifically, FIG. 60 is a schematic of an EVC 60-C utilizing two switching FETs 1214 in series that are biased at a common source 1205 according to one embodiment. This figure uses two channels 1218 for two discrete capacitors 1207, but any number can be placed in parallel to achieve the desired capacitance range. It is noted that the EVC 60-C further includes in each channel a biasing FET 1213 and gate drivers 1230, 1231.

This circuit can be implemented in series mode as well. FIGS. 43-46 provide various examples of the series mode implementation. FETs can be placed in series as well, to increase the voltage handling, as with Design 1. Similar to FIGS. 37A and 37B discussed above, rather than switching in a single discrete capacitor, two capacitors 1207 are switched in to form a discrete capacitance that is switched in. The invention, however, is not so limited.

Figure 43:
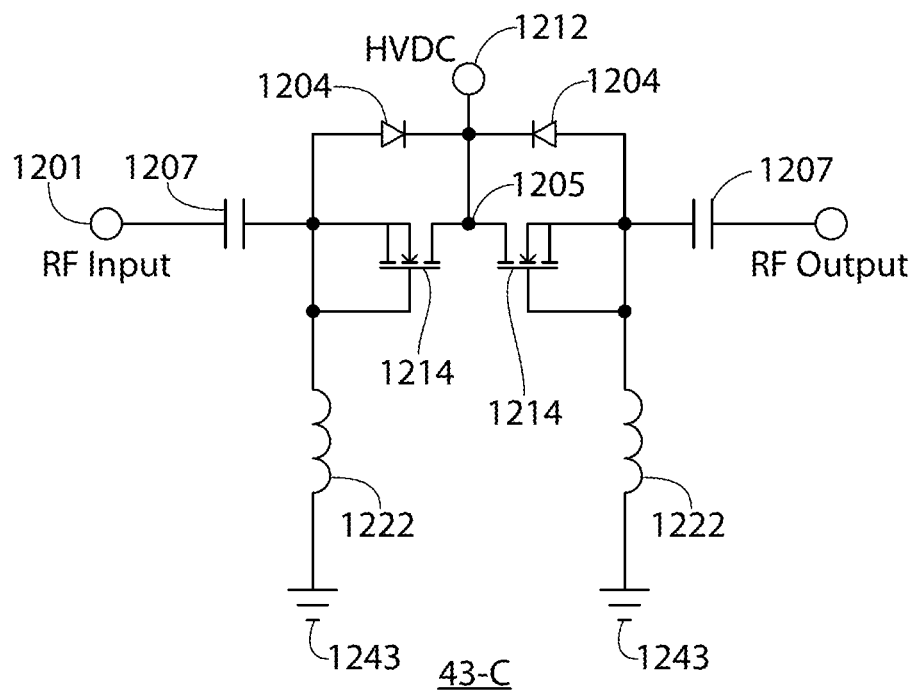
FIG. 43 is a FET-based switching circuit where two switching FETs are in series and biased at a common drain, and the switching circuit utilizes two RF chokes.
Figure 44:
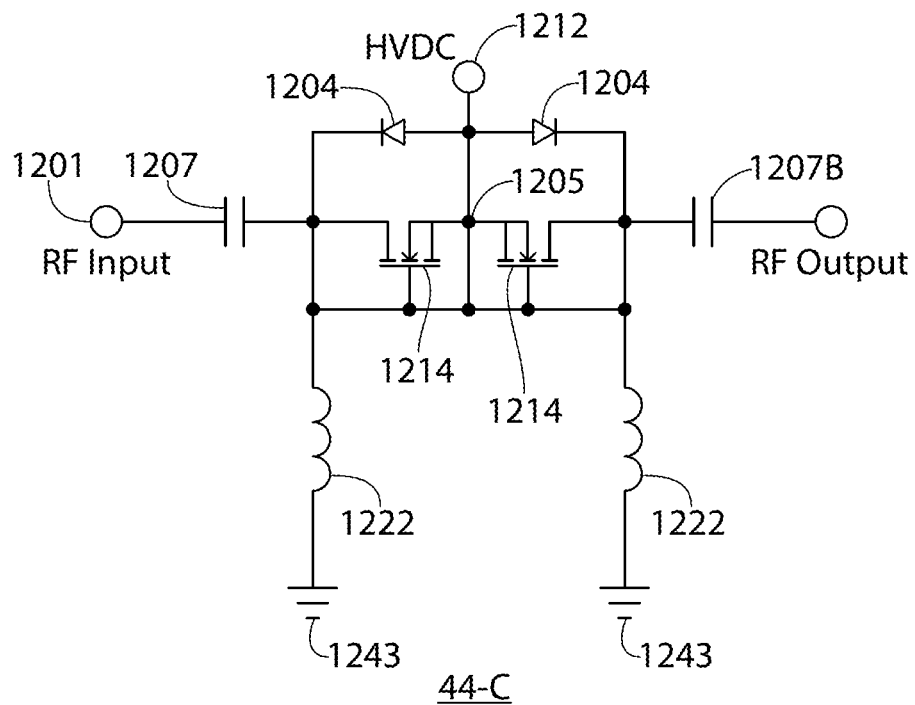
FIG. 44 is a FET-based switching circuit where two switching FETs are in series and biased at a common source, and the switching circuit utilizes two RF chokes.
Figure 45:
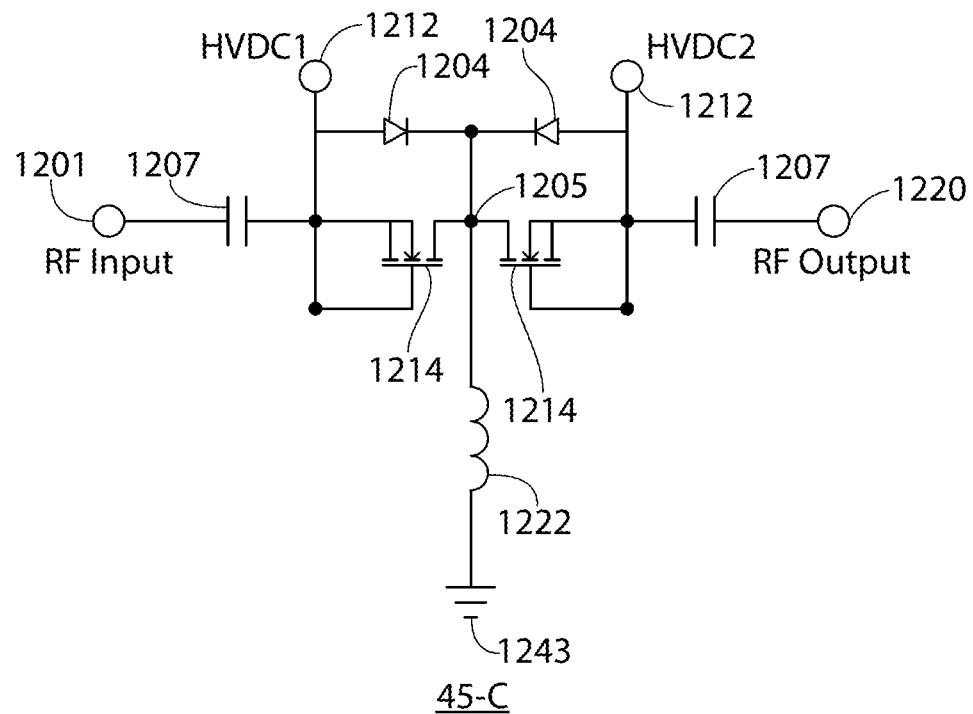
FIG. 45 is a FET-based switching circuit where two switching FETs are in series and biased at a common drain, and the switching circuit utilizes a single RF choke.
Figure 46:
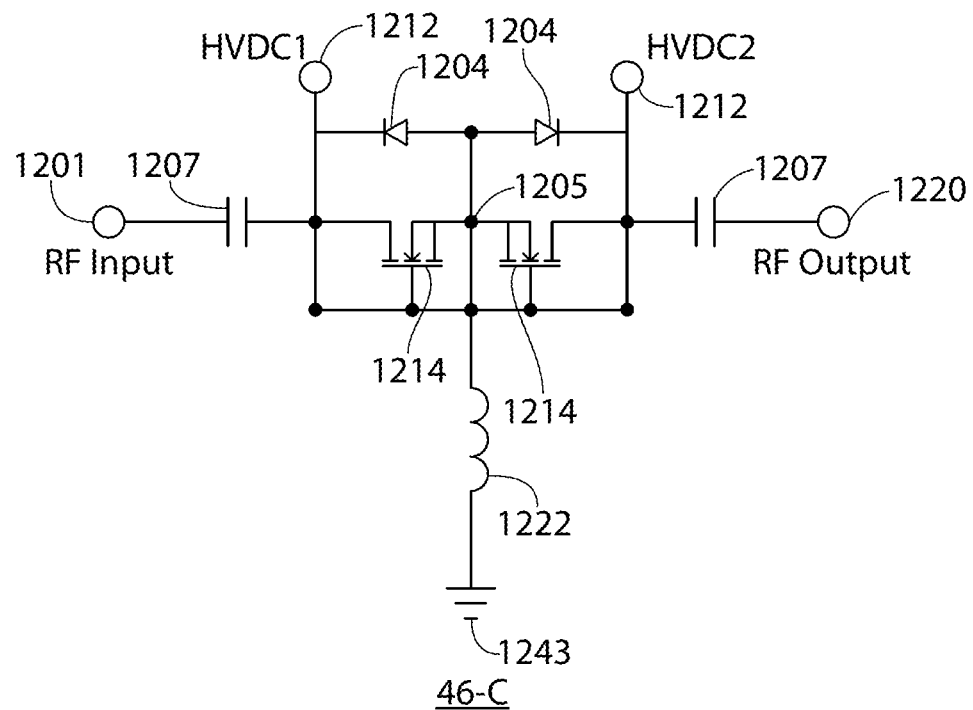
FIG. 46 is a FET-based switching circuit where two switching FETs are in series and biased at a common source, and the switching circuit utilizes a single RF choke.

Specifically, FIG. 43 is a FET-based switching circuit 43-C where two switching FETs 1214 are in series and biased at a common drain 1205, and the switching circuit utilizes two RF chokes 1222. FIG. 44 is a FET-based switching circuit 44-C where two switching FETs 1214 are in series and biased at a common source 1205, and the switching circuit utilizes two RF chokes 1222. FIG. 45 is a FET-based switching circuit 45-C where two switching FETs 1214 are in series and biased at a common drain 1205, and the switching circuit utilizes a single RF choke 1222. Finally, FIG. 46 is a FET-based switching circuit 46-C where two switching FETs 1214 are in series and biased at a common source 1205, and the switching circuit utilizes a single RF choke 1222.

Design 2 has several advantages. The applied bias will keep it from varying with amplitude and reduce the parasitic capacitance to a minimum. The HVDC bias can be set to be equal to the offset that is generated by the rectification of the body diode at the maximum RF peak voltage. Thus, unlike the Design 1, there is no reduction in the maximum RF voltage from the existing design.

Figure 47:
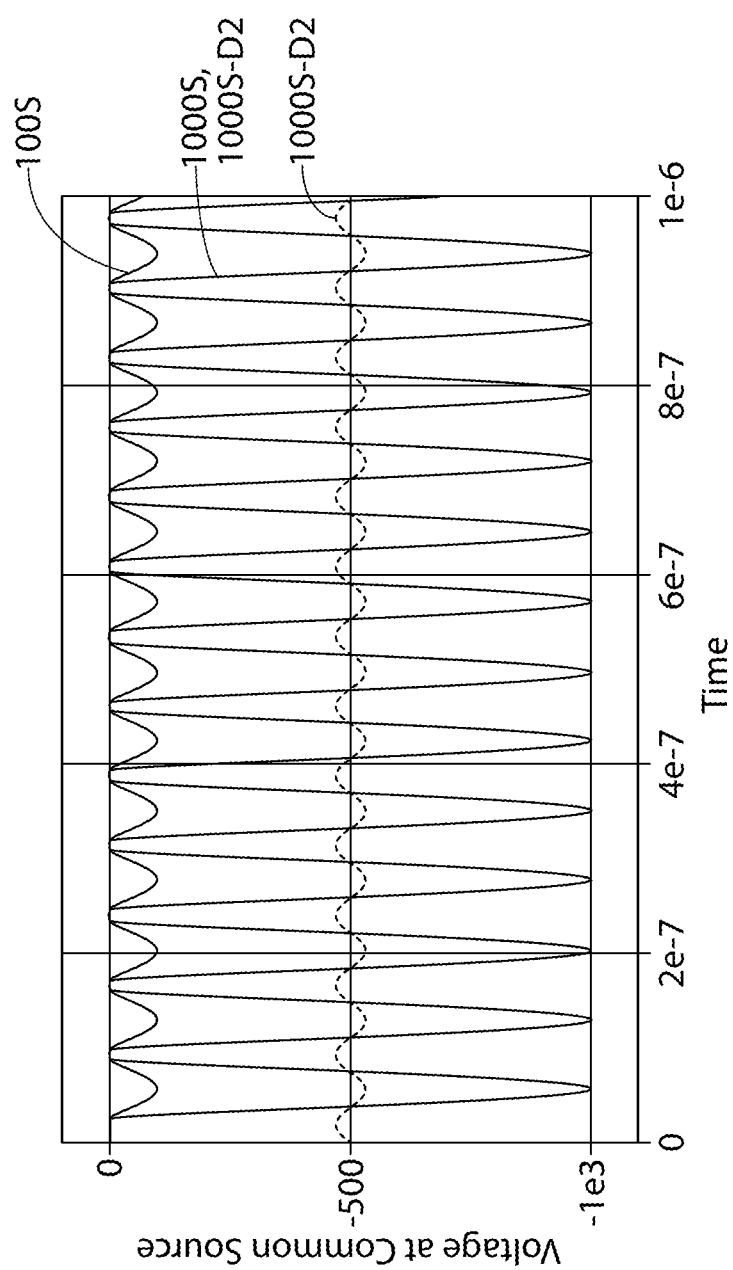
FIG. 47 is a graph providing simulations comparing common source voltages for Design 1 and Design 2 as described herein.

FIG. 47 shows a comparison of common source voltages for Design 2 and the design of FIG. 32A (which is self-biased). Specifically, FIG. 47 is a graph of the simulations 100S for 100 Vpeak for FIG. 32A, 100S-D2 for 100 Vpeak for Design 2, 1000S for 1000 Vpeak for FIG. 32A, and 1000S-D2 for 1000 Vpeak for Design 2. Design 2 may be complicated to implement and high in cost, and may also suffer from some of the issues discussed with regard to Design 1. Note that while the embodiments for Design 1 and Design 2 discussed above utilize a FET, in other embodiments other transistors or switches (such as a BJT) may be used.

The above-described switching circuit and EVC designs may be used as part of a method for providing an impedance match, where an impedance is matched by at least one of the switching circuits of the EVC switching in or out its corresponding discrete capacitor to alter a total capacitance of the EVC. Further, this method of matching an impedance can form part of a method for fabricating a semiconductor, such as those methods for fabricating a semiconductor discussed above. Further, the exemplified switching circuits and EVCs may form part of a matching network, which together with a plasma chamber may form part of a semiconductor processing tool, similar to those semiconductor processing tools discussed herein.

Amplitude and Phase Detection Circuit

In certain embodiments, EVC-based RF impedance matching networks use an S-Map and an input sensor to calculate the best match configuration. The S-Map (which may form part of the control circuit 38 of FIG. 23A) is used to generate the impedance and tune tables. The input sensor (such as input sensor 32 of FIG. 23A), may include a voltage-current sensor (V-I sensor) to determine the amplitude of the voltage and the amplitude of the current at an input (such as RF input 101 of FIG. 23A). Regarding the input sensor, Applicant's U.S. Pat. Pub. 20160134260 is incorporated herein by reference in its entirety (where the input sensor is sometimes referred to as an "RF sensor"). To calculate the input impedance, the input sensor (sometimes referred to herein as "detection circuit") may also include a phase detector to measure the phase difference between the two relevant signals-namely, a current signal representative of the current amplitude, and a voltage signal representative of the voltage amplitude.

With variable-frequency applications, the S-Map and the input sensor need to know and account for the changes in frequency. For the S-Map, simply measuring at all the potential frequencies and generating tables to include each of them is adequate.

Figure 61:
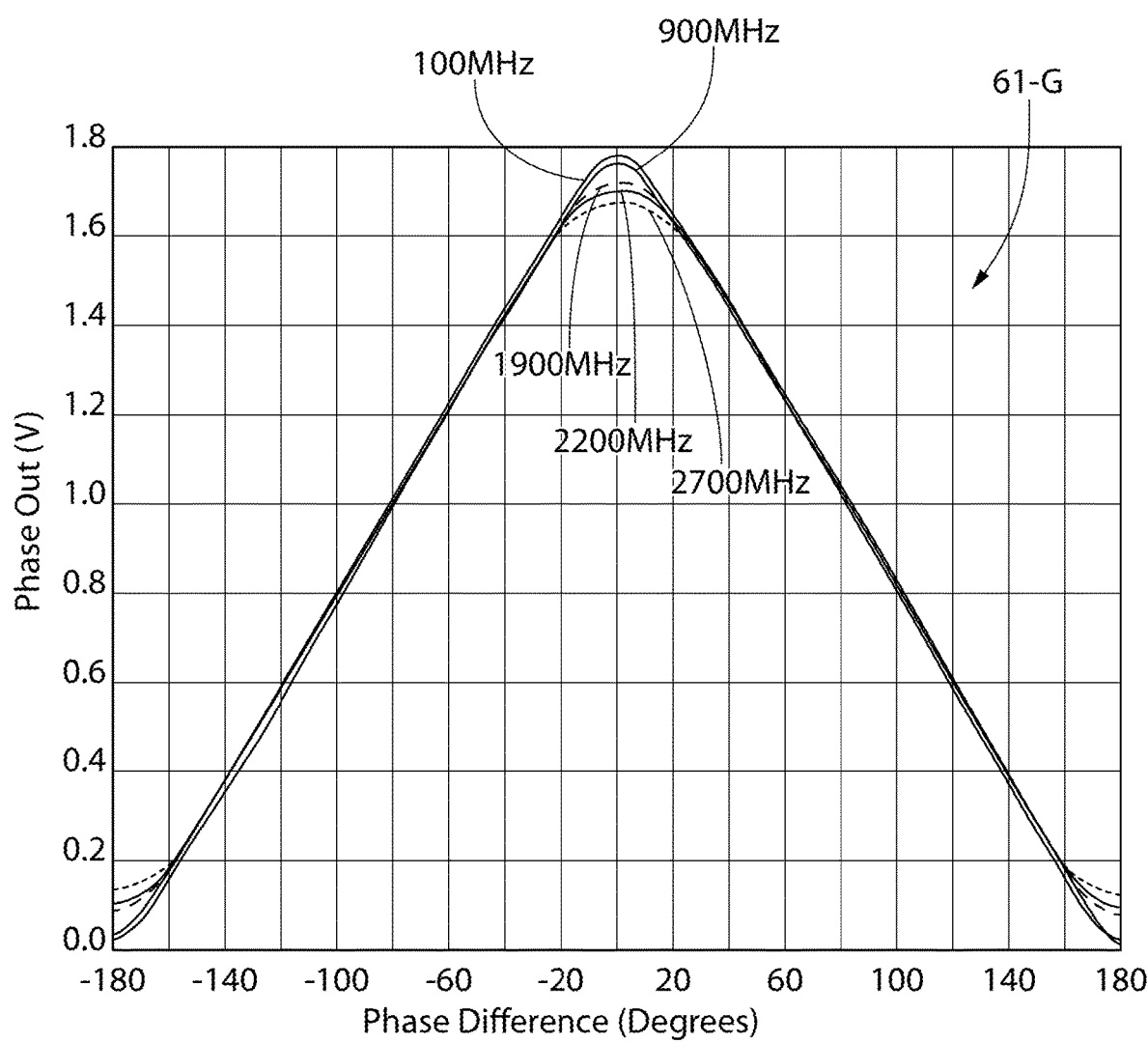
FIG. 61 is a graph showing phase output vs. input phase different for different frequencies for a phase and gain detector according to one embodiment.

The V-I sensor has an issue with the phase detector. The phase angle between the voltage and the current varies between ±90°, depending on the impedance. Of the various types of phase detectors, mixers, XOR gates, etc., the linear range is generally from 0° to ±1800, as shown in FIG. 61, which is a graph 61-G showing phase output vs. input phase difference for different frequencies for a phase and gain detector according to one embodiment. The phase detector requires a 90° phase offset of either the voltage signal or the current signal to center the phase out signal on one of the linear slopes. If this is not done, the phase detector cannot distinguish a positive phase angle from a negative one.

Figure 62:
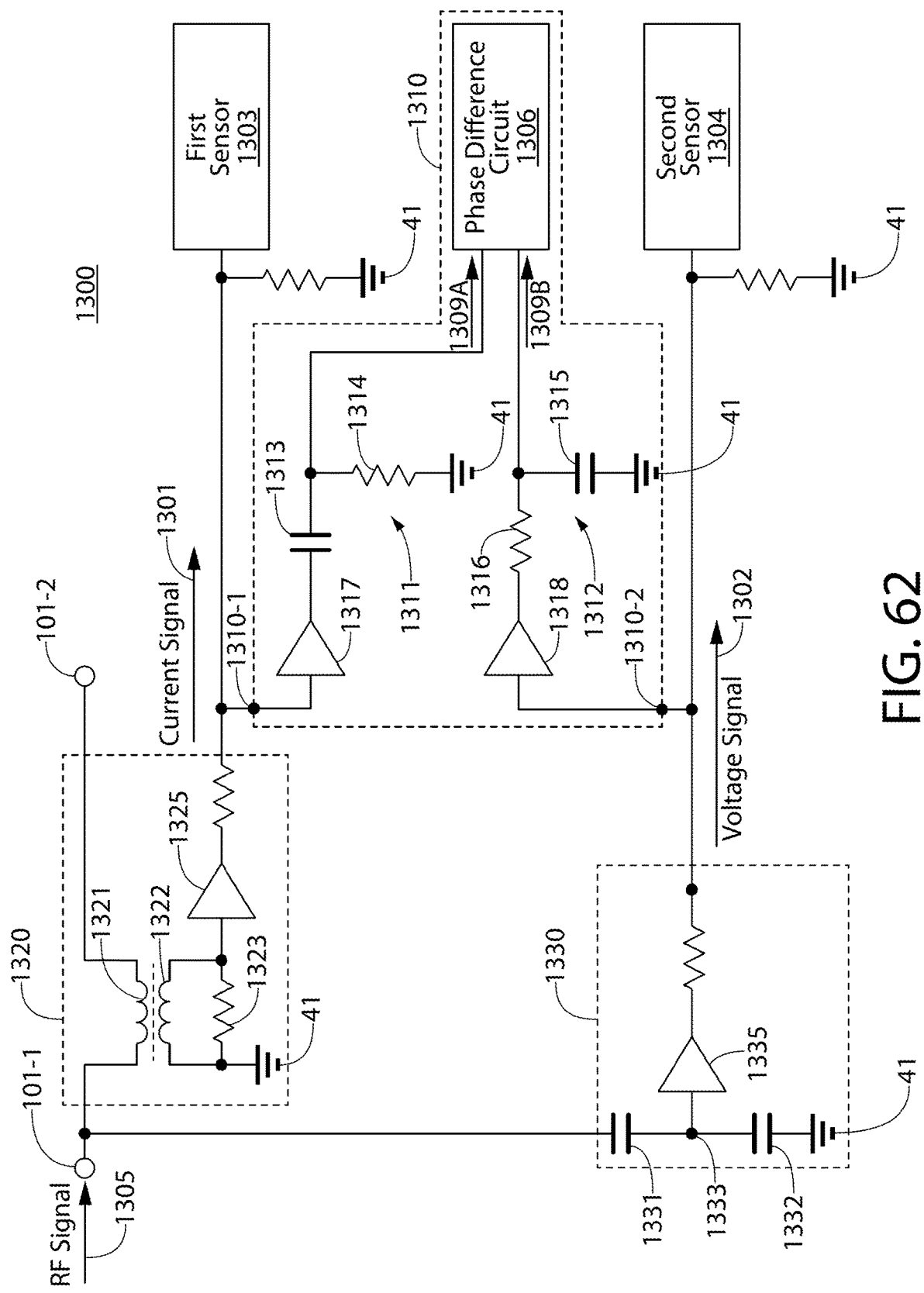
FIG. 62 is a schematic of a detection circuit for detecting voltage amplitude, current amplitude, and phase difference according to one embodiment.

FIG. 62 is a schematic of a new detection circuit 1300 that enables measurement of the voltage amplitude, current amplitude, and phase difference for an RF signal 1305 while providing a 90° phase offset. The detection circuit 1300 includes three main components: a phase detection circuit 1310, a current detection circuit 1320, and a voltage detection circuit 1330. These respective circuits and their sub-components will be discussed in more detail below. This detection circuit 1300 may form part of a variety of larger systems. In one embodiment, the detection circuit 1300 forms part of the matching network 44 of FIG. 23A. In this case, the detection circuit 1300 is the sensor 32 at the RF input 101. The sensor 32 input 101-1 and output 101-2 correspond with the detection circuit 1300 input 101-1 and output 101-2. It is noted that the detection circuit is not limited to use with the matching network 44 of 23A and may be used with a variety of other types of matching networks. It is further noted that the disclosed main components of the detection circuit 1300 (a phase detection circuit 1310, a current detection circuit 1320, and a voltage detection circuit 1330) need not be used together. For example, the invention may consist of the phase detection circuit alone or in use with other types of current and/or voltage detection circuits. Further, the term "phase detection circuit" may refer to a circuit for detecting phase (such as phase detection circuit) that further includes a current detection circuit and/or a voltage detection circuit. The term "phase detection circuit" is not limited to circuits that only detect phase.

Generally speaking, in the exemplified embodiment of FIG. 62, the current detection circuit 1320 is coupled between the current signal input 1310-1 of the phase detection circuit 1310 and a detection circuit input 101-1 receiving the RF signal 1305, the current detection circuit configured to output the current signal 1301 indicative of the current amplitude of the RF signal at the RF input. Further, the voltage detection circuit 1330 is coupled between the voltage signal input 1310-2 of the phase detection circuit 1310 and a detection circuit input 101-1 receiving the RF signal 1305, the voltage detection circuit configured to output the voltage signal 1302 indicative of the voltage amplitude of the RF signal at the RF input. These circuits will be discussed in more detail below.

Regarding measure voltage amplitude, a simple and accurate circuit for measuring RF voltage is a capacitive voltage divider. An example of a voltage divider is shown as part of voltage detection circuit 1330. The voltage divider uses two capacitors 1331, 1332 of different values, one 1331 that is a high impedance, and one 1332 that is a low impedance. The two capacitors are placed in series, and the high impedance capacitor 1331 is coupled to the node 1333 being measured, in this case detection circuit input 101-1, and the low impedance capacitor is coupled to common ground 41. The common node 1333 between the two capacitors gives some reduced ratio of the input voltage. A second sensor 1304 detects a parameter (e.g., voltage) of the voltage signal 1302 indicative of the voltage amplitude of the RF signal 1305. The main advantage of this design is that it has an extremely flat amplitude response as frequency is swept across a broad range and is very repeatable. It is noted that the detection circuit is not limited to a voltage divider, as other circuits for measuring voltage amplitude may be used.

As for measuring current amplitude, there are various methods to do this. For example, the system may measure magnetic flux, which is proportional to current flow. Measuring the magnetic flux is accomplished by using one or more inductors to pick up the field generated by the current flowing through the input. This is essentially a loosely coupled transformer. This is equivalent to the component being placed in series but is reduced by the impedance ratio, having very little impact on the matching unit. Measuring the voltage drop across a component in series with the inductors will be proportional to the current.

An example of such a circuit is shown as part of current detection circuit 1320. In this circuit, inductor 1322 picks up the field generated by inductor 1321 of the current flowing through the detection circuit input 101-1. Resistor 1323 is the component in series with the inductor 1322 across which the voltage drop may be measured. A first sensor 1303 detects a parameter (e.g., voltage) of the current signal 1301 indicative of the current amplitude of the RF signal 1305. For example, the first sensor may detect a voltage that is proportional the current of the current signal 1301.

An advantage of measuring voltage drop across a component is, when using a reactive element, such as a capacitor or an inductor, the phase difference, in reference to the V-sensor, is a constant 90° across frequency. A disadvantage of using a capacitor is it will vary its amplitude as frequency is swept, because the capacitor's impedance changes inversely with frequency when measuring a nonreactive load at RF out. If the frequency was not varied, this would be a viable option. However, when in a variable frequency system, this may require either a frequency dependent compensation, or a two-dimensional, frequency to amplitude, calibration table. Either of these would require additional steps during calibration and could potentially introduce some error.

Measuring across a resistor (such as resistor 1323) gives a very flat amplitude response as frequency is swept. The phase angle difference between this signal 1301 and the voltage detection circuit's signal 1302 is either 0° or 180° when measuring a nonreactive load, depending on which side of the pickup inductor 1322 the signal is measured.

The current detection circuit 1320 together with the voltage detection circuit 1330 form a V-I sensor. In the exemplified V-I sensor, for a given load, the amplitudes for signals 1301, 1302 will be constant across the frequency range, but the phase difference into a nonreactive load will be 180°. The buffers 1325, 1335 are added to drive a 50Ω system and isolate the measurement from the rest of the system, while also providing any necessary gain. Buffer 1325 is coupled between the inductor 1321 and the current signal input 1310-1 of the phase detection circuit 1310, while buffer 1335 is coupled between the common node 1333 of the capacitive voltage divider and the voltage signal input 1310-2 of the phase detection circuit 1310. Something needs to be added, however, to produce a substantially 90° phase offset. It is noted that the term "substantially 90° phase offset") refers to a phase offset of 80°-100°.

The required phase offset may be achieved by inserting a 90° delay line on one of the sensor signals 1301, 1302. Inserting a cable is one option. For 13.56 MHz, using a RG316 cable, which has a phase velocity of about 69.5% the speed of light, the line would need to be 3.84 meters. A more practical option is to add an equivalent LC circuit. The values can be calculated where $Z_0$ typically equals 50Ω and $f$ is the frequency by:

$$c=T_d/Z_0$$

$$L=T_d*Z_0$$

$$T_d=90°/(360°*f)$$

A problem with these types of offsets, however, is, as frequency is varied, the phase will shift. The phase will shift in degrees by the percentage change in frequency. So, for a ±5% change, the phase offset will vary by ±4.5°, and for a ±10% change, the phase offset with vary by ±90. This will create issues when trying to calculate the best match position.

Figure 63:
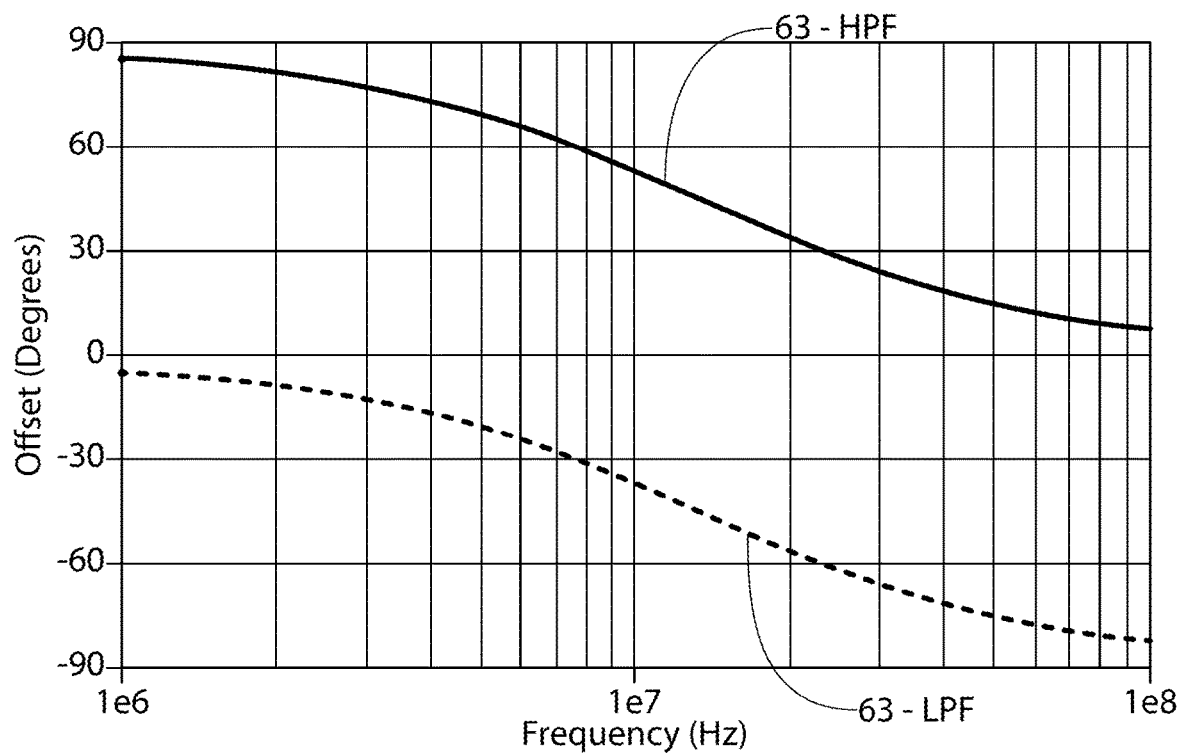
FIG. 63 is a simulation of phase response for an RC high-pass filter and an RC low-pass filter such as those shown in FIG. 62.
Figure 64:
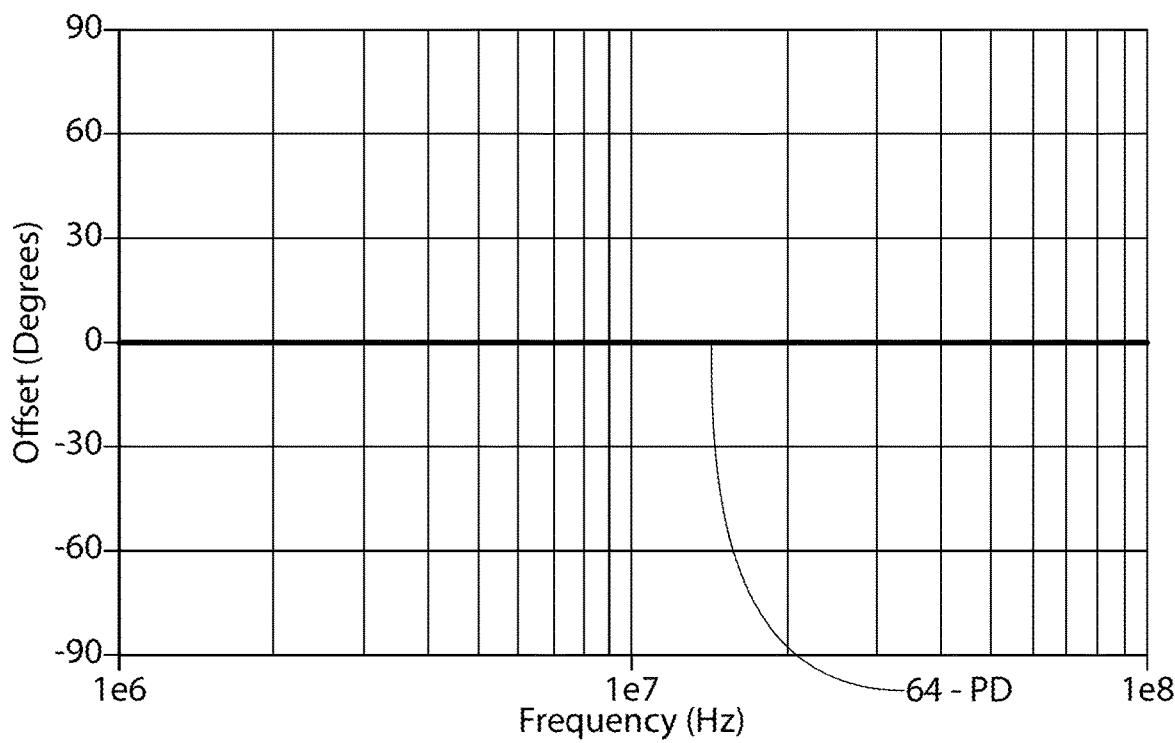
FIG. 64 is a simulation of a phase difference for an RC high-pass filter and an RC low-pass filter such as those shown in FIG. 62.

FIG. 62, by contrast, creates a constant 90° phase offset using an RC low pass filter 1312 and an RC high pass filter 1311. A simulation showing the phase shift of both filters over a wide range, 1 MHz to 100 MHz, is seen in FIG. 63, and the phase difference in FIG. 64. In FIG. 63, the high-pass filter simulation is shown by waveform 63-HPF, and the low-pass filter simulation is shown by waveform 63-LPF. In FIG. 64, the phase difference between the low-pass filter and the high-pass filter is shown by waveform 64-PD to be 90°. To use the low-pass and high-pass filters 1311, 1312 in the exemplified embodiment, the cutoff frequencies should be the same. This is easily achieved by using equal values for the capacitors 1313, 1315 and for the resistors 1314, 1316 of the filters 1311, 1312. These filters 1311, 1312 can alternatively be constructed with inductors instead of capacitors to create RL high-pass and low-pass filters, or one filter can be an RL topology and the other an RC topology.

A phase difference circuit 1306 receives the filtered current signal 1309A and the filtered voltage signal 1309B to determine a phase angle difference between the current signal and the voltage signal. The phase difference circuit may comprise, for example, a multiplier mixer or an XOR gate. In one embodiment, the circuit 1306 takes the two signals 1309A, 1309B (AC waveforms), multiplies them (e.g., using a Gilbert cell mixer), and filters out the AC part (e.g., using a low-pass filter), leaving only the DC offset. This offset is indicative of the phase angle difference. By contrast, the phase difference circuit may use an XOR gate. The XOR gate generates a pulse-width modulated signal whose duty cycle is indicative of the phase angle difference.

The reason the exemplified design works is because the phase at DC is 0° for the LPF, and 90° for the HPF. As the frequency increases to the cutoff frequency, the phase for the LPF shifts to −45° and is 45° for the HPF. For an ideal circuit, at infinite frequency, the phase would be −90° for the LPF, and 0° for the HPF. Even though the phase is shifting with frequency for both circuits, the phase difference will always be a constant 90°.

Figure 65:
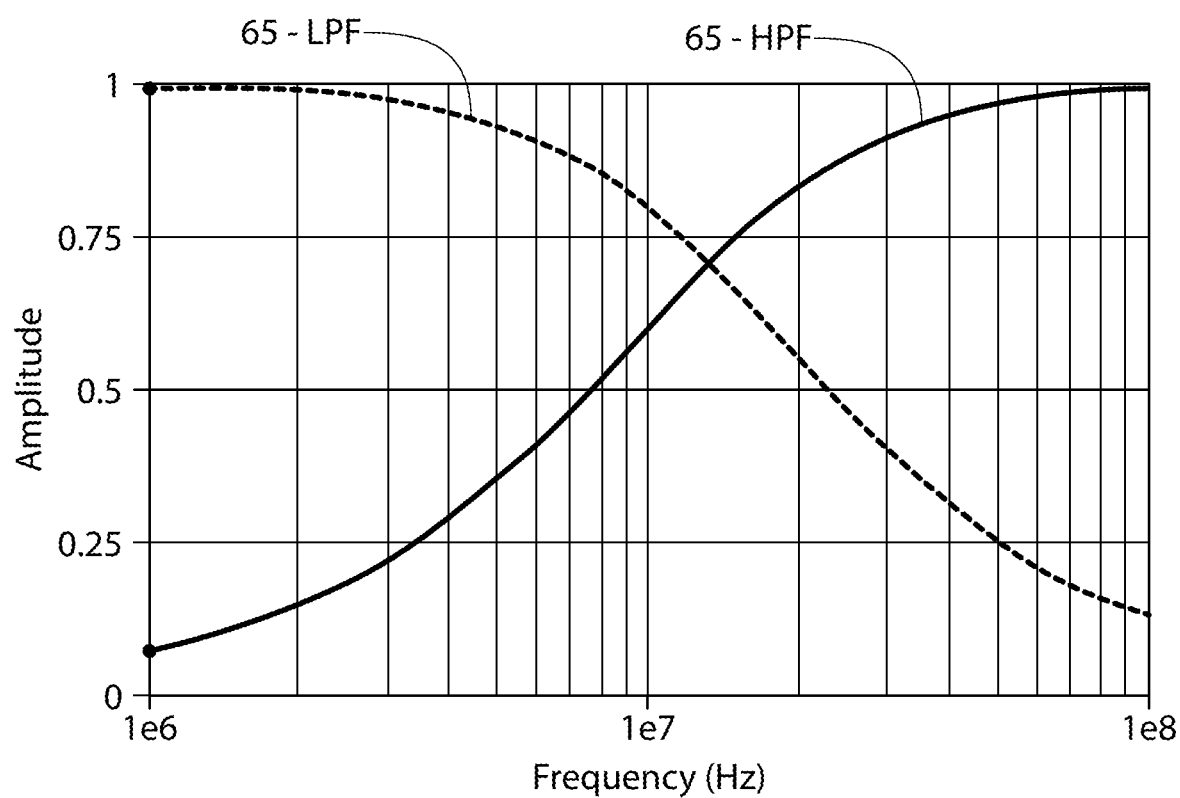
FIG. 65 is a simulation of an amplitude response for an RC high-pass filter and an RC low-pass filter such as those shown in FIG. 62.

There are two potential issues with this design. The amplitude response is not constant with frequency, as shown in FIG. 65, which is a simulation of an amplitude response for the RC high-pass filter (shown by waveform 65-HPF) and the RC low-pass filter (shown by waveform 65-LPF). As the frequency is varied, the amplitude will decrease or increase, as expected with a low-pass or high-pass filter. This also means that the amplitude is only equal at the cutoff frequency. Even if the band was limited to only operate at ±5% of the cutoff frequency, the amplitude variation would be approximately ±2.5%. If a 50Ω input impedance is expected, the shift in frequency would make it appear to be off by about ±2.5Ω. This could cause inaccuracies while matching. If the lines are 50Ω and a significant fraction of a wavelength, the unmatched impedances could cause high reflections. This could create an unknown impedance at the output of the sensor, having undesired effects on the measurement circuits and matching.

Having the phase shift in the path of the amplitude measurement circuit creates errors in the phase or amplitude measurement of variable frequency applications. Thus, the phase shift circuit needs to be isolated from the amplitude measurement. One way to cause this isolation is to have two separate circuits to measure the voltage and current. Two separate circuits, however, would add cost and hardware, and may introduce some error. Another way this can be achieved, is with the use of buffer amplifiers, as shown by buffers 1317, 1318 of the phase detection circuit 1310. The input of buffer 1317 is placed on the current signal input 1310-1 of the phase detection circuit 1310 to receive the current signal from the current detection circuit 1320, and the input of buffer 1318 is placed on the voltage signal input 1310-2 of the phase detection circuit 1310 to receive the voltage signal from the voltage detection circuit 1330. The buffers isolate the current and voltage signals 1301, 1302, keeping the signals from varying their amplitudes with shifts in frequency. A comparator could be used instead of a fixed or feedback amplifier, depending on the phase detector used. This will turn the signal to a square wave. A harmonic filter could be added to the comparator to generate a fixed amplitude sine wave. In one embodiment for amplifying the signals such that they are squared off, each buffer amplifier is a limiting amplifier (sometimes referred to as a clamping amplifier) HFA1130 from Renesas. The limiting amplifier amplifies the current or voltage signal, while the maximum and minimum voltages are set at or near zero (e.g., ±0.1V). As a result, the amplitude is brought down, creating the squared off signal. This gives the signals constant amplitudes. The signals can subsequently be filtered to get back to sine waves if required by the phase detector. The amplitudes can vary dramatically depending on the load impedance. If the amplitudes of the two signals are held constant, then the phase detector will be more accurate. In an alternative embodiment, two parallel diodes having opposed polarities could be utilized.

The embodiments discussed herein have many benefits over other designs. The low-pass filter and high-pass filter will provide a 90° phase shift required by the phase detector and will not be affected by changes in frequency. The buffers will provide isolation between the amplitude detector circuits and the phase detector circuitry. Thus, the amplitude circuits will no longer be affected by the phase detector, because of changes in frequency.

It is noted that the disclosed detection circuits may form part of an impedance matching network, for example, as a means of determining a phase angle difference. This phase angle difference may be used, for example, to determine an input impedance at the RF input of a matching network, to thereby determine a new matching configuration for an EVC, to thereby alter an EVC to achieve an impedance match. Similarly, the disclosed detection circuits may form part of matching network that forms part of a semiconductor processing tool and may be used as part of a method of fabricating a semiconductor.

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

While the invention or inventions have been described with respect to specific examples, those skilled in the art will appreciate that there are numerous variations and permutations of the above described invention(s). It is to be understood that other embodiments may be utilized and structural and functional modifications may be made without departing from the scope of the present invention(s). Thus, the spirit and scope should be construed broadly as set forth in the appended claims.

What is claimed is:

1. A phase detection circuit comprising:
   a current signal input configured to receive a current signal indicative of a current amplitude of an RF signal;
   a voltage signal input configured to receive a voltage signal indicative of a voltage amplitude of the RF signal;
   a high-pass filter and a low-pass filter each configured to filter one of (i) the current signal from the current signal input or (ii) the voltage signal from the voltage signal input, wherein the high-pass filter and the low-pass filter collectively cause a substantially 90 degree offset between a phase angle of the current signal and a phase angle of the voltage signal; and
   a phase difference circuit configured to receive the filtered current signal and the filtered voltage signal to determine a phase angle difference between the current signal and the voltage signal.

2. The phase detection circuit of claim 1 further comprising a current detection circuit coupled between the current signal input of the phase detection circuit and a detection circuit input receiving the RF signal, the current detection circuit configured to output the current signal indicative of the current amplitude of the RF signal at the RF input.

3. The phase detection circuit of claim 2 wherein the current detection circuit comprises at least one inductor coupled to the RF input, and a component in series with the at least one inductor, the component being a resistor or a capacitor.

4. The phase detection circuit of claim 3 wherein a buffer is coupled between the at least one inductor and the current signal input of the phase detection circuit.

5. The phase detection circuit of claim 4 further comprising a current amplitude sensor configured to detect the current signal indicative of the current amplitude of the RF signal.

6. The phase detection circuit of claim 1 further comprising a voltage detection circuit coupled between the voltage signal input of the phase detection circuit and a detection circuit input receiving the RF signal, the voltage detection circuit configured to output the voltage signal indicative of the voltage amplitude of the RF signal at the RF input.

7. The phase detection circuit of claim 6 wherein the voltage detection circuit comprises a capacitive voltage divider comprising a first capacitor and a second capacitor in series between the RF input and a common ground, the first capacitor having a higher impedance and being coupled between the RF input and the second capacitor, the second capacitor being coupled between the first capacitor and the common ground, the first and second capacitors sharing a common node.

8. The phase detection circuit of claim 7 wherein a buffer is coupled between the common node of the capacitive voltage divider and the voltage signal input of the phase detection circuit.

9. The phase detection circuit of claim 8 further comprising a voltage amplitude sensor configured to detect the current signal indicative of the current amplitude of the RF signal.

10. The phase detection circuit of claim 1 further comprising buffer amplifiers, wherein each of the current signal and the voltage signal pass through one of the buffer amplifiers before being received by the high-pass filter or the low-pass filter to isolate the signals.

11. The phase detection circuit of claim 10 wherein each buffer amplifier is a limiting amplifier that amplifies the current or voltage signal while setting a maximum and minimum voltages at or near zero.

12. The phase detection circuit of claim 1 wherein each of the high-pass filter and the low-pass filter comprise either a resistor and a capacitor or a resistor and an inductor.

13. The phase detection circuit of claim 1 wherein the phase difference circuit (a) multiplies the filtered current signal and the filtered voltage signal to generate a multiplied signal, and (b) filters out an alternating current (AC) portion of the multiplied signal to leave a direct current (DC) offset indicative of the phase angle difference between the current signal and the voltage signal.

14. The phase detection circuit of claim 1 wherein the phase difference circuit comprises a mixer or an XOR gate.

15. An impedance matching network comprising:
a radio frequency (RF) input configured to operably couple to an RF source and to receive an RF signal from the RF source;
an RF output configured to operably couple to a plasma chamber;
at least one electronically variable capacitor (EVC); and
a phase detection circuit comprising:
    a current signal input configured to receive a current signal indicative of a current amplitude of the RF signal;
    a voltage signal input configured to receive a voltage signal indicative of a voltage amplitude of the RF signal;
    a high-pass filter and a low-pass filter each configured to filter one of (i) the current signal from the current signal input or (ii) the voltage signal from the voltage signal input, wherein the high-pass filter and the low-pass filter collectively cause a substantially 90 degree offset between a phase angle of the current signal and a phase angle of the voltage signal; and
    a phase difference circuit configured to receive the filtered current signal and the filtered voltage signal to determine a phase angle difference between the current signal and the voltage signal.

16. A semiconductor processing tool comprising:
a plasma chamber configured to deposit a material onto a substrate or etch a material from the substrate; and
an impedance matching network operably coupled to the plasma chamber, the matching network comprising:
    a radio frequency (RF) input configured to operably couple to an RF source and to receive an RF signal from the RF source;
    an RF output configured to operably couple to a plasma chamber;
    at least one electronically variable capacitor (EVC); and
    a phase detection circuit comprising:
        a current signal input configured to receive a current signal indicative of a current amplitude of the RF signal;
        a voltage signal input configured to receive a voltage signal indicative of a voltage amplitude of the RF signal;
        a high-pass filter and a low-pass filter each configured to filter one of (i) the current signal from the current signal input or (ii) the voltage signal from the voltage signal input, wherein the high-pass filter and the low-pass filter collectively cause a substantially 90 degree offset between a phase angle of the current signal and a phase angle of the voltage signal; and
        a phase difference circuit configured to receive the filtered current signal and the filtered voltage signal to determine a phase angle difference between the current signal and the voltage signal.

17. A method of matching an impedance comprising:
coupling an RF input of a matching network to an RF source to receive an RF signal from the RF source;
coupling an RF output of the matching network to a plasma chamber, wherein the matching network comprises:
    at least one electronically variable capacitor (EVC); and
    a phase detection circuit comprising:
        a current signal input configured to receive a current signal indicative of a current amplitude of the RF signal;
        a voltage signal input configured to receive a voltage signal indicative of a voltage amplitude of the RF signal;
        a high-pass filter and a low-pass filter each configured to filter one of (i) the current signal from the current signal input or (ii) the voltage signal from the voltage signal input, wherein the high-pass filter and the low-pass filter collectively cause a substantially 90 degree offset between a phase angle of the current signal and a phase angle of the voltage signal; and
        a phase difference circuit configured to receive the filtered current signal and the filtered voltage signal to determine a phase angle difference between the current signal and the voltage signal;
determining the phase angle difference using the phase detection circuit;

determining an input impedance based on the determined phase angle difference; and altering the impedance of the EVC based on the determined input impedance.

18. A method of fabricating a semiconductor comprising:

placing a substrate in a plasma chamber configured to deposit a material layer on the substrate or etch a material layer from the substrate;

energizing plasma within the plasma chamber by coupling RF power from an RF source to the plasma chamber to perform the deposition or etching; and while energizing the plasma, carrying out an impedance match by an impedance matching network coupled between the plasma chamber and the RF source, the matching network comprising:

- a radio frequency (RF) input configured to operably couple to the RF source and to receive an RF signal from the RF source;
- an RF output configured to operably couple to a plasma chamber;
- at least one electronically variable capacitor (EVC); and
- a phase detection circuit comprising:
  - a current signal input configured to receive a current signal indicative of a current amplitude of the RF signal;
  - a voltage signal input configured to receive a voltage signal indicative of a voltage amplitude of the RF signal;
  - a high-pass filter and a low-pass filter each configured to filter one of (i) the current signal from the current signal input or (ii) the voltage signal from the voltage signal input, wherein the high-pass filter and the low-pass filter collectively cause a substantially 90 degree offset between a phase angle of the current signal and a phase angle of the voltage signal; and
  - a phase difference circuit configured to receive the filtered current signal and the filtered voltage signal to determine a phase angle difference between the current signal and the voltage signal.

* * * * *